(12) United States Patent
Park et al.

(10) Patent No.: US 9,716,234 B2
(45) Date of Patent: *Jul. 25, 2017

(54) COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventors: Jun-Ha Park, Yongin (KR); Seok-Hwan Hwang, Yongin (KR); Young-Kook Kim, Yongin (KR); Hye-Jin Jung, Yongin (KR); Eun-Young Lee, Yongin (KR); Jong-Woo Kim, Yongin (KR); Jin-O Lim, Yongin (KR); Sang-Hyun Han, Yongin (KR); Eun-Jae Jeong, Yongin (KR); Soo-Yon Kim, Yongin (KR)

(73) Assignee: SAMSUNG DISPLAY CO., LTD., Yongin, Gyunngi-Do (KR)

( * ) Notice: Subject to any disclaimer, the term of this patent is extended or adjusted under 35 U.S.C. 154(b) by 473 days.

This patent is subject to a terminal disclaimer.

(21) Appl. No.: 14/283,774

(22) Filed: May 21, 2014

(65) Prior Publication Data
US 2015/0060787 A1 Mar. 5, 2015

(30) Foreign Application Priority Data
Aug. 28, 2013 (KR) .................. 10-2013-0102656

(51) Int. Cl.
H01L 51/00 (2006.01)
H01L 51/50 (2006.01)
(Continued)

(52) U.S. Cl.
CPC .......... *H01L 51/0058* (2013.01); *C09K 11/06* (2013.01); *H01L 51/0067* (2013.01);
(Continued)

(58) Field of Classification Search
None
See application file for complete search history.

(56) References Cited

U.S. PATENT DOCUMENTS 5,645,948 A 7/1997 Shi et al.
6,582,837 B1 6/2003 Toguchi et al.
(Continued)

FOREIGN PATENT DOCUMENTS

JP 10-017860 A 1/1998
JP 11-087067 A 3/1999
(Continued)

OTHER PUBLICATIONS

Tang and Vanslyke, Organic Electroluminescent Diodes, Applied Physics Letters, 1987, pp. 1-4, vol. 51, AIP Publishing LLC, New York.
(Continued)

*Primary Examiner* — Dawn Garrett
(74) *Attorney, Agent, or Firm* — Lee & Morse, P.C.

(57) ABSTRACT

Provided is a compound represented by Formula 1, Formula 2, or Formula 3:

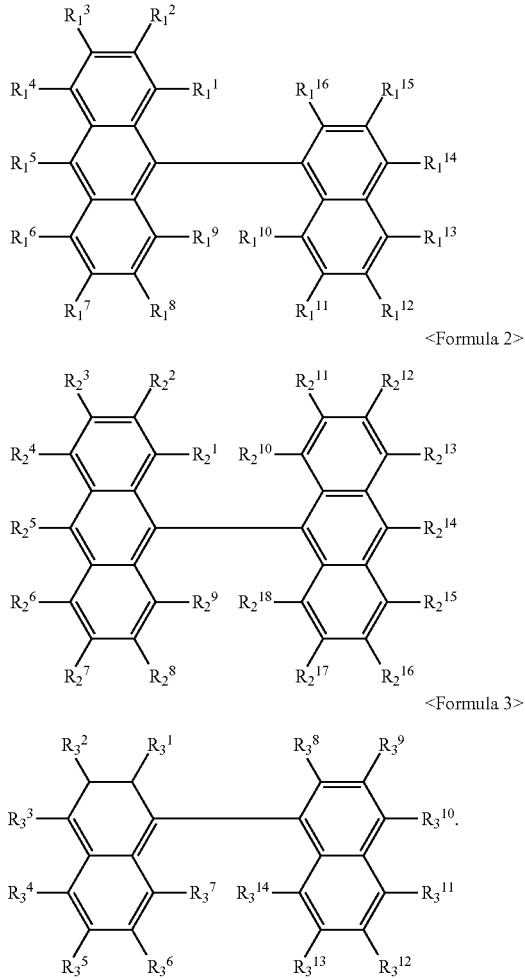

19 Claims, 1 Drawing Sheet

(51) Int. Cl.
 H01L 27/32 (2006.01)
 C09K 11/06 (2006.01)
(52) U.S. Cl.
 CPC ........ *H01L 51/0072* (2013.01); *H01L 51/506* (2013.01); *H01L 51/5072* (2013.01)

(56) References Cited

U.S. PATENT DOCUMENTS

| | | | | |
|---|---|---|---|---|
| 7,507,485 | B2* | 3/2009 | Oh | H01L 51/0058 313/504 |
| 9,181,474 | B2* | 11/2015 | Kim | C07D 213/74 |
| 9,397,300 | B2* | 7/2016 | Park | H01L 51/006 |
| 2005/0245752 | A1 | 11/2005 | Conley et al. | |
| 2006/0086938 | A1* | 4/2006 | Kang | G02F 1/1345 257/72 |
| 2007/0108892 | A1 | 5/2007 | Bae et al. | |
| 2010/0140603 | A1* | 6/2010 | Jeong | C07D 209/86 257/40 |
| 2010/0155714 | A1 | 6/2010 | Seo et al. | |
| 2011/0114930 | A1* | 5/2011 | Kim | H01L 51/006 257/40 |
| 2013/0032787 | A1* | 2/2013 | Kim | C07D 401/04 257/40 |
| 2013/0069523 | A1 | 3/2013 | Matsuura et al. | |
| 2013/0200338 | A1* | 8/2013 | Kim | C07D 213/74 257/40 |
| 2014/0225070 | A1* | 8/2014 | Park | H01L 51/006 257/40 |
| 2014/0306190 | A1* | 10/2014 | Lee | H01L 51/0054 257/40 |
| 2014/0332772 | A1* | 11/2014 | Han | H01L 51/0058 257/40 |

FOREIGN PATENT DOCUMENTS

| | | |
|---|---|---|
| JP | 4060669 B2 | 12/2007 |
| KR | 10-0525408 B1 | 10/2005 |
| KR | 10-2007-0015195 A | 11/2005 |
| KR | 10-2008-0103953 A | 11/2008 |
| KR | 10-2012-0118051 A | 3/2013 |

OTHER PUBLICATIONS

Johansson, Solid-State Amplified Spontaneous Emission in some Sprio-Type Molecules: A New Concept for the Design of Solid-State Lasing Molecules, Advanced Materials, 1998, pp. 1136-1141, vol. 10, Wiley-VCH Verlag GmbH, Weinheim.

Adachi, Confinement of Charge Carriers and Molecular Excitons within 5nmthick Emitter Layer in Organic Electroluminescent Devices with a Double Heterostructure, Applied Physics Letters, 1990, pp. 1-4, vol. 57, AIP Publishing LLC, New York.

Tao, Sharp Green Electroluminescence from 1H-Pyrazolo [3, 4-b] Quinoline-Based Light-Emitting Diodes, Applied Physics Letters, 2000, pp. 1-4, vol. 77, AIP Publishing LLC, New York.

Sakamoto, Synthesis, Characterization, and Electron-Transport Property of Perfluorinated Phenylene Dendrimers, J. Am. Chem. Soc., 2000, pp. 1832-1833, vol. 122, No. 8, Institute for Molecular Science, Japan.

Yamaguchi, Diphenylamino-Substituted 2, 5-Diarylsiloles for Single-Layer Organic Electroluminescent Devices, Chemistry Letters, 2001, pp. 98-99, The Chemical Society of Japan, Japan.

* cited by examiner

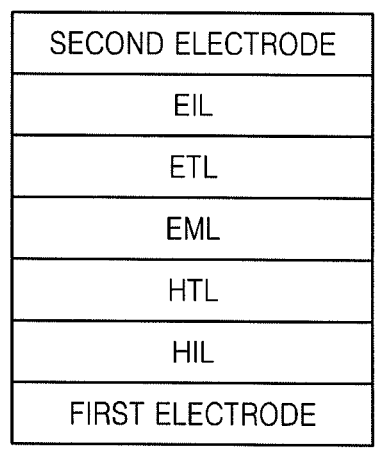

COMPOUND AND ORGANIC LIGHT-EMITTING DEVICE INCLUDING THE SAME

CROSS-REFERENCE TO RELATED APPLICATION

Korean Patent Application No. 10-2013-0102656, filed on Aug. 28, 2013, in the Korean Intellectual Property Office, and entitled: "Compound and Organic Light-Emitting Device Including The Same," is incorporated by reference herein in its entirety.

BACKGROUND

1. Field

One or more embodiments relate to a compound and an organic light-emitting device including the same.

2. Description of the Related Art

Organic light-emitting devices (OLEDs), which are self-emitting devices, may have wide viewing angles, excellent contrast, quick response, high brightness, excellent driving voltage characteristics, and provide full color images.

SUMMARY

Embodiments may be realized by providing a compound represented by Formula 1, Formula 2, or Formula 3:

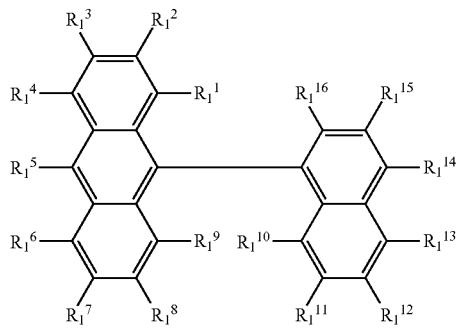

<Formula 1>

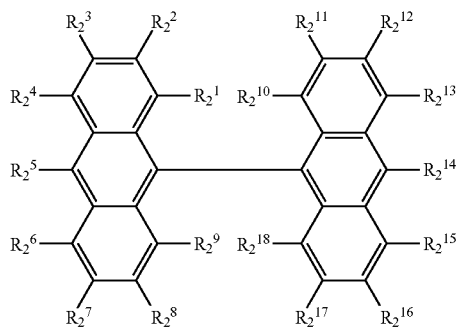

<Formula 2>

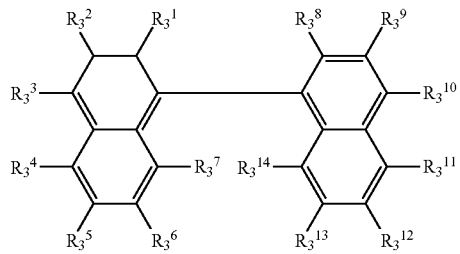

<Formula 3> wherein:
$R_1^1$ to $R_1^{16}$, $R_2^1$ to $R_2^{18}$, and $R_3^1$ to $R_3^{14}$ are each independently a hydrogen atom, a deuterium atom, a halogen group, a nitro group, a cyano group, a substituted or unsubstituted $C_1$ to $C_{60}$ alkyl group, a substituted or unsubstituted $C_2$ to $C_{60}$ alkenyl group, a substituted or unsubstituted $C_2$ to $C_{60}$ alkynyl group, a substituted or unsubstituted $C_3$ to $C_{60}$ cycloalkyl group, a substituted or unsubstituted $C_3$ to $C_{60}$ cycloalkenyl group, a substituted or unsubstituted $C_6$ to $C_{60}$ aryl group, a substituted or unsubstituted $C_2$ to $C_{60}$ heteroaryl group, a substituted or unsubstituted $C_6$ to $C_{60}$ aryloxy, a substituted or unsubstituted $C_6$ to $C_{60}$ arylthio group, or a substituted or unsubstituted $C_6$ to $C_{60}$ condensed polycyclic group, Formula 1, Formula 2, and Formula 3 each includes at least one carbazole group, and the carbazole group is substituted with at least one cyano group.

According to one or more embodiments, provided is an organic light-emitting device including: a first electrode; a second electrode; and an organic layer interposed between the first electrode and the second electrode, wherein the organic layer includes the compound.

According to one or more embodiments, provided is a flat panel display apparatus including the organic light-emitting device, wherein the first electrode of the organic light-emitting device is electrically connected to a source electrode or a drain electrode of a thin film transistor.

BRIEF DESCRIPTION OF THE DRAWINGS

Features will become apparent to those of skill in the art by describing in detail exemplary embodiments with reference to the attached drawings in which:

FIG. 1 illustrates a schematic view of an organic light-emitting device according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. As used herein, the term "and/or" includes any and all combinations of one or more of the associated listed. Expressions such as "at least one of," when preceding a list of elements, modify the entire list of elements and do not modify the individual elements of the list.

According to an embodiment, provided is a compound represented by Formula 1, Formula 2, or Formula 3:

According to an embodiment, examples of Formula 1, Formula 2, and Formula 3, which include a carbazole group, may be Formula 4, Formula 5, and Formula 6, respectively:

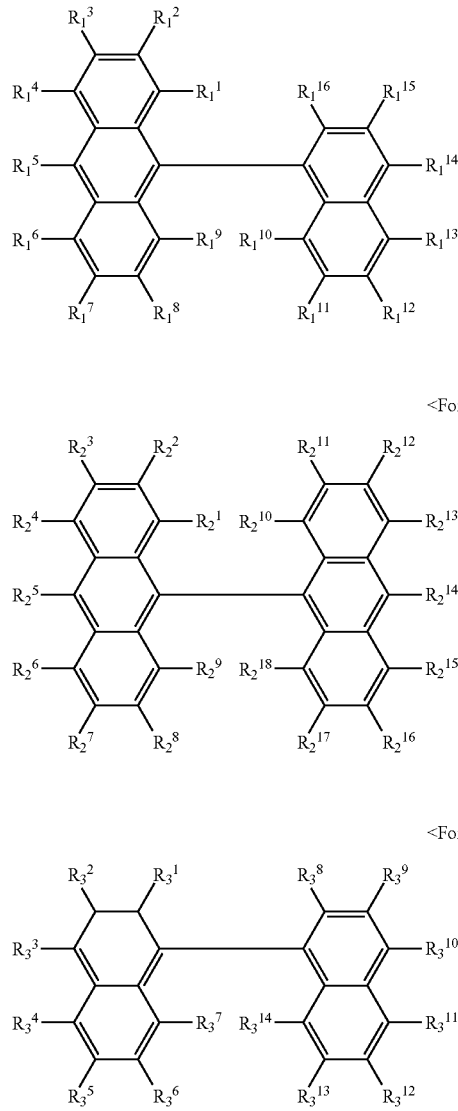

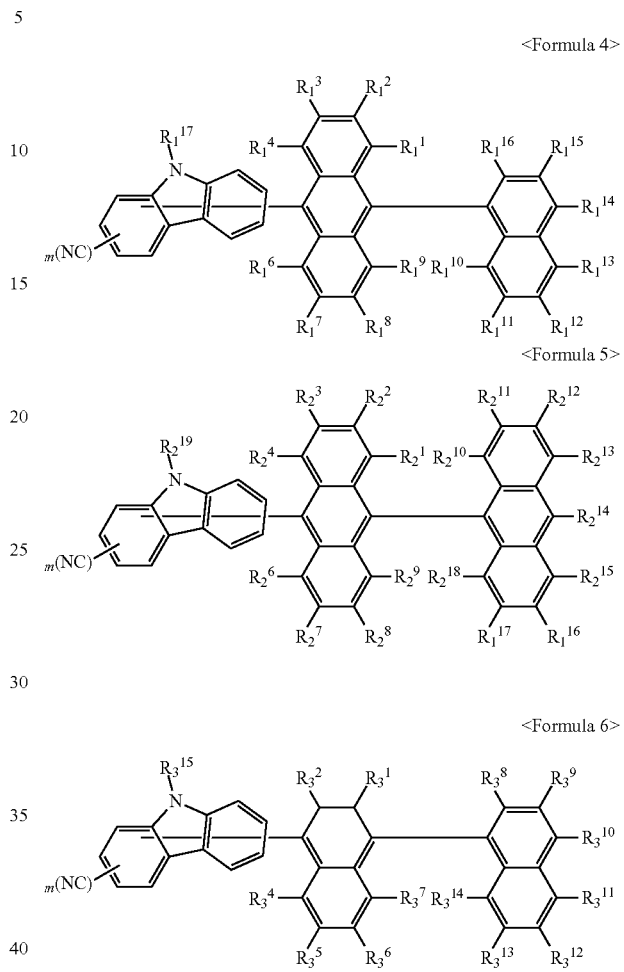

wherein in Formulae 1 to 3, $R_1^1$ to $R_1^{16}$, $R_2^1$ to $R_2^{18}$, and $R_3^1$ to $R_3^{14}$ are each independently a hydrogen atom, a deuterium atom, a halogen group, a nitro group, a cyano group, a substituted or unsubstituted $C_1$ to $C_{60}$ alkyl group, a substituted or unsubstituted $C_2$ to $C_{60}$ alkenyl group, a substituted or unsubstituted $C_2$ to $C_{60}$ alkynyl group, a substituted or unsubstituted $C_3$ to $C_{60}$ cycloalkyl group, a substituted or unsubstituted $C_3$ to $C_{60}$ cycloalkenyl group, a substituted or unsubstituted $C_6$ to $C_{60}$ aryl group, a substituted or unsubstituted $C_2$ to $C_{60}$ heteroaryl group, a substituted or unsubstituted $C_6$ to $C_{60}$ aryloxy, a substituted or unsubstituted $C_6$ to $C_{60}$ arylthio group, or a substituted or unsubstituted $C_6$ to $C_{60}$ condensed polycyclic group, the compounds represented by Formula 1, Formula 2, and Formula 3 each includes at least one carbazole group, and wherein the carbazole group is substituted with at least one cyano group.

wherein in Formulae 4 to 6 $R_1^1$ to $R_1^4$, $R_1^6$ to $R_1^{16}$, $R_2^1$ to $R_2^4$, $R_2^5$ to $R_2^{18}$, $R_3^1$ to $R_3^2$, $R_3^4$ to $R_3^{14}$ are the same as described above, and $R_1^{17}$, $R_2^{19}$, and $R_3^{15}$ are each independently a substituted or unsubstituted $C_1$ to $C_{60}$ alkyl group, a substituted or unsubstituted $C_2$ to $C_{60}$ alkenyl group, a substituted or unsubstituted $C_2$ to $C_{60}$ alkynyl group, a substituted or unsubstituted $C_3$ to $C_{60}$ cycloalkyl group, a substituted or unsubstituted $C_3$ to $C_{60}$ cycloalkenyl group, a substituted or unsubstituted $C_6$ to $C_{60}$ aryl group, a substituted or unsubstituted $C_2$ to $C_{60}$ heteroaryl group, a substituted or unsubstituted $C_6$ to $C_{60}$ aryloxy, a substituted or unsubstituted $C_6$ to $C_{60}$ arylthio group, or a substituted or unsubstituted $C_6$ to $C_{60}$ condensed polycyclic group, and m is an integer of 1 to 7.

Substitutes and substitution locations of the compounds of Formula 1 through Formula 6 are described in detail below.

According to an embodiment, in Formula 4, Formula 5, and Formula 6, the anthracenyl group in Formula 4 or Formula 5 or the naphthalenyl group in Formula 6 may be bonded to site 6 or site 7 of carbazole according to Formula 7, below:

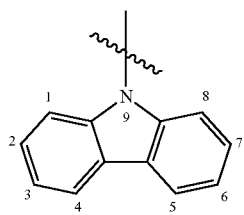

<Formula 7>

According to an embodiment, in Formula 4, Formula 5, and Formula 6, m is 1 or 2, and a cyano group may be bonded to site 2 or site 3 of carbazole according to Formula 7, above.

Formula 7 show sites of the carbazole group moiety (dotted oval part) in Formula 4, Formula 5, and Formula 6.

According to an embodiment, $R_1^{17}$, $R_2^{19}$, and $R_3^{15}$ in Formula 4, Formula 5, and Formula 6 are each independently any one of Formulae 2a to 2d:

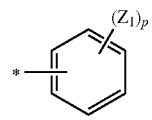

2a

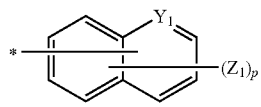

2b

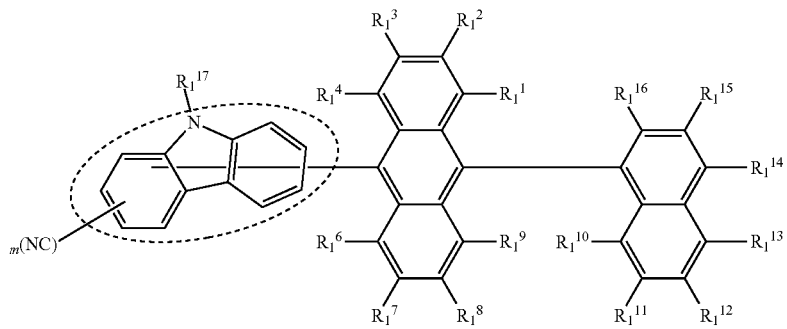

<Formula 4>

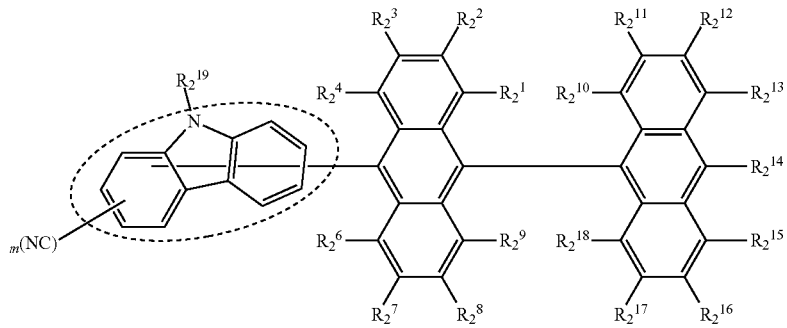

<Formula 5>

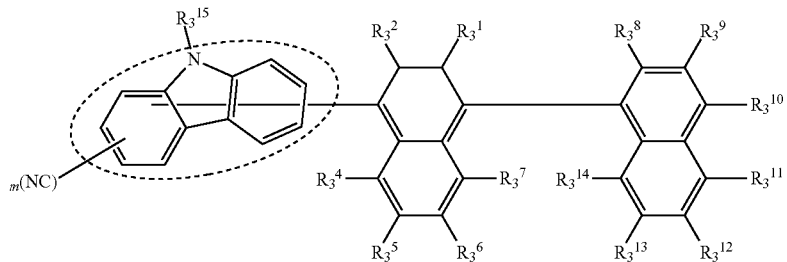

<Formula 6>

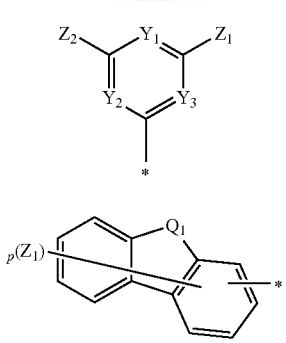

wherein in the formulae, $Y_1$, $Y_2$, and $Y_3$ are each independently CH or N;

$Q_1$ is —O—;

$Z_1$ and $Z_2$ are each independently a hydrogen atom, a deuterium atom, a substituted or unsubstituted $C_1$ to $C_{20}$ alkyl group, a substituted or unsubstituted $C_6$ to $C_{20}$ aryl group, a substituted or unsubstituted $C_2$ to $C_{20}$ heteroaryl group, a substituted or unsubstituted $C_6$ to $C_{20}$ condensed polycyclic group, an amine group substituted with a $C_6$ to $C_{20}$ aryl group or a $C_2$ to $C_{20}$ heteroaryl group, a halogen group, a cyano group, a nitro group, a hydroxyl group, or a carboxy group;

p is an integer of 1 to 7; and

* indicates a binding site.

According to an embodiment, $R_1^{14}$, $R_1^{15}$, $R_2^{14}$, and $R_3^{10}$ in Formula 4, Formula 5, and Formula 6 are each independently a hydrogen atom, a deuterium atom, a cyano group, or any one of Formula 3a to 3c below:

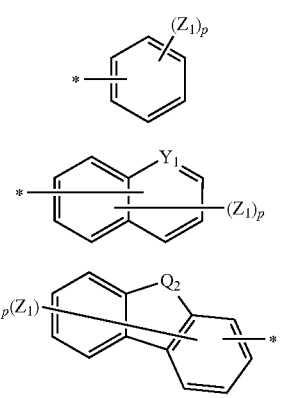

wherein in Formulae 3a to 3c, $Y_1$ is CH or N;

$Q_2$ is —N($R_{30}$)—;

$Z_1$ and $R_{30}$ are each independently a hydrogen atom, a deuterium atom, a substituted or unsubstituted $C_1$ to $C_{20}$ alkyl group, a substituted or unsubstituted $C_6$ to $C_{20}$ aryl group, a substituted or unsubstituted $C_2$ to $C_{20}$ heteroaryl group, a substituted or unsubstituted $C_6$ to $C_{20}$ condensed polycyclic group, an amine group substituted with a $C_6$ to $C_{20}$ aryl group or a $C_2$ to $C_{20}$ heteroaryl group, a halogen group, a cyano group, a nitro group, a hydroxyl group, or a carboxy group;

p is an integer of 1 to 7; and

* indicates a binding site.

Hereinafter, definitions of representative substituents from among substituents used herein will be presented (the number of carbon numbers restricting a substituent is not limited, and does not limit properties of the substituent, and unless defined otherwise, the definition of the substituent is consistent with a general definition thereof).

The unsubstituted $C_1$ to $C_{60}$ alkyl group used herein may be a linear or branched alkyl group, and non-limiting examples thereof are a methyl group, an ethyl group, a propyl group, an isobutyl group, a sec-butyl group, a pentyl group, an iso-amyl group, a hexyl group, a heptyl, an octyl, a nonanyl, and a dodecyl, and at least one hydrogen atom of the alkyl group may be substituted with a deuterium atom, a halogen atom, a hydroxyl group, a nitro group, a cyano group, an amino group, an amidino group, a hydrazine, a hydrazone, a carboxyl group or salt thereof, a sulfonic acid or salt thereof, a phosphoric acid or salt thereof, a $C_1$ to $C_{10}$ alkyl group, a $C_1$ to $C_{10}$ alkoxy group, a $C_2$ to $C_{10}$ alkenyl group, a $C_2$ to $C_{10}$ alkynyl group, a $C_6$ to $C_{16}$ aryl group, or a $C_4$ to $C_{16}$ heteroaryl group.

The unsubstituted $C_2$ to $C_{60}$ alkenyl group used herein refers to an unsubstituted alkyl group having one or more carbon double bonds at a center or end thereof. Examples thereof are ethenyl, prophenyl, and butenyl. At least one hydrogen atom of the unsubstituted alkenyl group may be substituted with the same substituents as described in connection with the substituted alkyl group.

The unsubstituted $C_2$ to $C_{60}$ alkynyl group used herein refers to an unsubstituted alkyl group having one or more carbon triple bonds at a center or end thereof. Examples thereof are acetylene, propylene, phenylacetylene, naphthylacetylene, isopropylacetylene, t-butylacetylene, and diphenylacetylene. At least one hydrogen atom of the unsubstituted alkynyl group may be substituted with the same substituents as described in connection with the substituted alkyl group.

The unsubstituted $C_3$ to $C_{60}$ cycloalkyl group used herein refers to a $C_3$ to $C_{60}$ cyclic alkyl group, and at least one hydrogen atom of the cycloalkyl group may be substituted with the same substituents as described in connection with the $C_1$ to $C_{60}$ alkyl group.

The unsubstituted $C_1$ to $C_{60}$ alkoxy group used herein refers to a group having —OA (wherein A is the unsubstituted C1 to $C_{60}$ alkyl group), and non-limiting examples thereof are ethoxy, ethoxy, isopropyloxy, butoxy, and pentoxy. At least one hydrogen atom of the unsubstituted alkoxy group may be substituted with the same substituents as described in connection with the alkyl group.

The unsubstituted $C_6$ to $C_{60}$ aryl group used herein refers to a carbocyclic aromatic system having at least one aromatic ring, and when the number of rings is two or more, the rings may be fused to each other or may be linked to each other via, for example, a single bond. The term 'aryl' includes an aromatic system, such as phenyl, naphthyl, or anthracenyl. Also, at least one hydrogen atom of the aryl may be substituted with the same substituents described in connection with the $C_1$ to $C_{60}$ alkyl group.

A $C_6$ to $C_{60}$ arylsilyl group refers to Si substituted with one, two, or three C6 to C60 aryl groups.

Examples of a substituted or unsubstituted $C_6$ to $C_{60}$ aryl group are a phenyl group, a $C_1$ to $C_{10}$ alkylphenyl group (for example, an ethylphenyl group), a halophenyl group (for example, o-, m- and p-fluorophenyl group, dichlorophenyl group), a cyanophenyl group, a dicyanophenyl group, a trifluoromethoxyphenyl group, a biphenyl group, a halobiphenyl group, a cyanobiphenyl group, a $C_1$ to $C_{10}$ alkylbiphenyl group, a $C_1$ to $C_{10}$ akoxybiphenyl group, o-, m-, and p-tolyl groups, o-, m- and p-cumenyl groups, a mesityl group, a phenoxyphenyl group, a (α,α-dimethylbenzene) phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$ to $C_{10}$ alkylnaphthyl group (for example, methylnaphthyl group), a $C_1$ to $C_{10}$ akoxynaphthyl group (for example, methoxynaphthyl group), an anthracenyl group, an azrenyl group, a heptalenyl group, an acenaphthylenyl group, a phenalenyl group, a fluorenyl group, an anthraquinolinyl group, a methylan anthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentasenyl group, a tetraphenylenyl group, a hexaphenyl group, a hexacenyl group, a rubicenyl group, a coroneryl group, trinaphthylenyl group, a heptaphenyl group, a heptacenyl group, a piranthrenyl group, and an obarenyl group.

The unsubstituted $C_2$-$C_{60}$ heteroaryl group used herein includes at least one hetero atom selected from nitrogen (N), oxygen (O), phosphorous (P), and sulfur (S), and when the group has two or more rings, the rings may be fused to each other or may be linked to each other via, for example, a single bond. Examples of the unsubstituted $C_4$-$C_{60}$ heteroaryl group are a pyrazolyl group, an imidazolyl group, a oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, and a dibenzothiophene group. Also, at least one hydrogen atom of the heteroaryl may be substituted with the same substituents described in connection with the $C_1$ to $C_{60}$ alkyl group.

The $C_6$ to $C_{60}$ unsubstituted aryloxy group used herein refers to a group represented by —$OA_1$, wherein $A_1$ is the $C_6$ to $C_{60}$ aryl group. An example of the aryloxy group is a phenoxy group. At least one hydrogen atom of the aryloxy group may be substituted with the same substituents described in connection with the $C_1$ to $C_{60}$ alkyl group.

The $C_6$ to $C_{60}$ unsubstituted arylthio group used herein refers to a group represented by —$SA_1$, wherein $A_1$ is the $C_6$ to $C_{60}$ aryl group. Examples of the arylthio group are a benzenethio group are a naphthylthio group. At least one hydrogen atom of the arylthio group may be substituted with the same substituents described in connection with the $C_1$ to $C_{60}$ alkyl group.

The unsubstituted $C_6$ to $C_{60}$ condensed polycyclic group used herein refers to a substituent having two or more rings formed by fusing at least one aromatic ring and at least one non-aromatic ring or a substituent in which a unsaturated group is present in a ring but a conjugated system does not exist, and the condensed polycyclic group overall does not have an orientation, which is why the condensed polycyclic group is distinguished from the aryl group or the heteroaryl group.

Examples of the compounds represented by Formula 1, Formula 2, and Formula 3 include the compounds below:

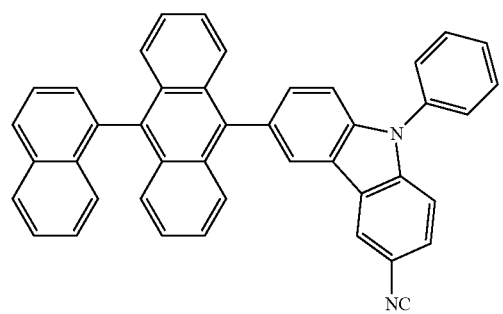

1

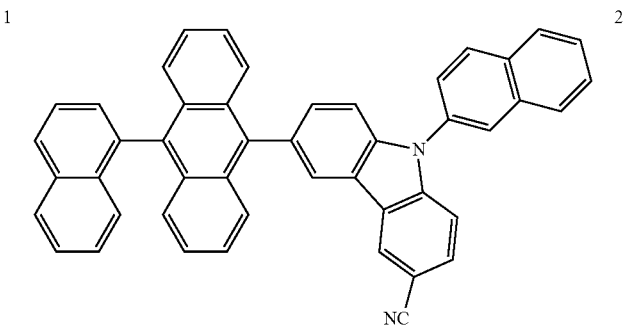

2

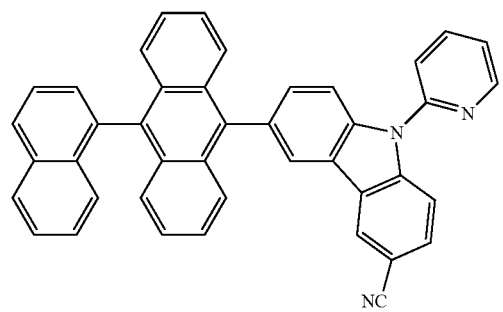

3

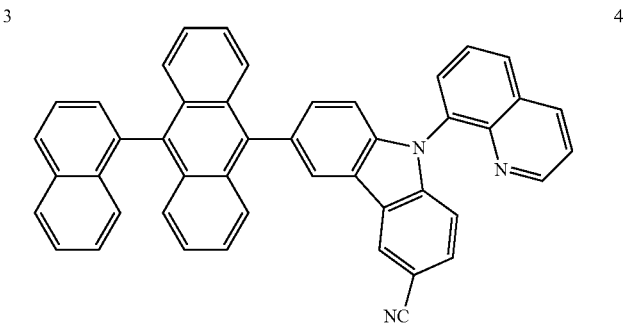

4

5
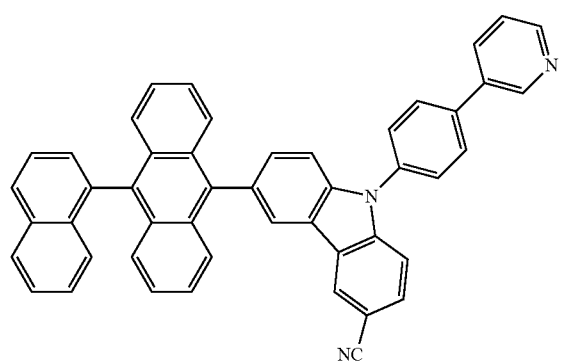
6
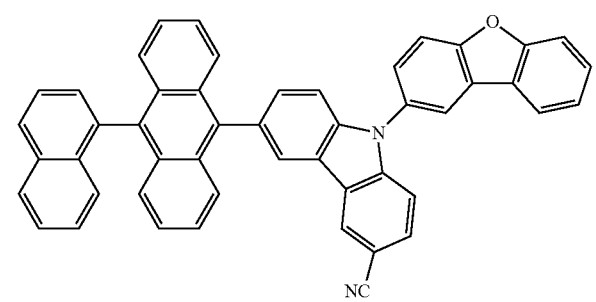
7
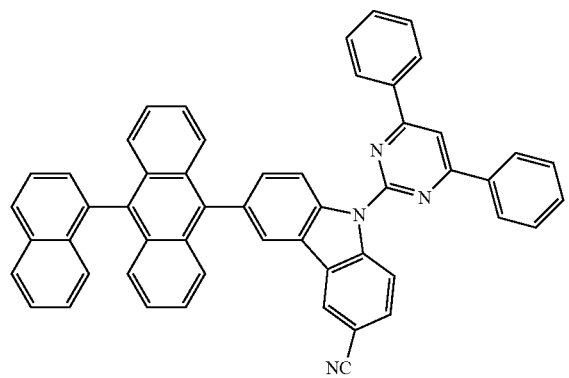
8
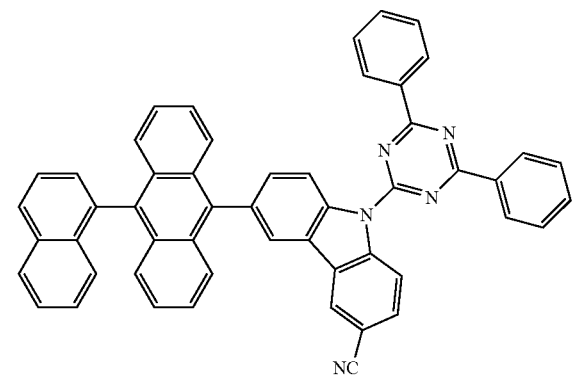
9
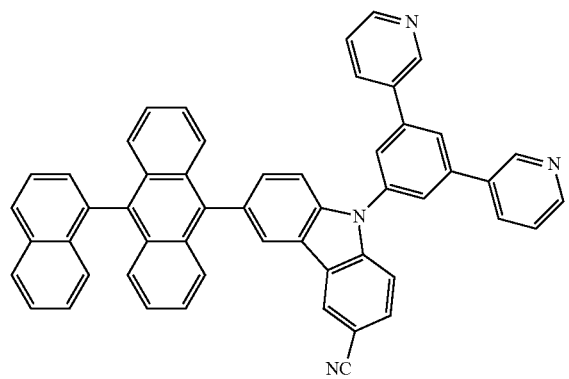
10
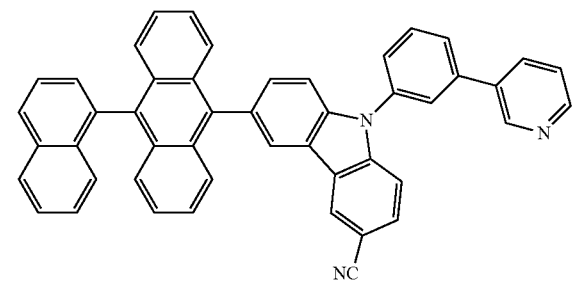
11
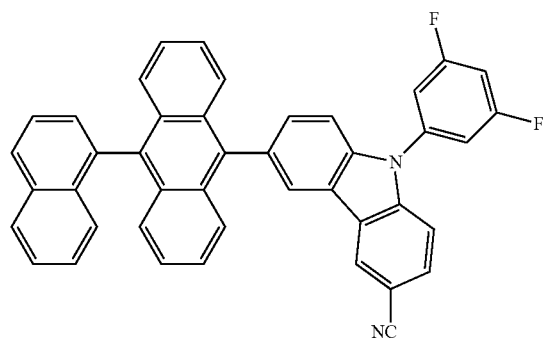
12
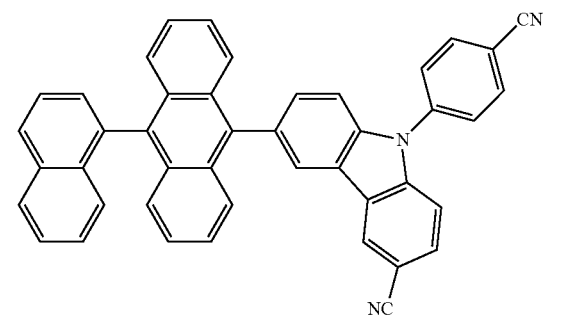

-continued
13
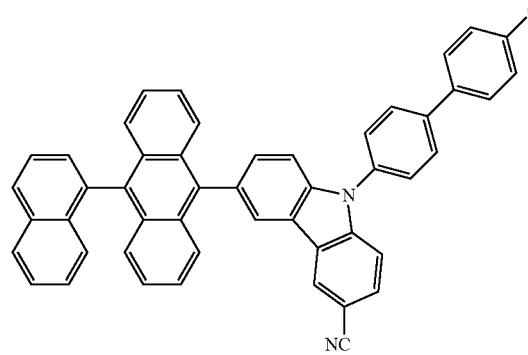
14
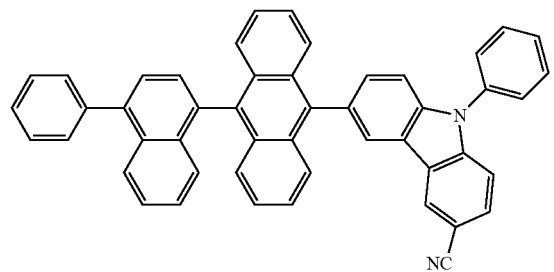
15
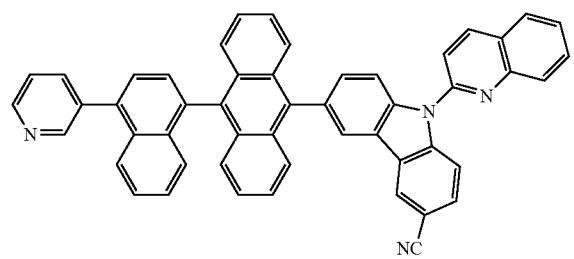
16
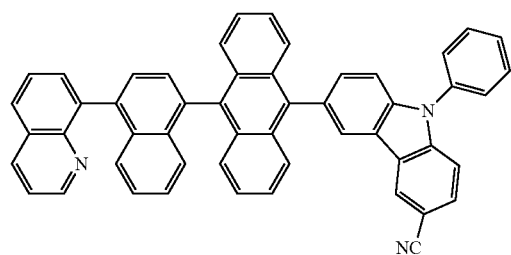
17
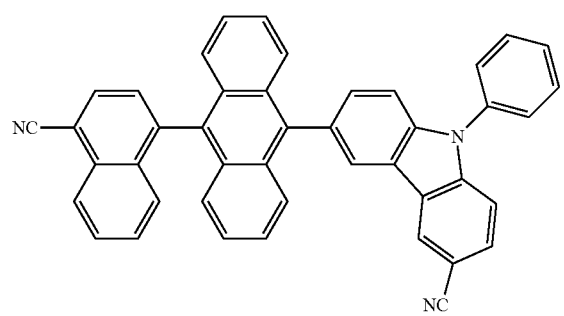
18
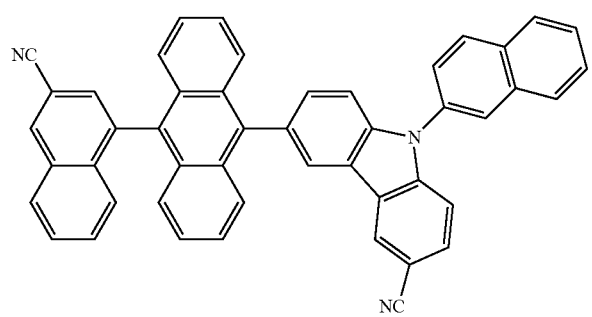
19
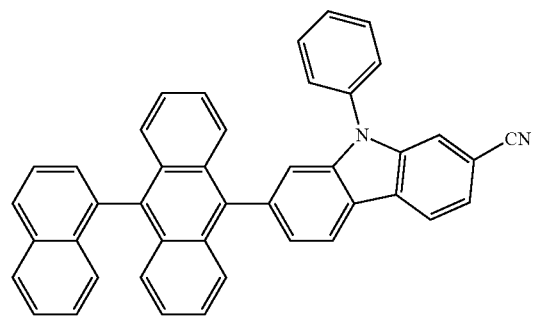
20
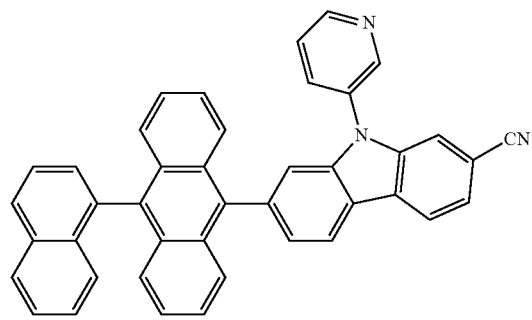
21
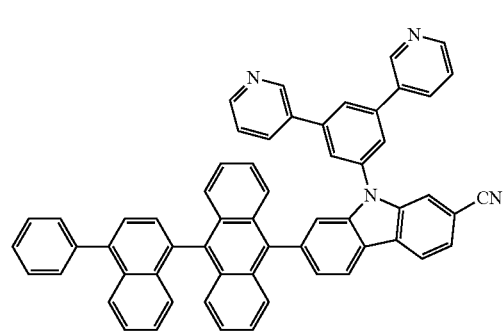
22
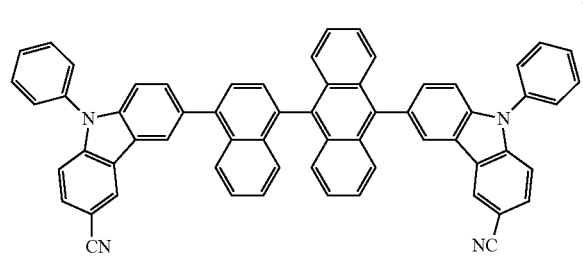

-continued
23
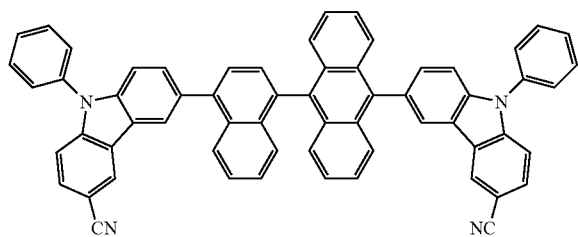
24
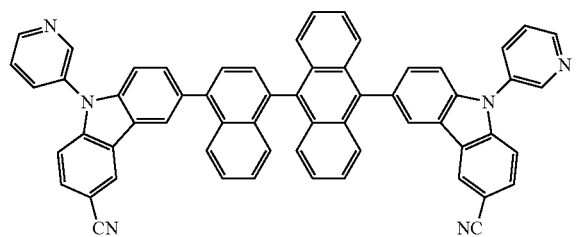
25
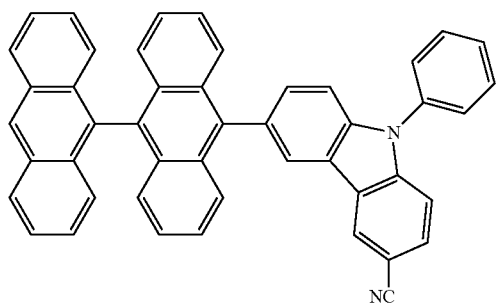
26
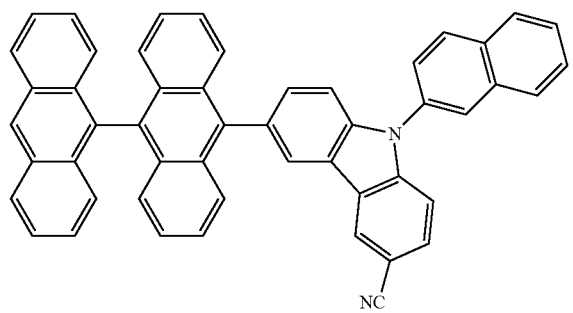
27
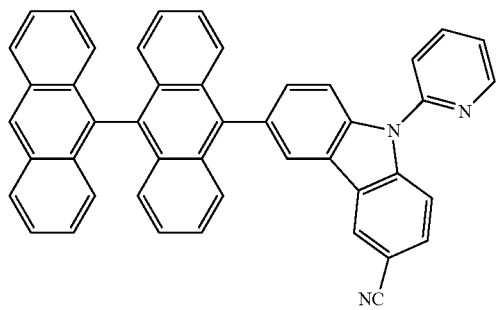
28
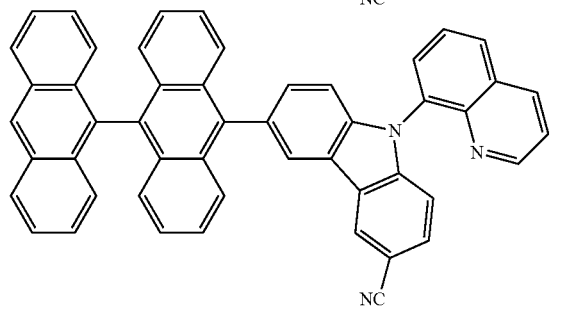
29
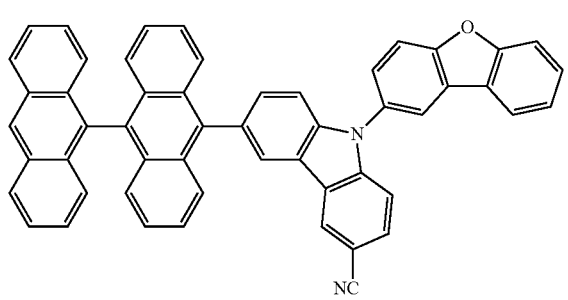
30
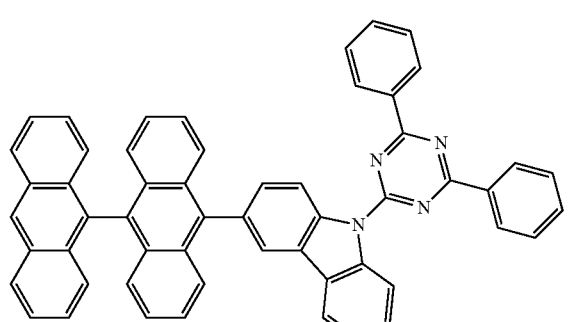
31
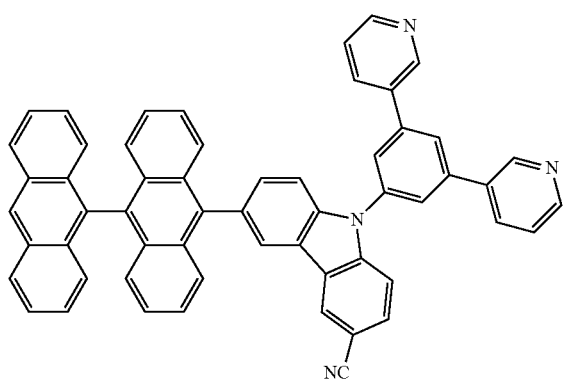
32
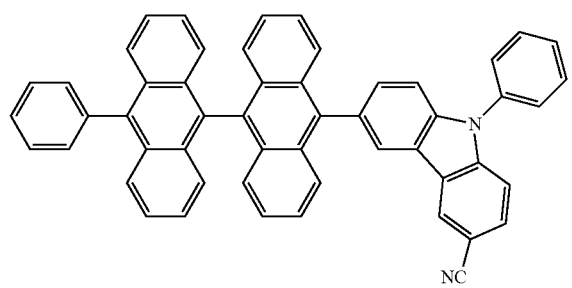

-continued
33
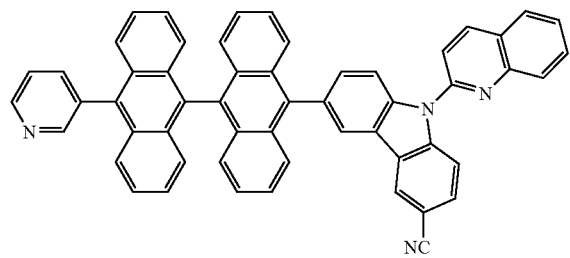
34
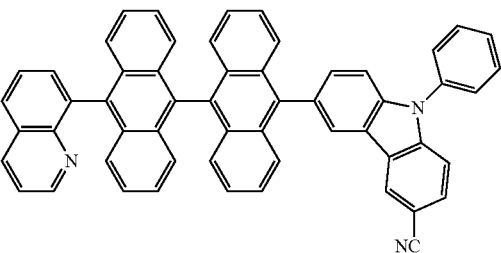
35
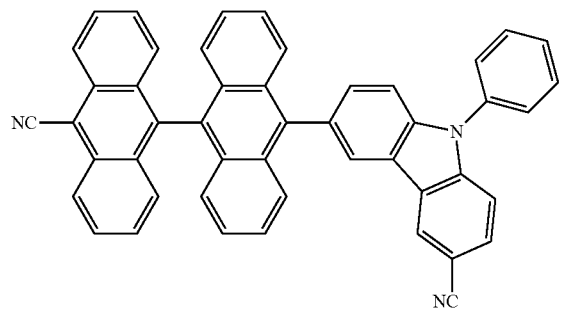
36
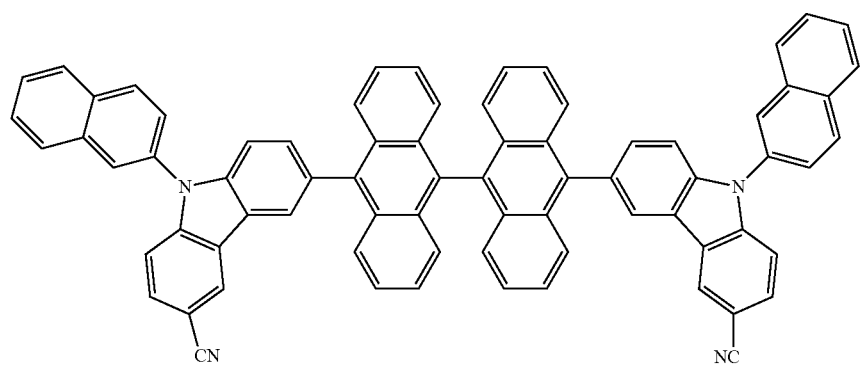
37
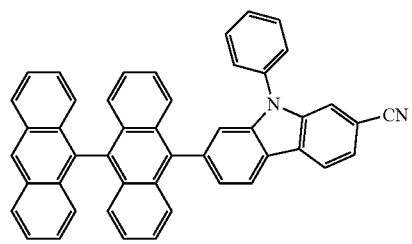
38
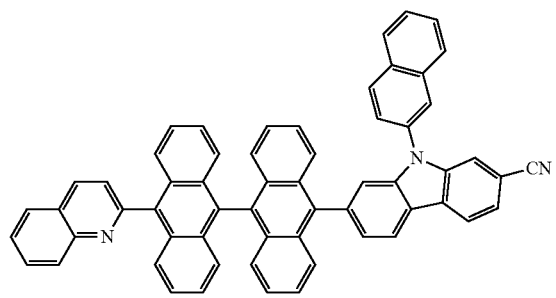
39
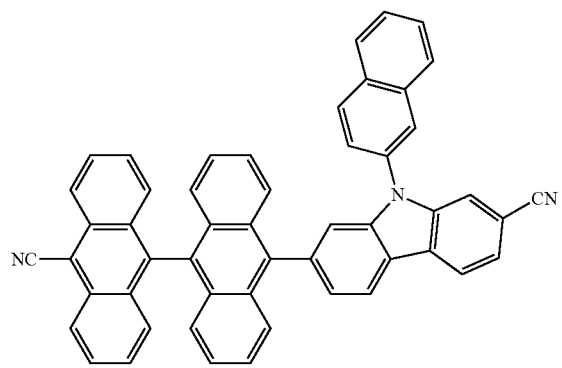
40
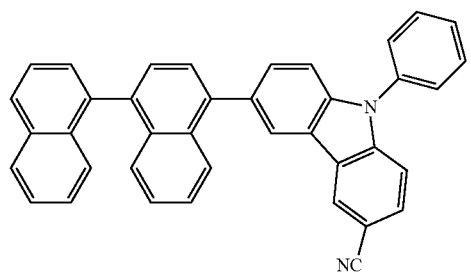

-continued
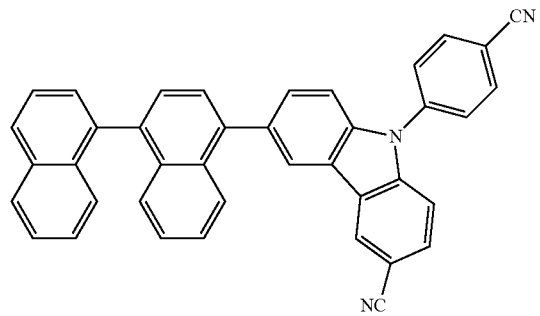
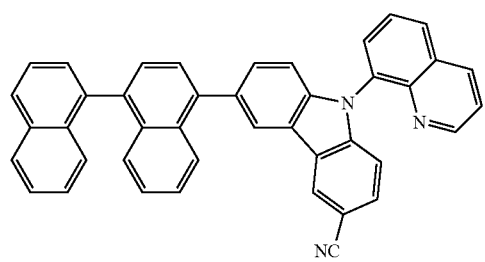
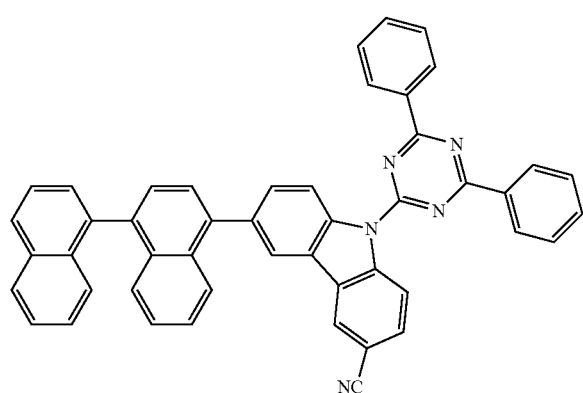
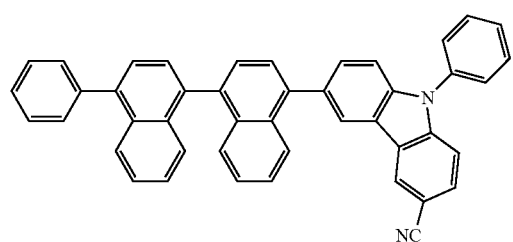
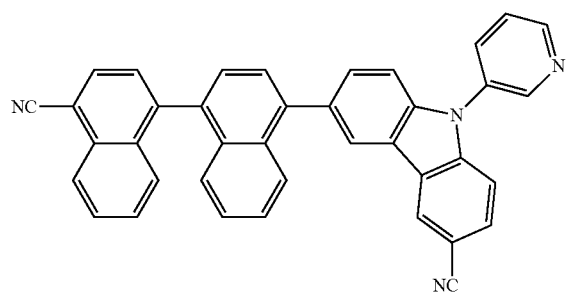

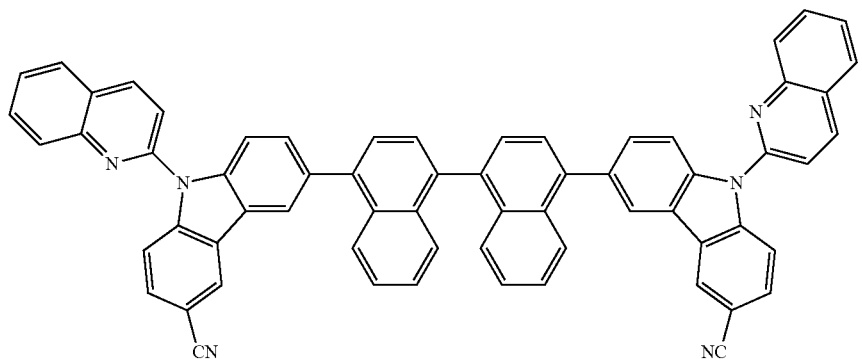

50

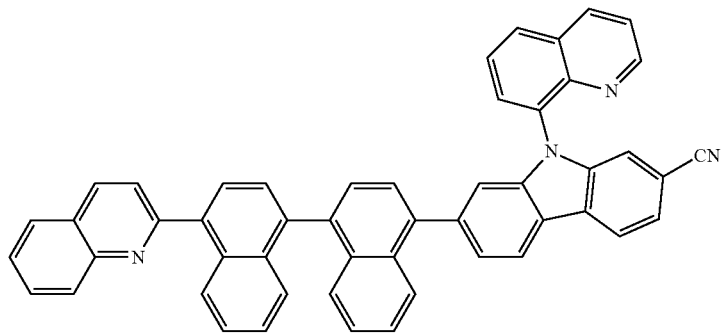

51

An organic light-emitting device according to an embodiment includes a first electrode, a second electrode, and an organic layer interposed between the first electrode and the second electrode, wherein the organic layer includes the compound represented by Formula 1 above.

The organic layer may include at least one layer selected from a hole injection layer, a hole transport layer, a functional layer having a hole injection function and a hole transport function (hereinafter referred to as "H-functional layer"), a buffer layer, an electron blocking layer, an emission layer, a hole blocking layer, an electron transport layer, an electron injection layer, and a functional layer having an electron transport function and an electron injection function (hereinafter referred to as "E-functional layer").

The organic layer may be used in an electron transport layer.

According to an embodiment, the organic light-emitting device may include an electron injection layer, an electron transport layer, an emission layer, a hole injection layer, a hole transport layer, or a functional layer having a hole injection capability and a hole transportation capability, and the emission layer may include an anthracene-based compound, an arylamine-based compound, or a styryl-based compound.

According to another embodiment, the organic light-emitting device may include an electron injection layer, an electron transport layer, an emission layer, a hole injection layer, a hole transport layer, or a functional layer having a hole injection capability and a hole transportation capability, and the emission layer may include a red layer, a green layer, a blue layer, and/or a white layer, and any one of these layers may include a phosphorescent compound, and the hole injection layer, the hole transport layer, or the functional layer having a hole injection capability and a hole transportation capability may include a charge-generation material. The charge-generation material may be a p-dopant, and the p-dopant may be a quinone derivative, a metal oxide, or a cyano group-containing compound.

According to another embodiment, the organic layer may include an electron transport layer that includes the electron-transportable compound according to an embodiment and a metal complex. The metal complex may be a Li complex.

The term "organic layer" used herein refers to a single layer and/or a plurality of layers interposed between the first electrode and the second electrode of an organic light-emitting device.

The organic layer includes an emission layer, and the emission layer may include the compound represented by Formula 1. The organic layer may include at least one layer selected from a hole injection layer, a hole transport layer, a H-functional layer, and the at least one layer selected from a hole injection layer, a hole transport layer, a H-functional layer may include the compound.

FIG. 1 illustrates a schematic cross-sectional view of an organic light-emitting device according to an embodiment. Hereinafter, with reference to FIG. 1, the structure of an organic light-emitting device according to an embodiment, and a method of manufacturing the organic light-emitting device, according to an embodiment, will be described in detail.

A substrate (not shown) may be any one of various substrates that can be used in an organic light-emitting device. For example, the substrate may be a glass substrate or a transparent plastic substrate with excellent mechanical strength, thermal stability, transparency, surface smoothness, ease of handling, and water repellency.

A first electrode may be formed by depositing or sputtering a material for a first electrode on the substrate. When the first electrode is an anode, the material for the first electrode may be selected from materials with a high work function to make holes be easily injected. The first electrode may be a reflective electrode or a transmission electrode. The material for the first electrode may be a transparent material with high conductivity, and examples of such a material are indium tin oxide (ITO), indium zinc oxide (IZO), tin oxide (SnO$_2$), and zinc oxide (ZnO). According to an embodiment, to form the first electrode as a reflective electrode, magnesium (Mg), aluminum (Al), aluminum-lithium (Al—Li), calcium (Ca), magnesium-indium (Mg—In), or magnesium-silver (Mg—Ag) may be used.

The first electrode may be a single- or multi-layered structure. For example, the first electrode may have a three-layered structure of ITO/Ag/ITO.

An organic layer is disposed on the first electrode.

The organic layer may include a hole injection layer, a hole transport layer, a buffer layer (not shown), an emission layer, an electron transport layer, or an electron injection layer.

A hole injection layer (HIL) may be formed on the first electrode by various methods, such as, for example, vacuum deposition, spin coating, casting, or LB deposition.

When a HIL is formed by vacuum deposition, the deposition conditions may vary according to a material that is used to form the HIL, and the structure and thermal characteristics of the HIL. For example, the deposition conditions may include a deposition temperature of about 100 to about 500° C., a vacuum pressure of about $10_{-8}$ to about $10^{-3}$ torr, and a deposition rate of about 0.01 to about 100 Å/sec.

When the HIL is formed by spin coating, coating conditions may vary according to the material used to form the HIL, and the structure and thermal properties of the HIL. For example, a coating speed may be from about 2000 rpm to about 5000 rpm, and a temperature at which a heat treatment is performed to remove a solvent after coating may be from about 80° C. to about 200° C.

Exemplary hole injection materials include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2-TNATA, a polyaniline/dodecylbenzenesulfonic acid (pani/DBSA), poly(3,4-ethylenedioxythiophene)/poly(4-styrenesulfonate) (PEDOT/PSS), polyaniline/camphor sulfonicacid (pani/CSA), and (polyaniline)/poly(4-styrenesulfonate) (PANI/PSS):

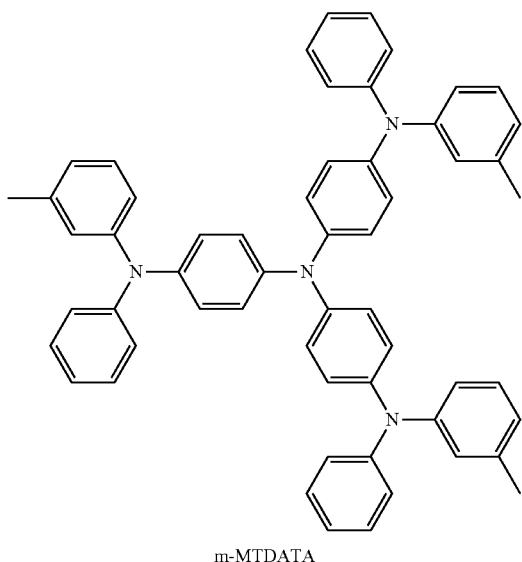

m-MTDATA

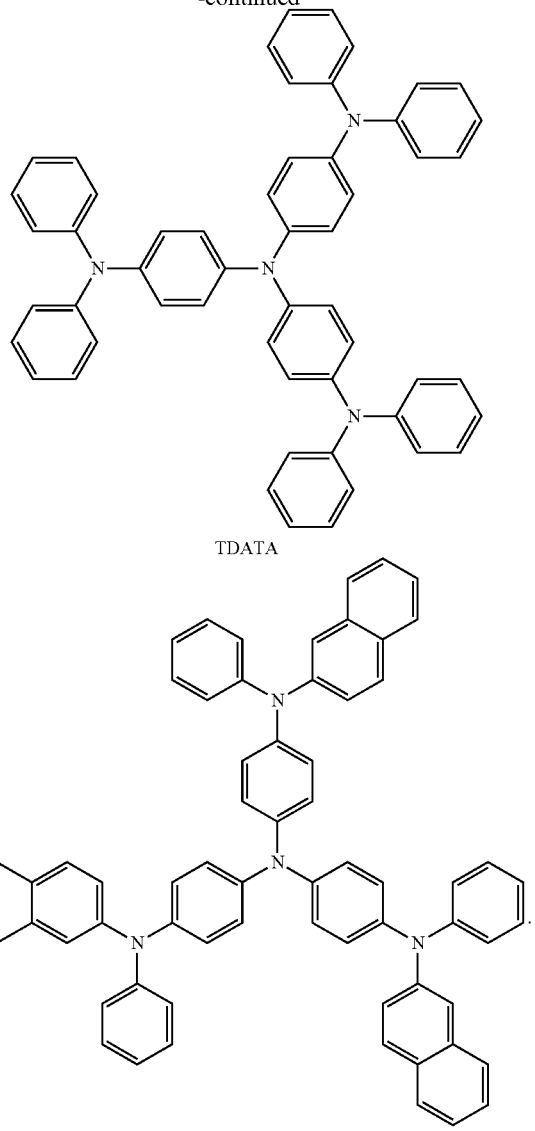

TDATA

2-TNATA

A thickness of the HIL may be in a range of about 100 Å to about 10000 Å, for example, about 100 Å to about 1000 Å. Maintaining the thickness of the HIL within the range described above, may help provide the HIL with satisfactory hole injection characteristics without a substantial increase in a driving voltage.

Then, a hole transport layer (HTL) may be formed on the HIL by vacuum deposition, spin coating, casting, or Langmuir-Blodgett (LB) deposition. When the HTL is formed by vacuum deposition or spin coating, the deposition and coating conditions may be similar to those for the formation of the HIL, though the conditions for deposition and coating may vary according to the material that is used to form the HTL.

Exemplary hole transportation materials include a carbazole derivative, such as N-phenylcarbazole or polyvinylcarbazol, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB):

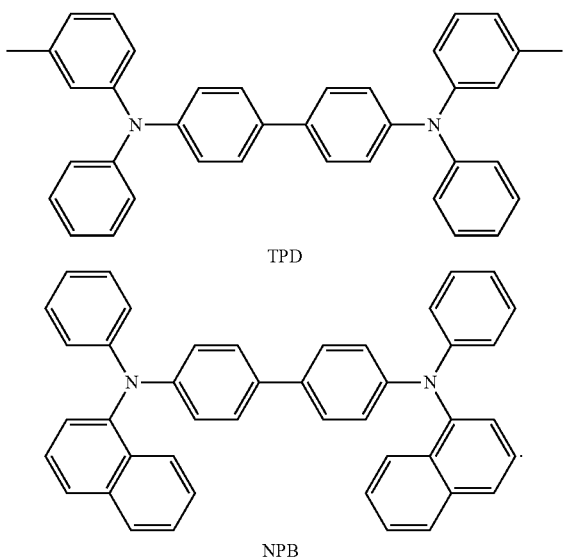

TPD

NPB

A thickness of the HTL may be in a range of about 100 Å to about 10000 Å, for example, about 100 Å to about 1000 Å. Maintaining the thickness of the HTL within the ranges described above, may help provide the HTL with satisfactory hole transportation properties without a substantial increase in a driving voltage.

A H-functional layer (having a hole injection capability and a hole transport capability) may include at least one material selected from the hole injection layer materials and the hole transport layer materials, and a thickness of the H-functional layer may be in a range of about 500 Å to about 10000 Å, for example, about 100 Å to about 1000 Å. Maintaining the thickness of the H-functional layer within the range described above may help provide satisfactory hole injection and transportation properties without a substantial increase in driving voltage.

In addition, at least one layer of the HIL, the HTL, and the H-functional layer may include at least one of a compound represented by Formula 300 below and a compound represented by Formula 350 below:

<Formula 300>

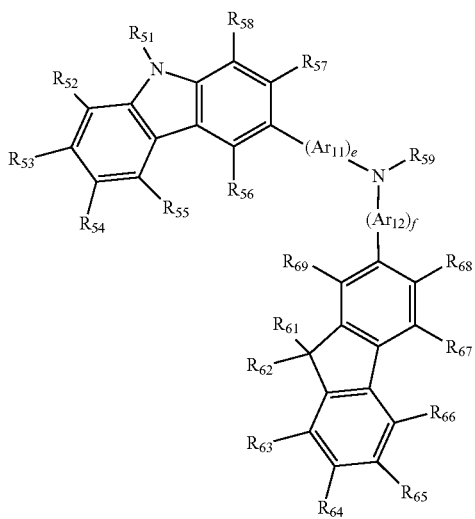

<Formula 350>

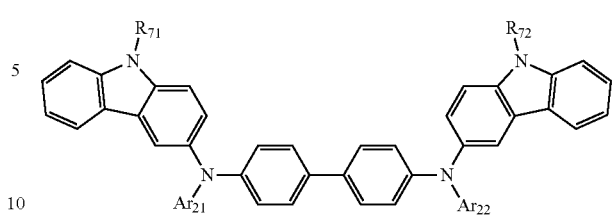

wherein in Formulae 300 and 350, $Ar_{11}$, $Ar_{12}$, $Ar_{21}$, and $Ar_{22}$ are each independently, a substituted or unsubstituted $C_5$-$C_{60}$ arylene group.

e and f in Formula 300 may each independently be an integer of 0 to 5, or 0, 1 or 2. For example, e may be 1 and f may be 0.

For example, $R_{51}$ to $R_{58}$, $R_{61}$ to $R_{69}$, and $R_{71}$ and $R_{72}$ in Formulae 300 and 350 may each independently be a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryoxyl group, or a substituted or unsubstituted $C_5$-$C_{60}$ arylthio group.

For example, $R_{51}$ to $R_{58}$, $R_{61}$ to $R_{69}$, $R_{71}$ and $R_{72}$ may each independently be selected from:

a hydrogen atom; a deuterium atom; a halogen atom; a hydroxyl group; a cyano group; a nitro group; an amino group; an amidino group; a hydrazine; a hydrazone; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, or a hexyl group); and a $C_1$-$C_{10}$ alkoxy group (for example, a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group; a naphthyl group; an anthryl group; a fluorenyl group; and a pyrenyl group; and a phenyl group, a naphthyl group, an anthryl group, a fluorenyl group, and a pyrenyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group.

$R_{59}$ in Formula 300 may be selected from a phenyl group; a naphthyl group; an anthryl group; a biphenyl group; a pyridyl group; and a phenyl group, a naphthyl group, an anthryl group, a biphenyl group, and a pyridyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

According to an embodiment, the compound represented by Formula 300 may be represented by Formula 300A:

<Formula 300A>

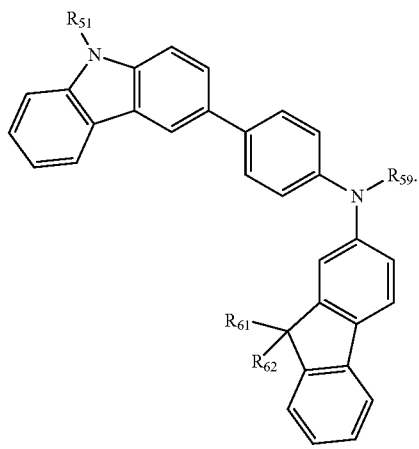

Detailed description about $R_{51}$, $R_{60}$, $R_{61}$, and $R_{59}$ in Formula 300A are already described above.

For example, at least one layer of the HIL, the HTL, and the H-functional layer may include at least one of Compounds 301 to 320 below:

301

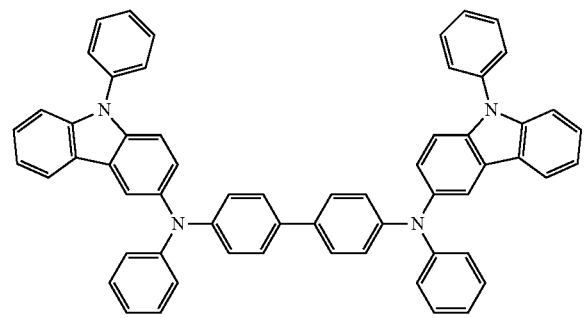

302

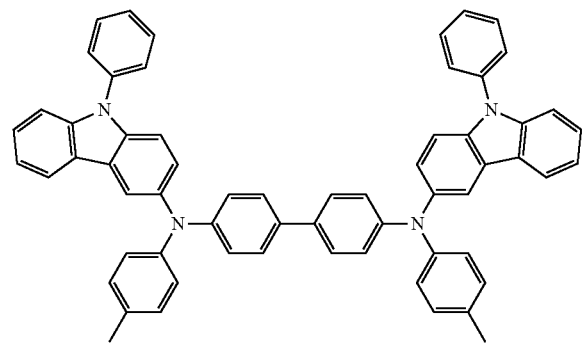

-continued

303

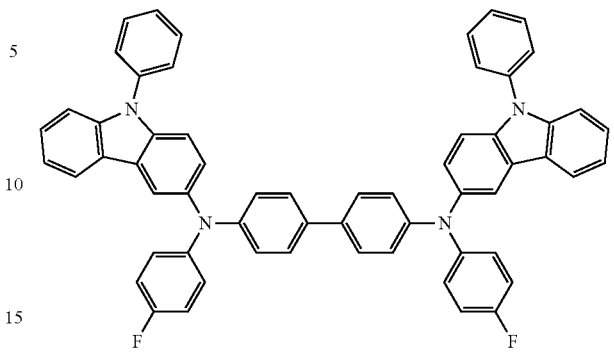

304

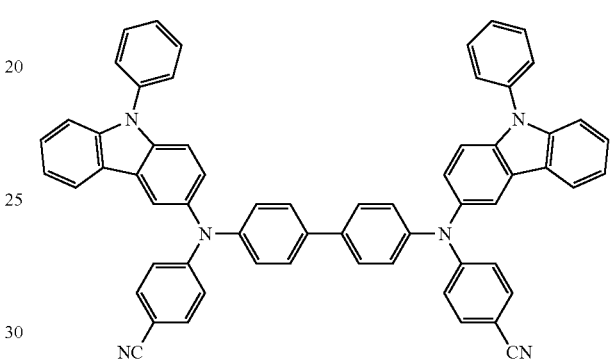

305

306

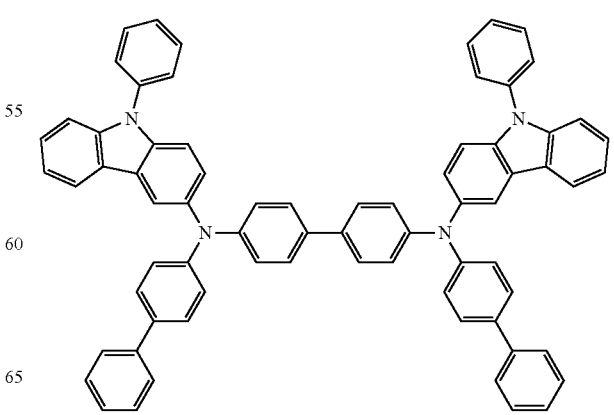

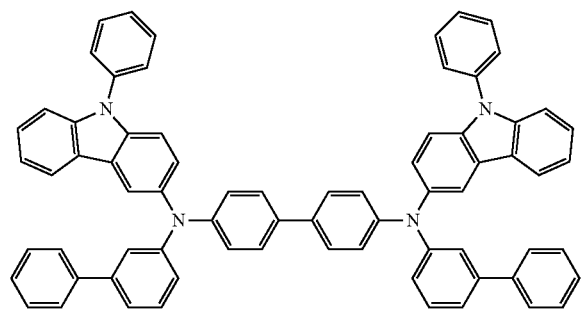
307
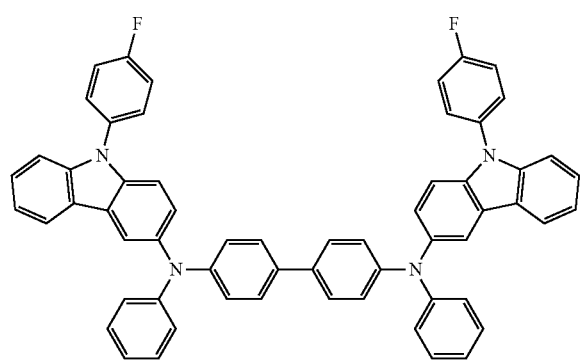
308
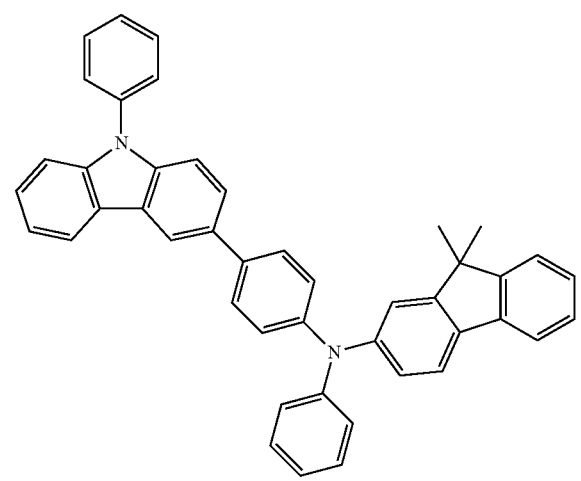
309
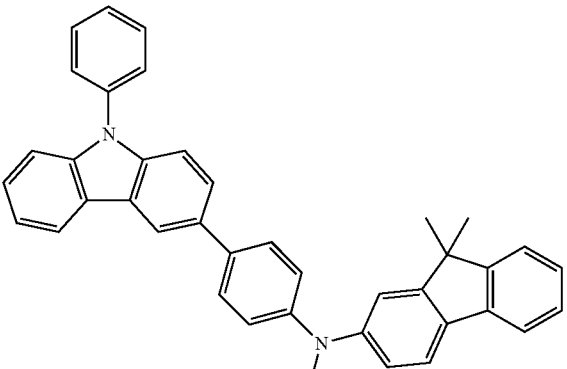
310
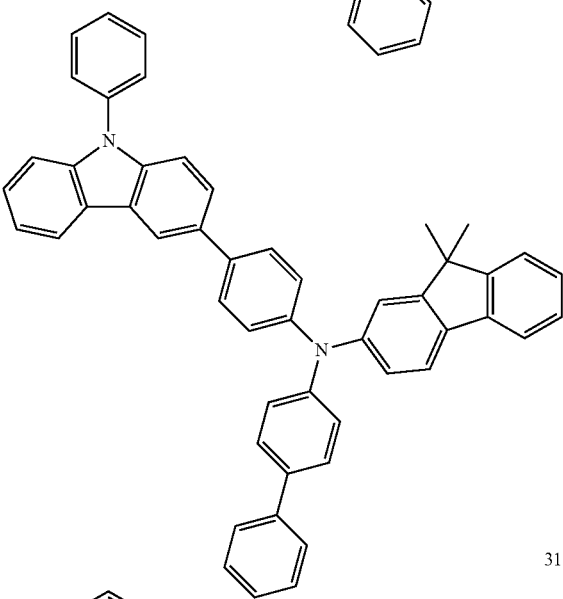
311
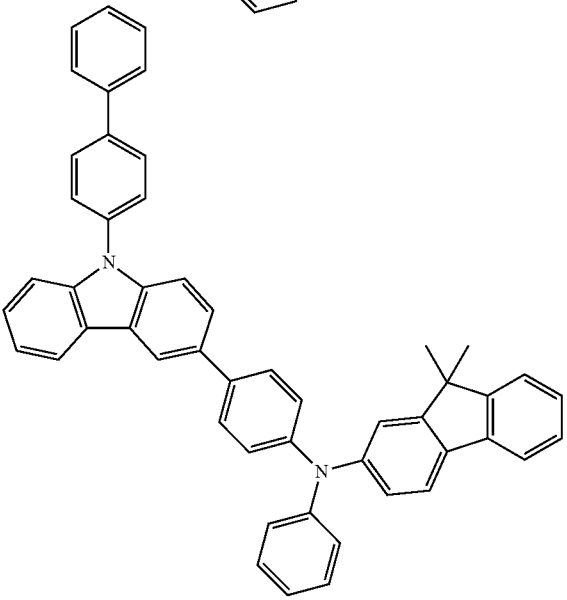
312

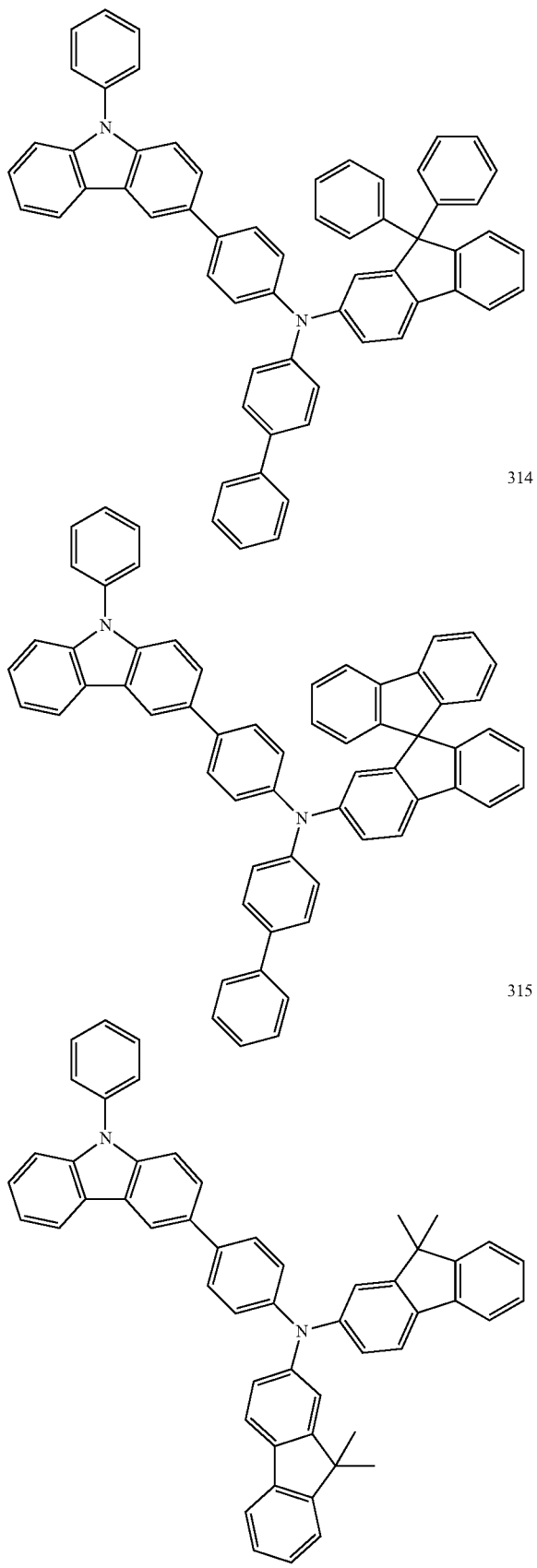
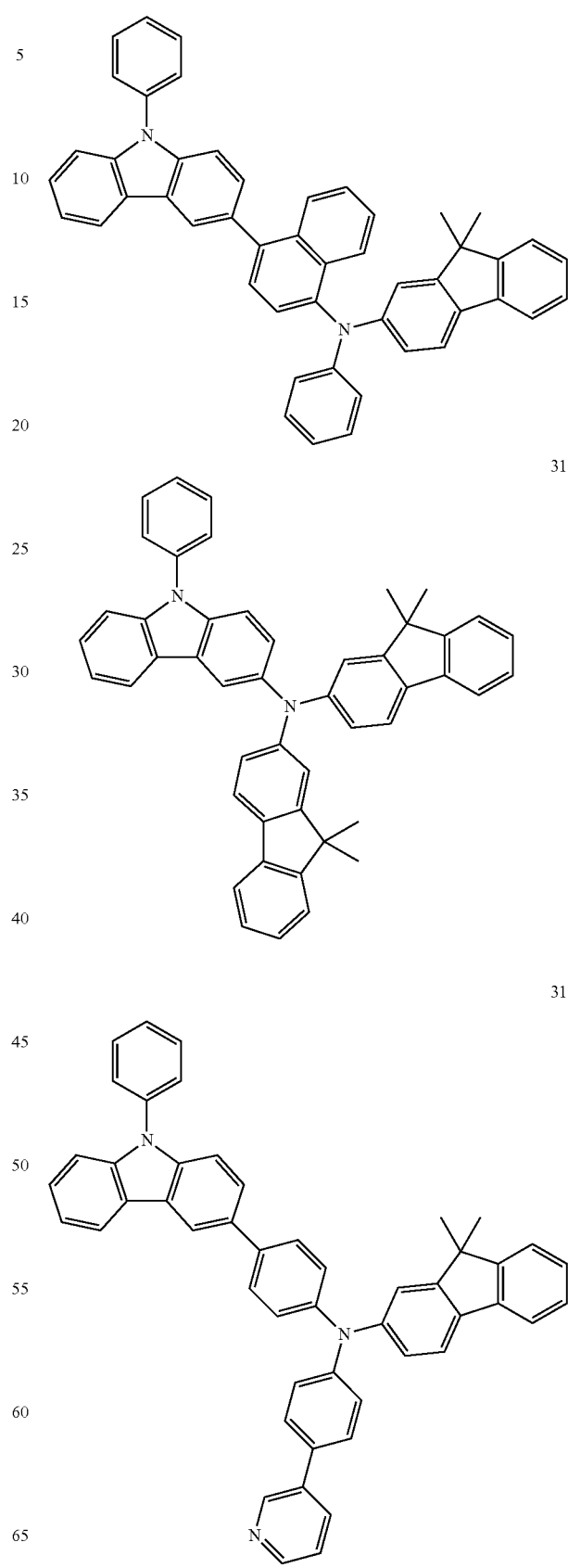

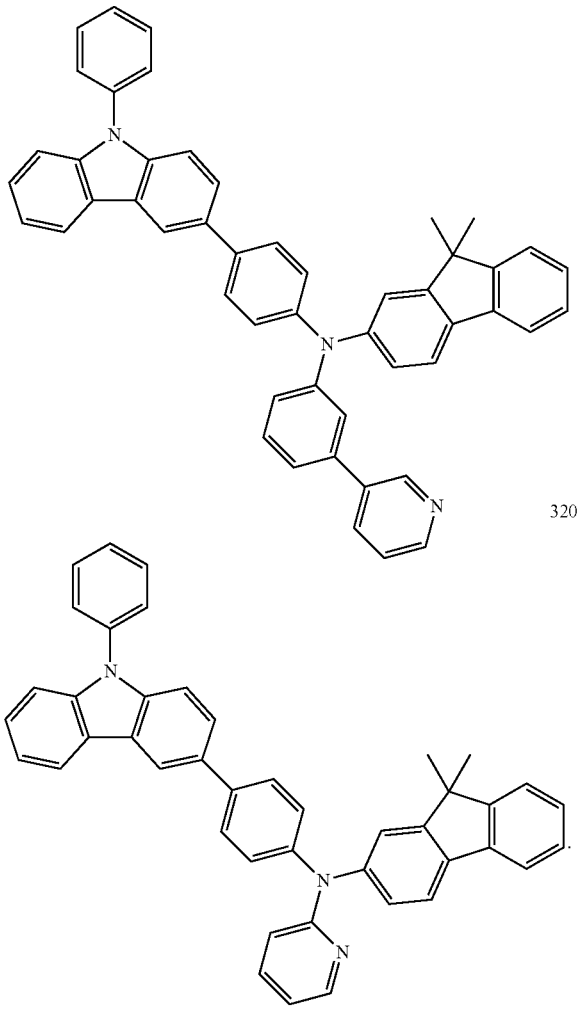

At least one of the HIL, the HTL, and the H-functional layer may further include a charge-generating material to increase conductivity of a layer, in addition to such hole injecting materials, hole transport materials, and/or materials having both hole injection and hole transport capabilities.

The charge-generation material may be, for example, a p-dopant. The p-dopant may be, for example, a quinone derivative, such as tetracyanoquinonedimethein (TCNQ) and 2,3,5,6-tetrafluoro-tetracyano-1,4-benzoquinonedimethein (F4-TCNQ); a metal oxide, such as a tungsten oxide and a molybdenum oxide; and a cyano group-containing compound, such as Compound 200 below:

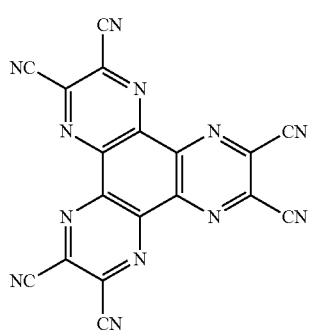
<Compound 200>

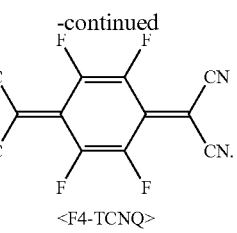
<F4-TCNQ>

When the hole injection layer, the hole transport layer, or the H-functional layer further includes a charge-generation material, the charge-generation material may be homogeneously dispersed or non-homogeneously distributed in the hole injection layer, the hole transport layer, and the H-functional layer.

A buffer layer may be disposed between at least one of the HIL, the HTL, and the H-functional layer, and an emission layer. The buffer layer may compensate an optical resonance distance according to a wavelength of light emitted from the emission layer, efficiency of a formed organic light-emitting device may be improved. The buffer layer may include a hole injection material and a hole transportation material. The buffer layer may include a material that is the same as a material included in the hole injection layer, the hole transport layer, and the H-functional layer formed under the buffer layer.

Subsequently, an emission layer (EML) may be formed on the hole transport layer, the H-functional layer, or the buffer layer by, for example, vacuum deposition, spin coating, casting, or LB deposition. If the EML is formed by vacuum deposition or spin coating, the deposition or coating conditions may be similar to those applied to form the HIL, although the deposition or coating conditions may vary according to the material that is used to form the EML.

The EML may be formed using various luminescent materials, for example, a host and a dopant. A dopant for use in the EML may be a fluorescent dopant and a phosphorescent dopant.

Examples of a host are $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenyl-benzimidazole-2-yl)benzene (TPBI), 3-tert-butyl-9,10-di (naphth-2-yl) anthracene (TBADN), E3, distyrylarylene (DSA), dmCBP (see the following chemical structure), and Compounds 501 to 509 illustrated below:

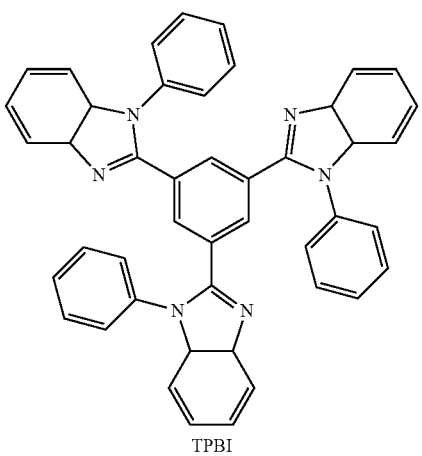
TPBI

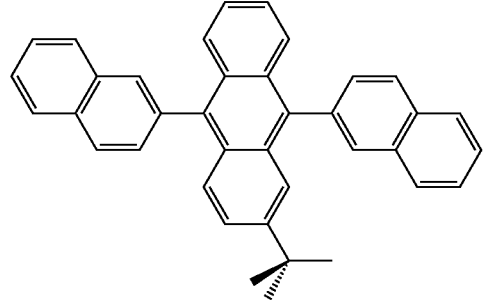
TBADN
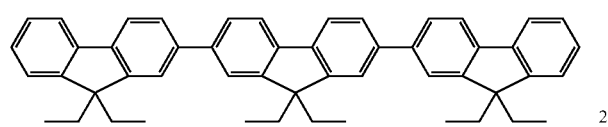
PVK
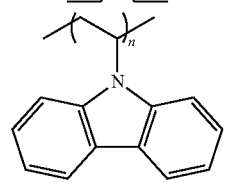
ADN
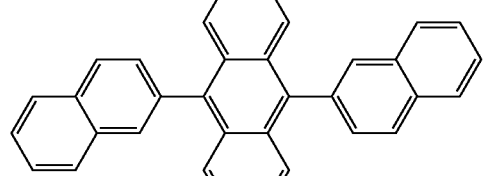
CBP
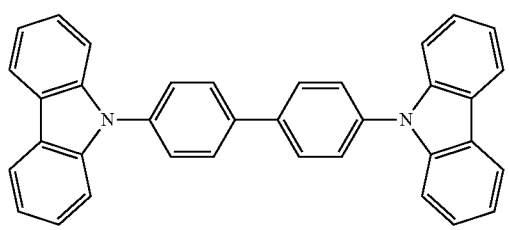
dmCBP
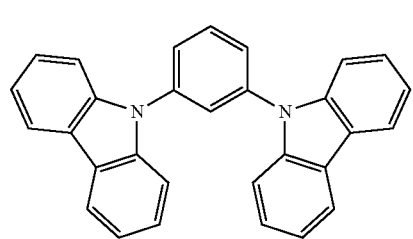
501
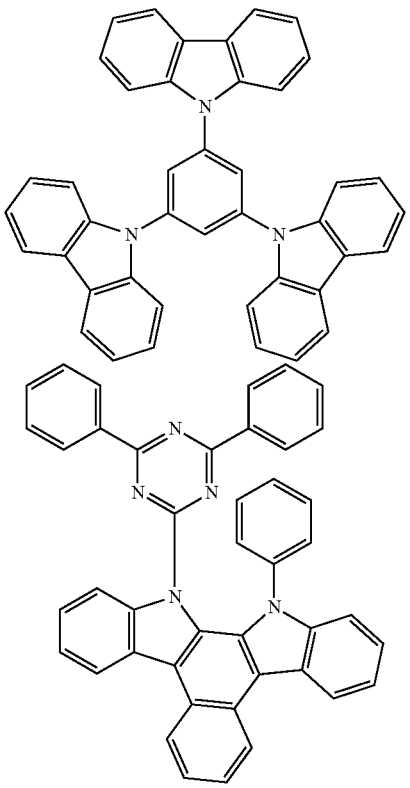
502
503
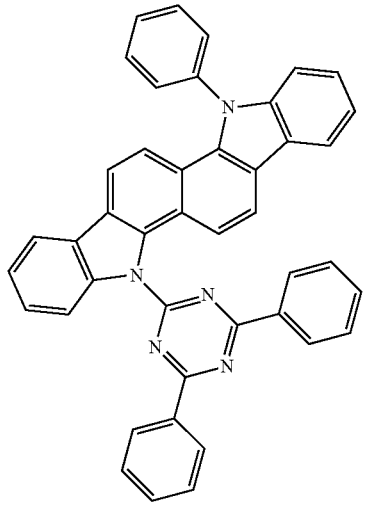
504
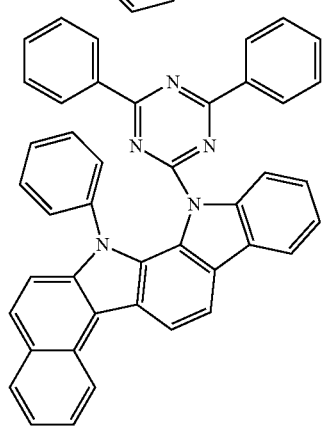
505

-continued

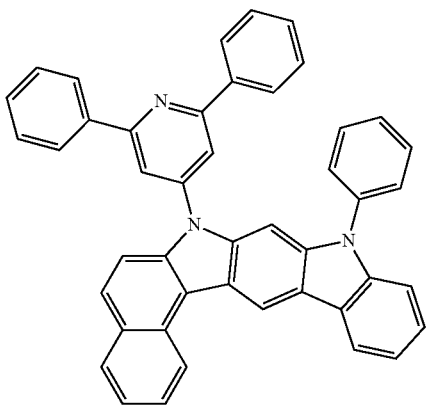
506

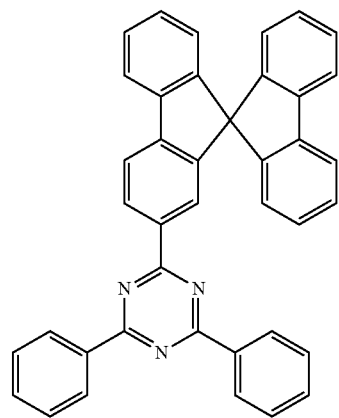
507

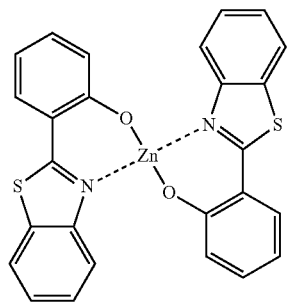
508

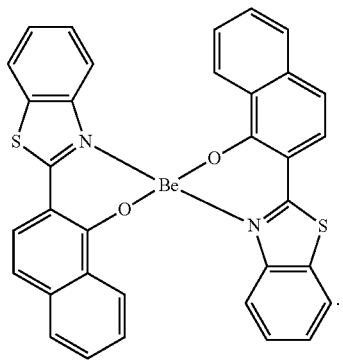

The host may be an anthracene-based compound represented by Formula 400 below:

<Formula 400>

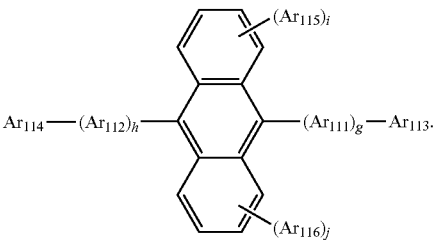

wherein, in Formula 400, $Ar_{111}$ and $Ar_{112}$ may each independently be a substituted or unsubstituted $C_5$-$C_{60}$ arylene group; $Ar_{113}$ to $Ar_{116}$ may each independently be a substituted or unsubstituted $C_1$-$C_{10}$ alkyl group, or a substituted or unsubstituted $C_5$-$C_{60}$ aryl group; and g, h, i, and j are each independently an integer of 0 to 4.

For example, $Ar_{111}$ and $Ar_{112}$ in Formula 400 may each independently be a phenylene group, a naphthylene group, a phenanthrenyl group, or a pyrenylene group; or a phenylene group, a naphthylene group, a phenanthrenyl group, a fluorenyl group, or a pyrenylene group, each substituted with at least one of a phenyl group, a naphthyl group, or an anthryl group.

g, h, i, and j in Formula 400 may each independently be 0, 1, or 2.

$Ar_{113}$ to $Ar_{116}$ in Formula 400 may each independently be a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; or a phenyl group, a naphthyl group, an anthryl group, a pyrenyl group, a phenanthrenyl group, and a fluorenyl group, each substituted with at least one of a deuterium atom, a halogen atom, a hydroxyl group, a cyano group, a nitro group, an amino group, an amidino group, a hydrazine, a hydrazone, a carboxyl group or salt thereof, a sulfonic group or salt thereof, a phosphoric acid group or salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, pyrenyl group, a phenanthrenyl group, a fluorenyl group, and

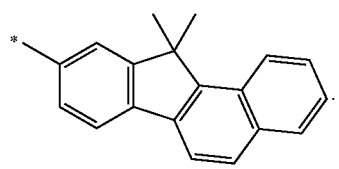 [SMILES: Cc1ccc2c(c1)C(C)(C)c1c-2ccc2ccccc12]
509

For example, the anthracene-based compound represented by Formula 400 may be one of the following compounds:

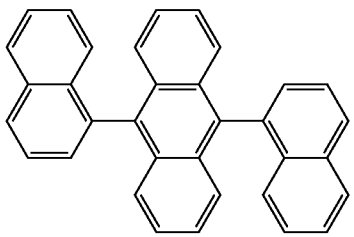

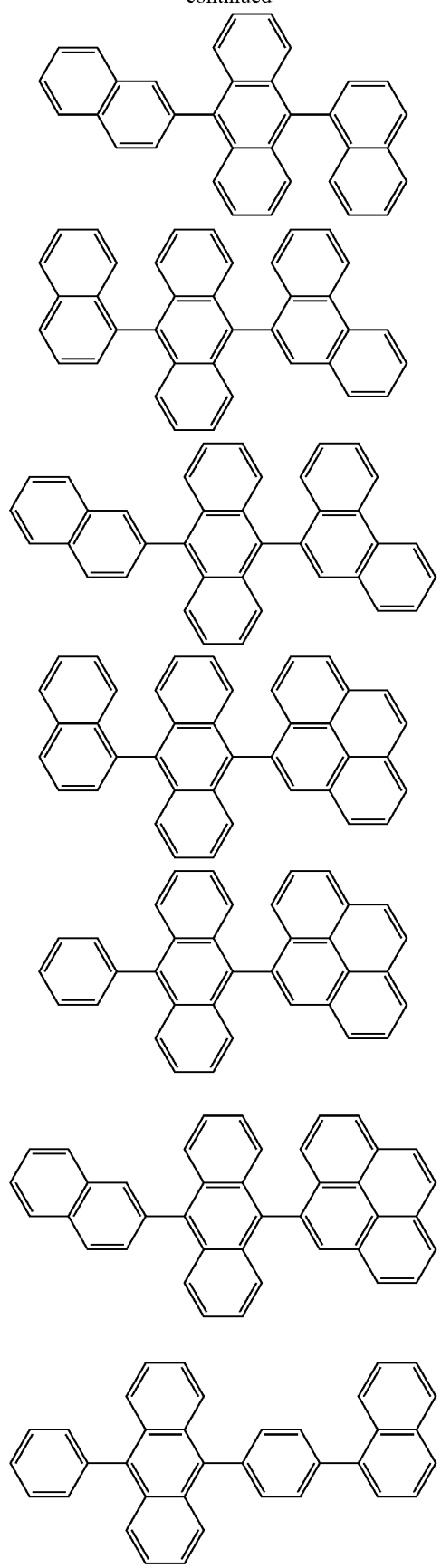
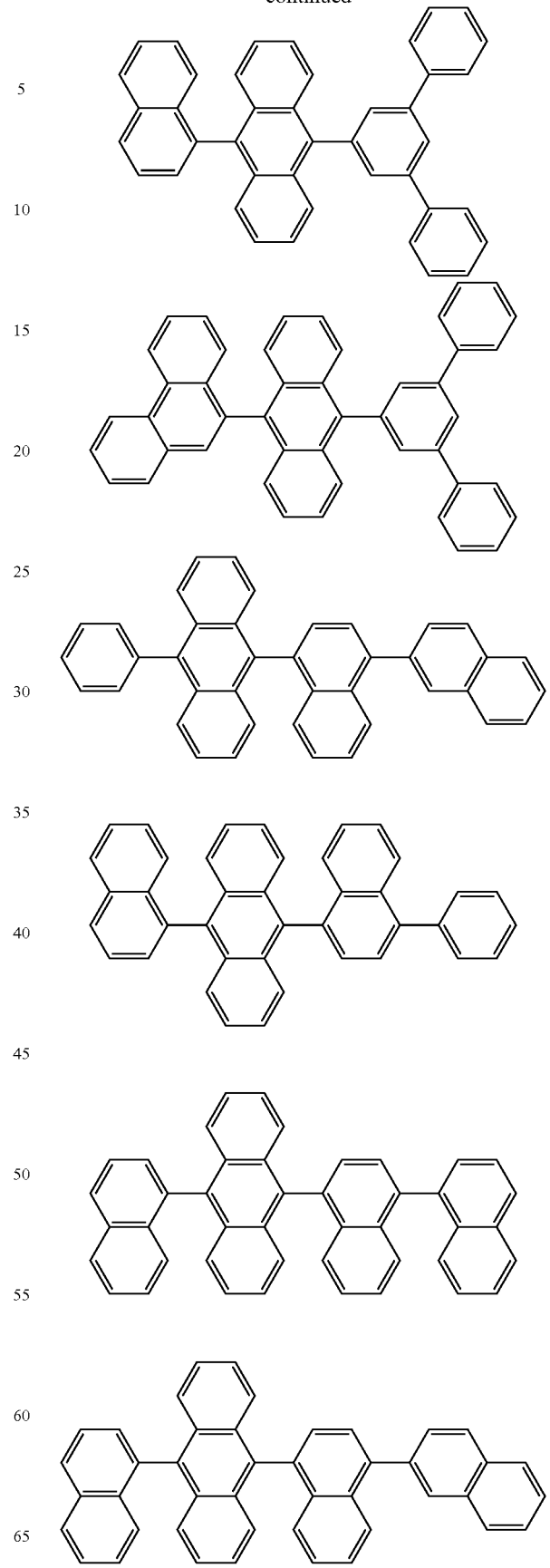

-continued
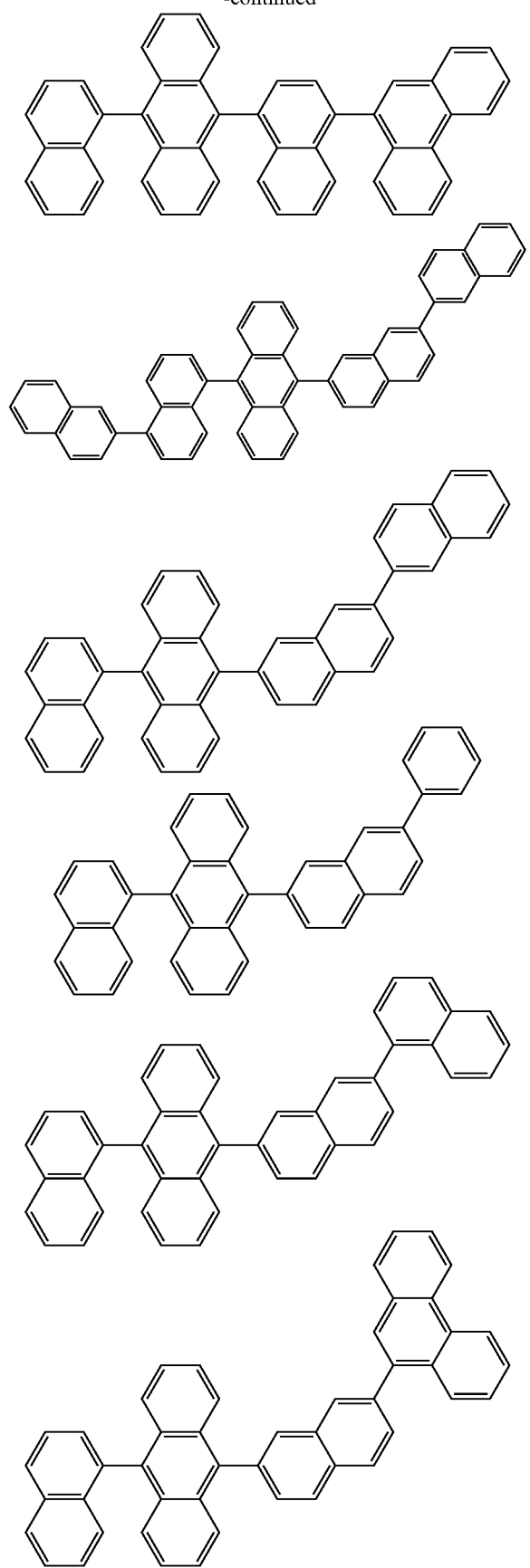
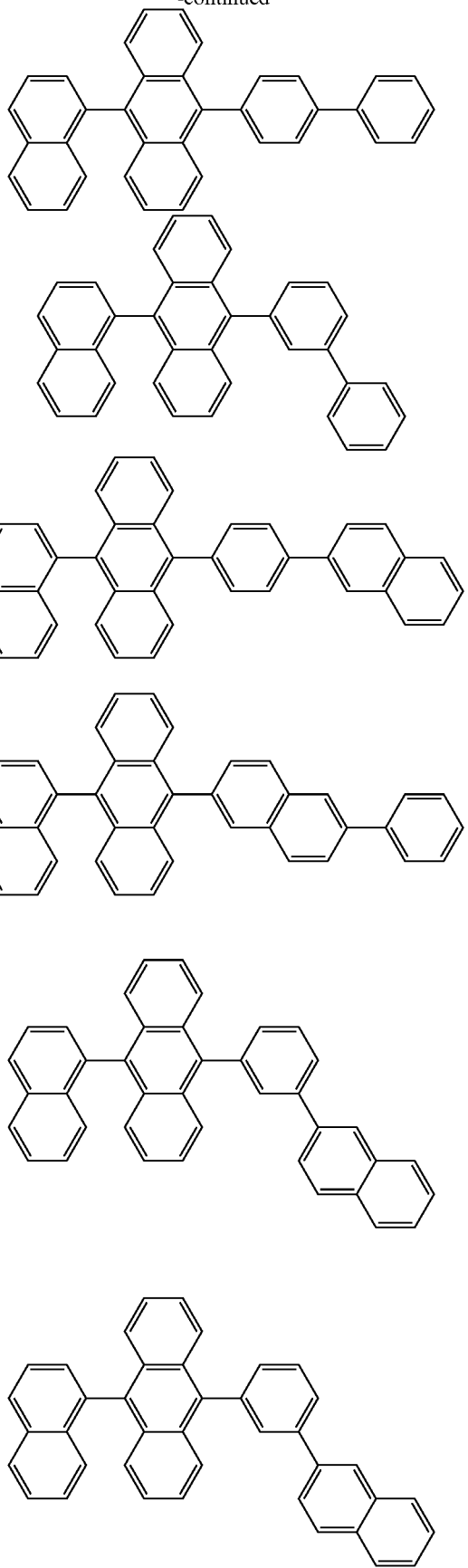

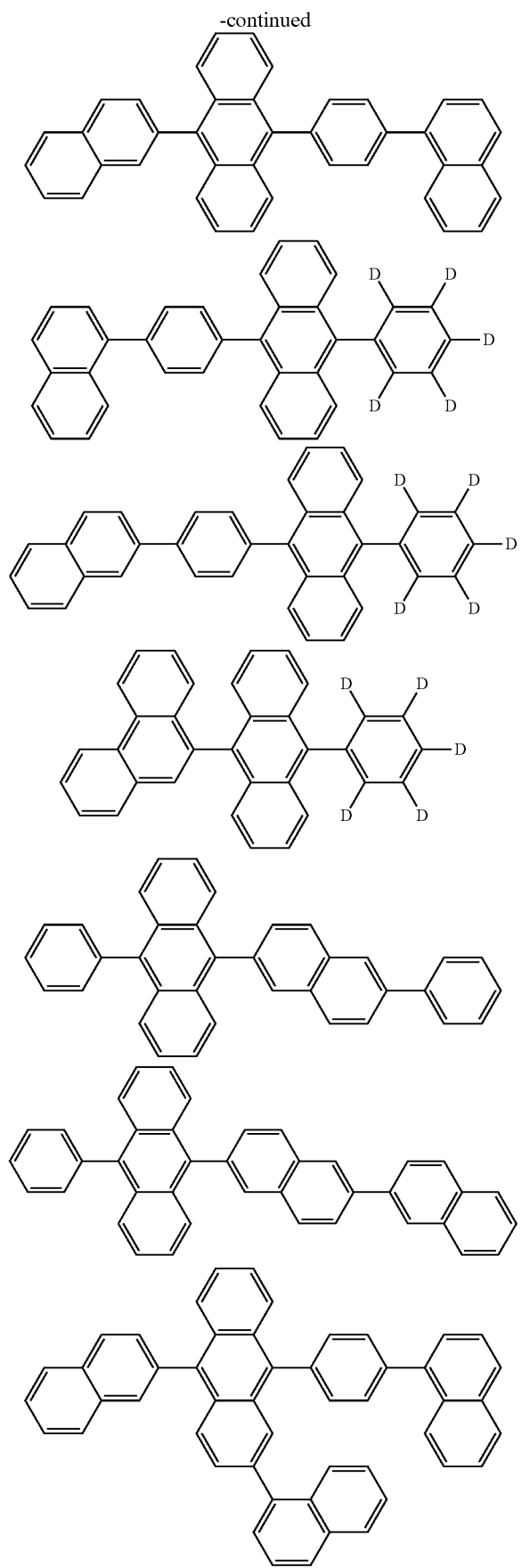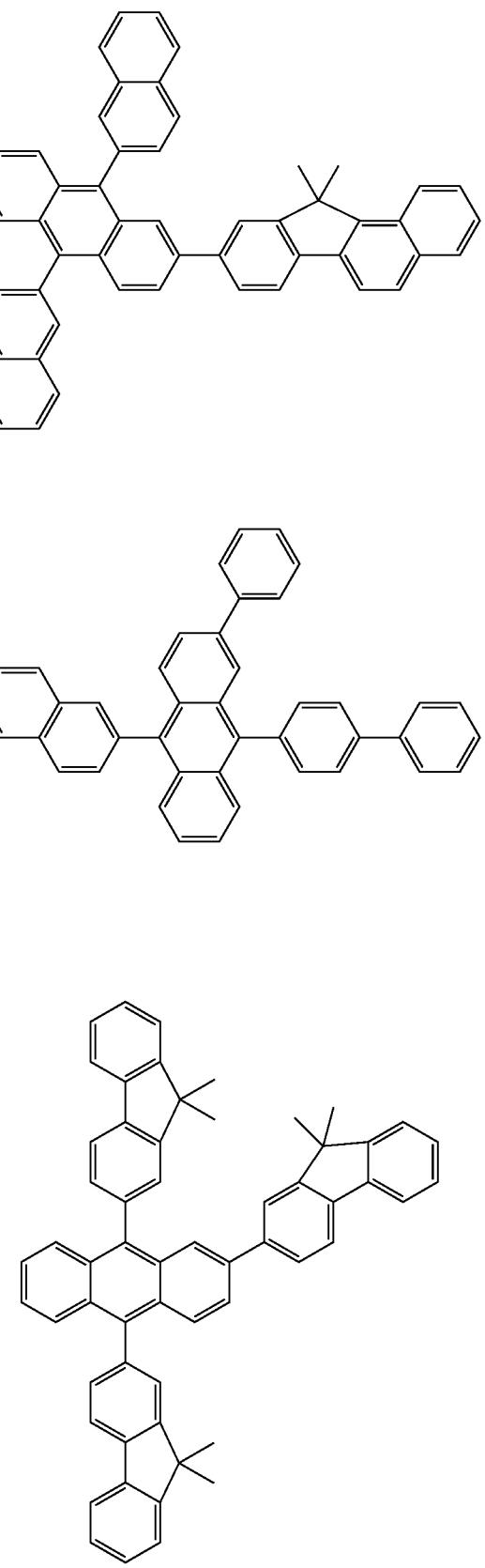

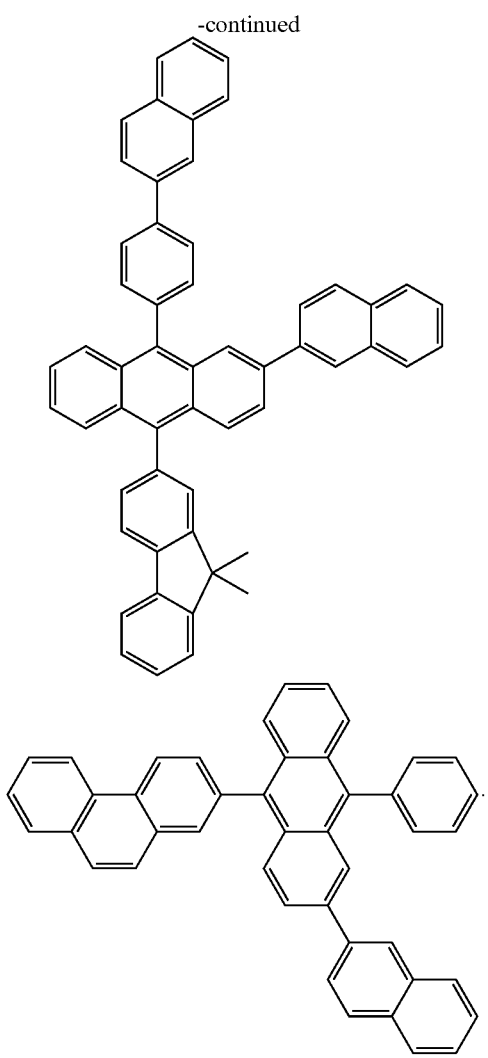

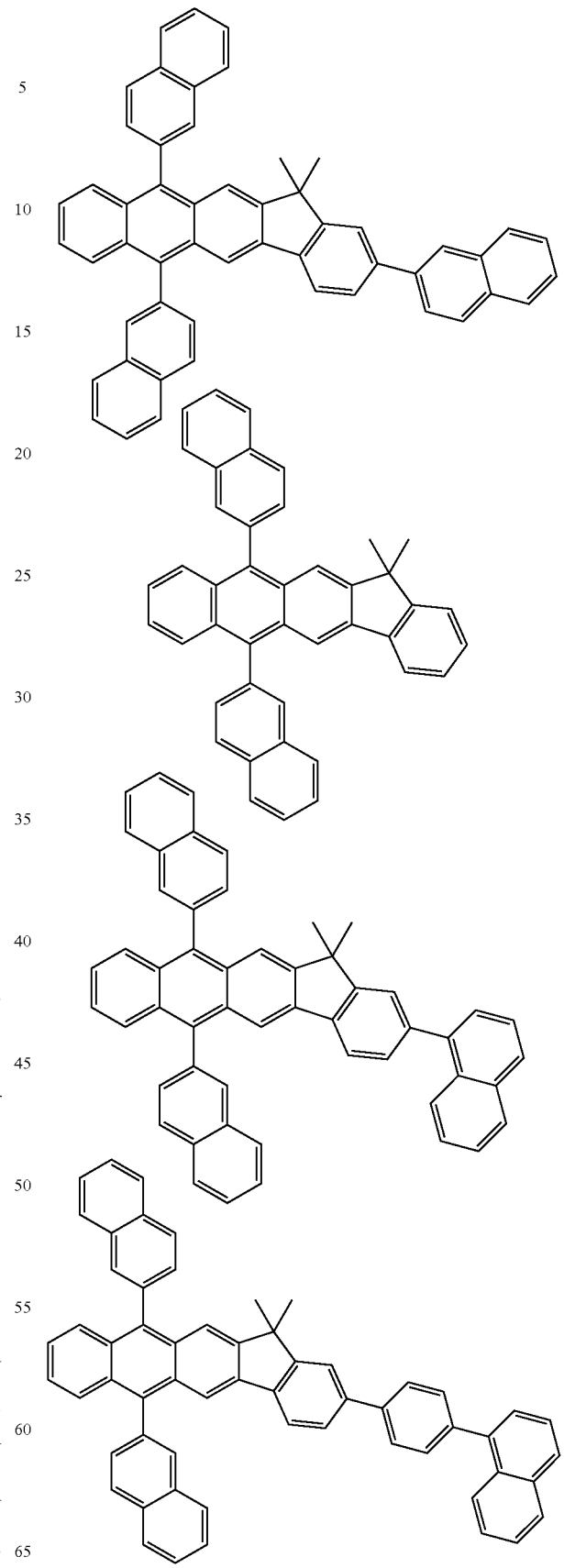

The host may be an anthracene-based compound represented by Formula 400 below:

<Formula 401>

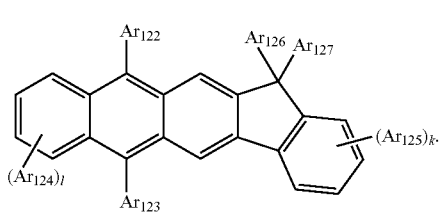

$Ar_{122}$ to $Ar_{125}$ in Formula 401 are the same as described in detail in connection with $Ar_{113}$ in Formula 400.

$Ar_{126}$ and $Ar_{127}$ in Formula 401 may each independently be a $C_1$-$C_{10}$ alkyl group (for example, a methyl group, an ethyl group, or a propyl group).

k and l in Formula 401 may each independently be an integer of 0 to 4. For example, k and l may be 0, 1, or 2.

For example, the anthracene-based compound represented by Formula 401 may be one of the following compounds:

When the organic light-emitting device is a full color organic light-emitting device, the EML may be patterned into a red EML, a green EML, and a blue EML.
At least one of the red EML, the green EML, and the blue EML may include the following dopants (ppy=phenylpyridine)
For example, compounds illustrated below may be used as a blue dopant:
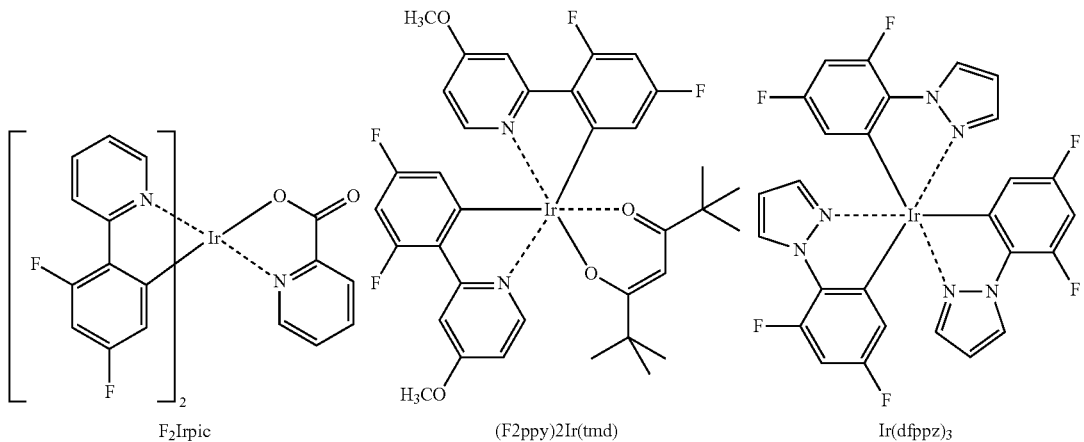
F₂Irpic     (F2ppy)2Ir(tmd)     Ir(dfppz)₃
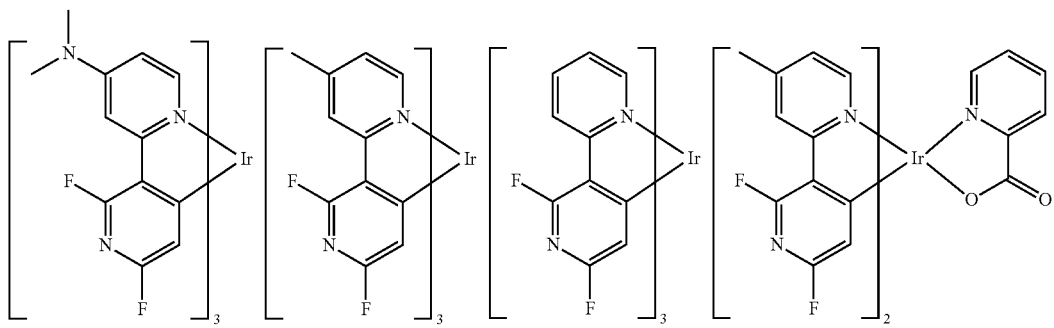
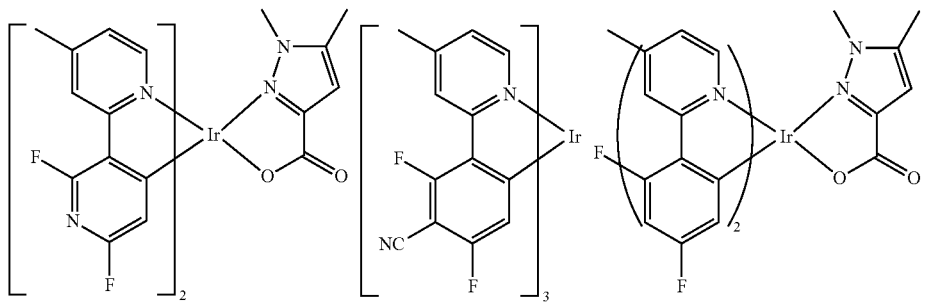
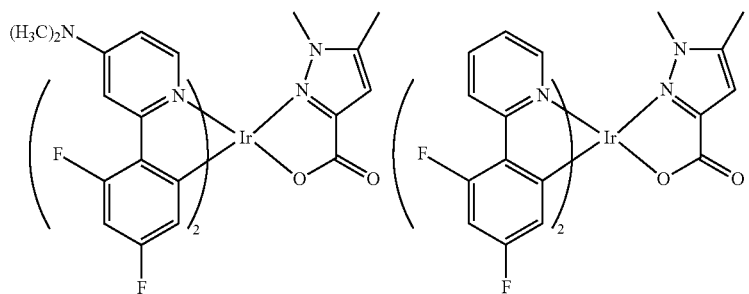

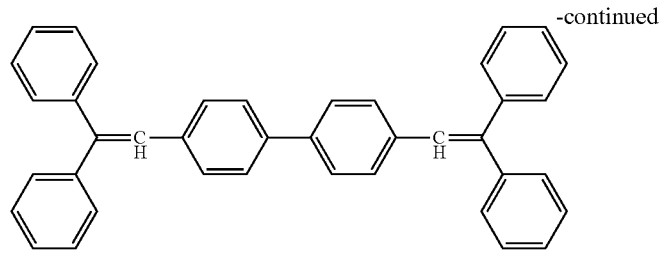
DPVBi
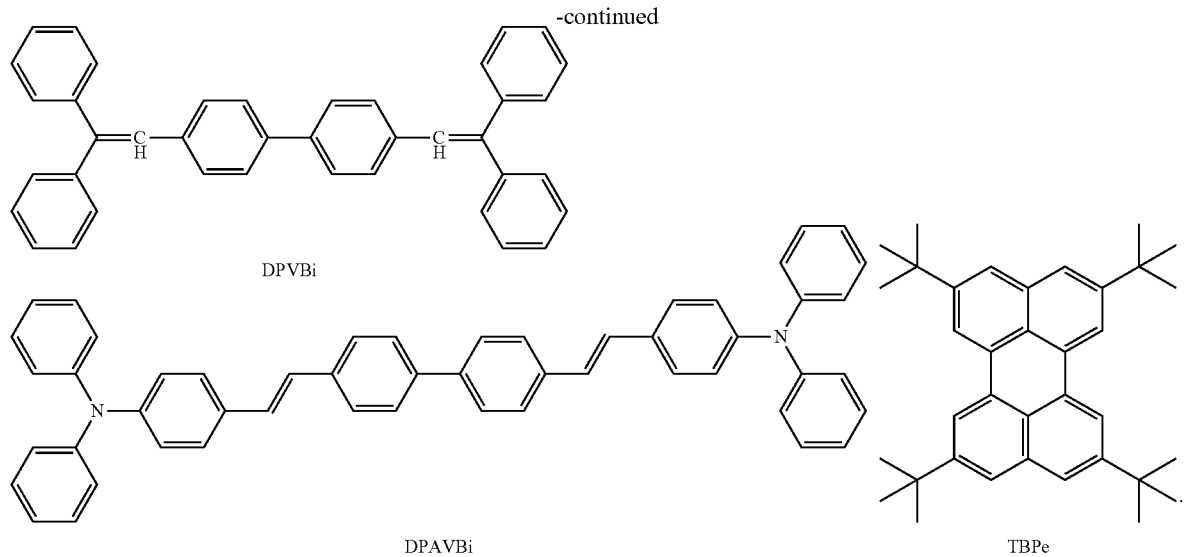
DPAVBi
TBPe
For example, compounds illustrated below may be used as a red dopant:
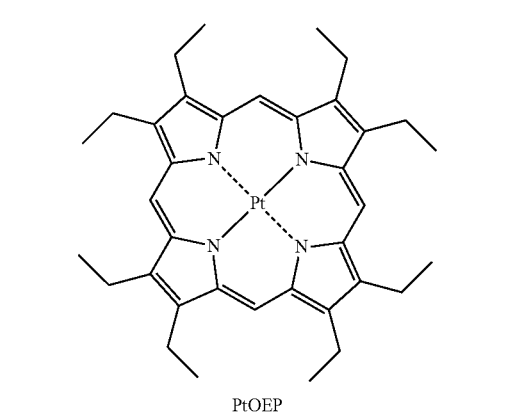
PtOEP
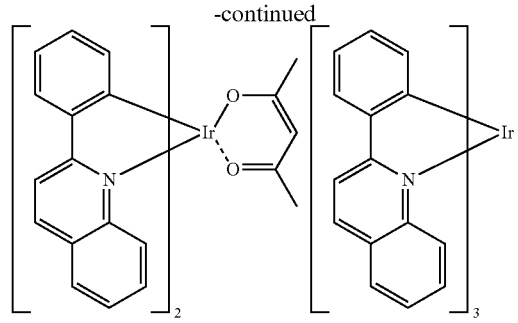
Ir(pq)$_2$(acac)  Ir(2-phq)$_3$
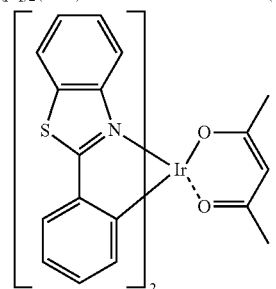
Ir(BT)$_2$(acac)
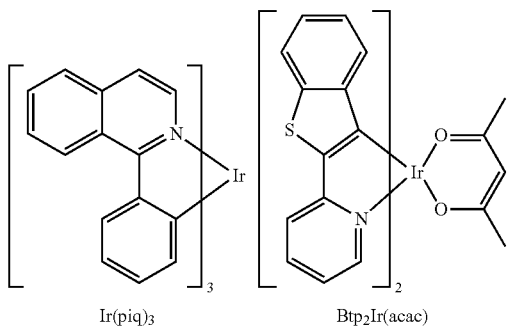
Ir(piq)$_3$  Btp$_2$Ir(acac)
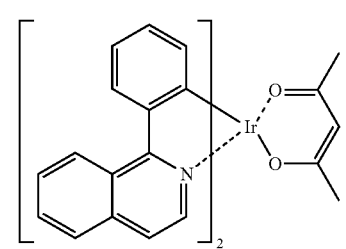
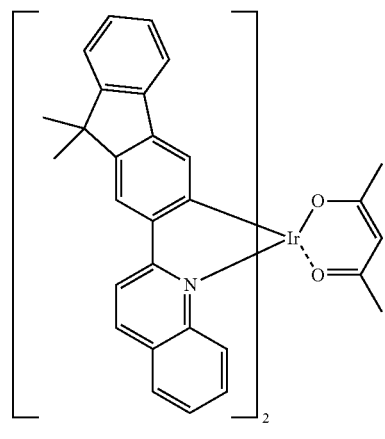
Ir(flq)$_2$(acac)

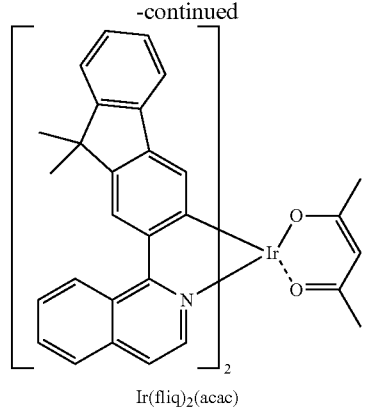
Ir(fliq)₂(acac)
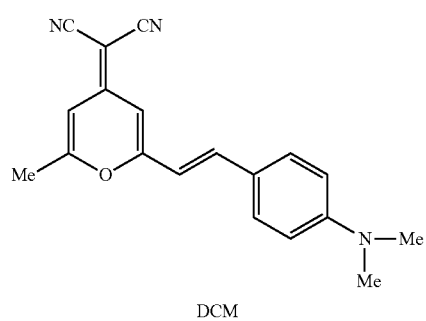
DCM
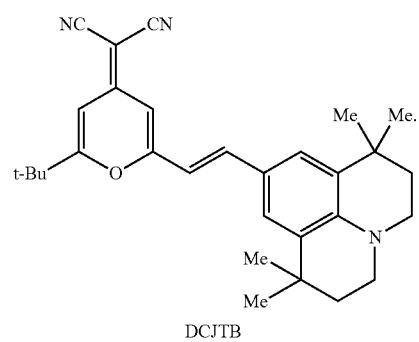
DCJTB
For example, compounds illustrated below may be used as a green dopant:
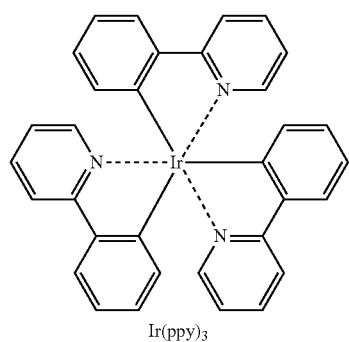
Ir(ppy)₃
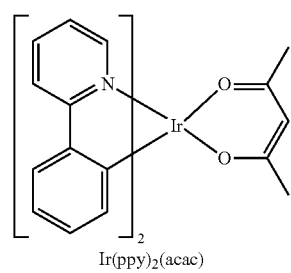
Ir(ppy)₂(acac)
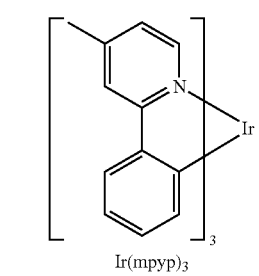
Ir(mpyp)₃
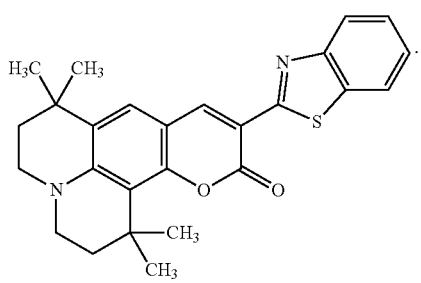
C545T
An example of the dopant included in the EML is a Pd-complex or a Pt-complex below:
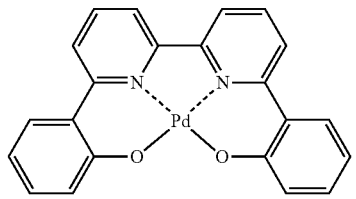
D1
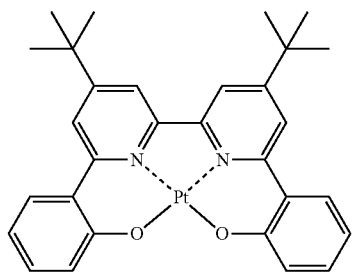
D2

-continued
D3
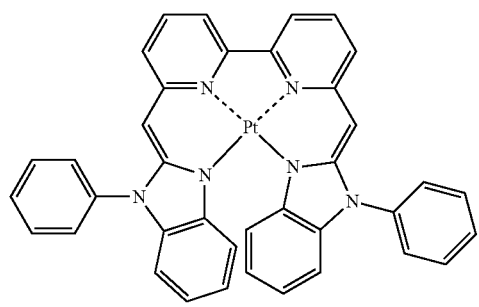
D4
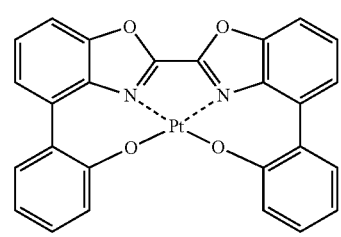
D5
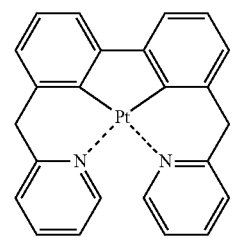
D6
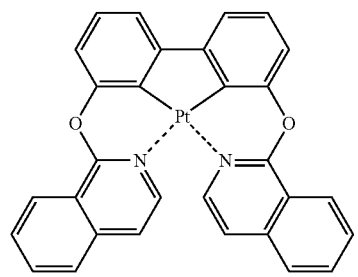
D7
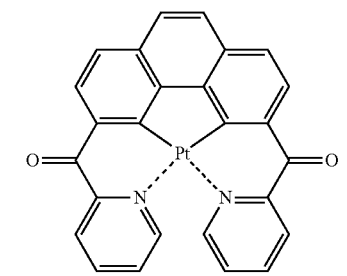
D8
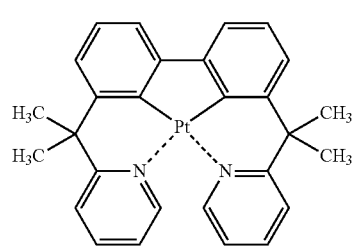
-continued
D9
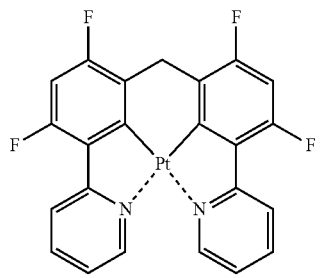
D10
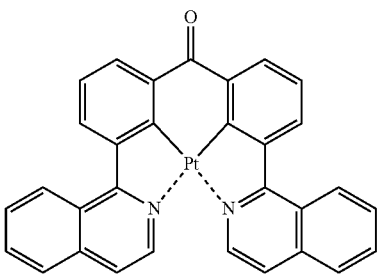
D11
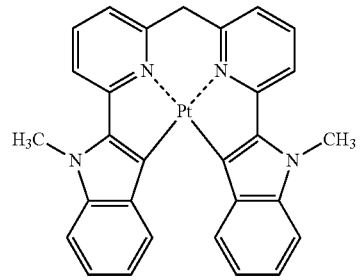
D12
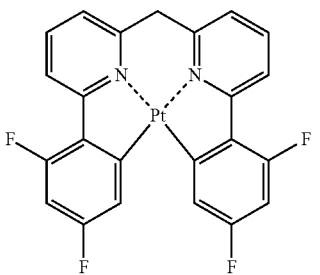
D13
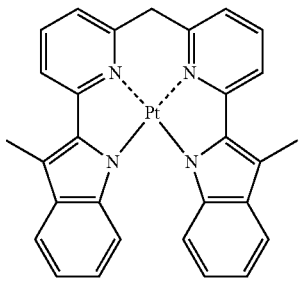

-continued
D14 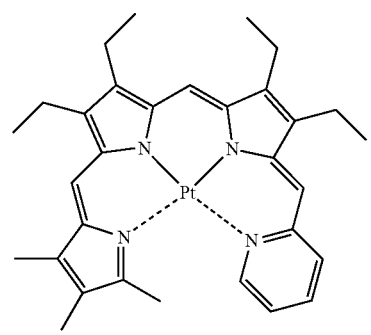
D15 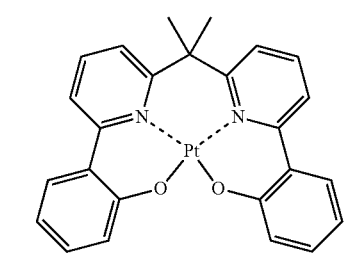
D16 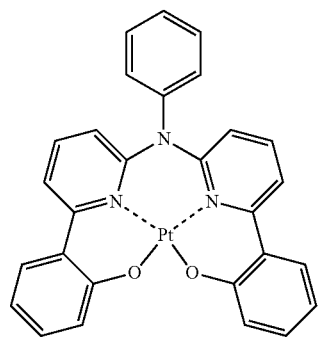
D17 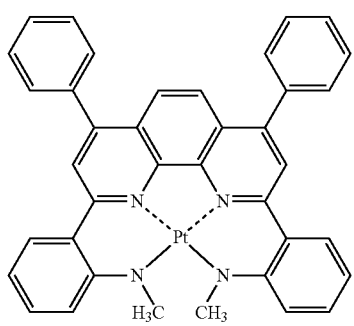
D18 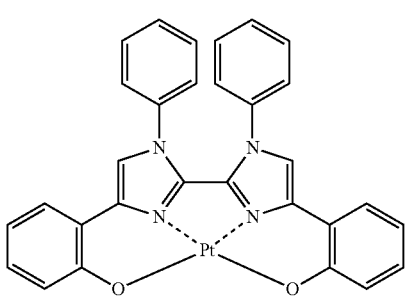
-continued
D19 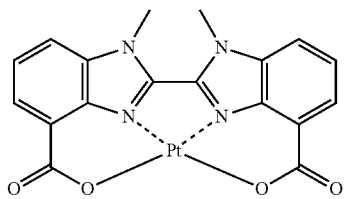
D20 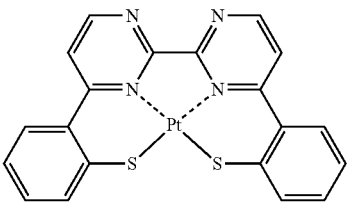
D21 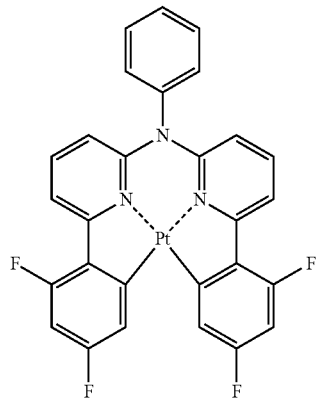
D22 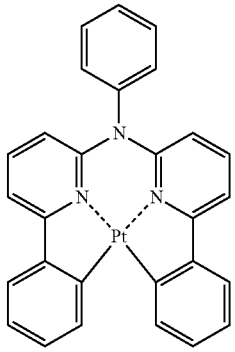
D23 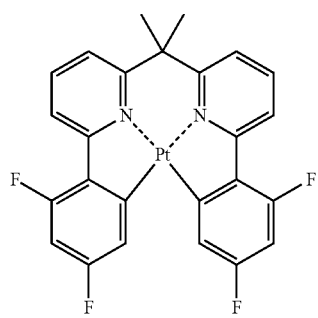

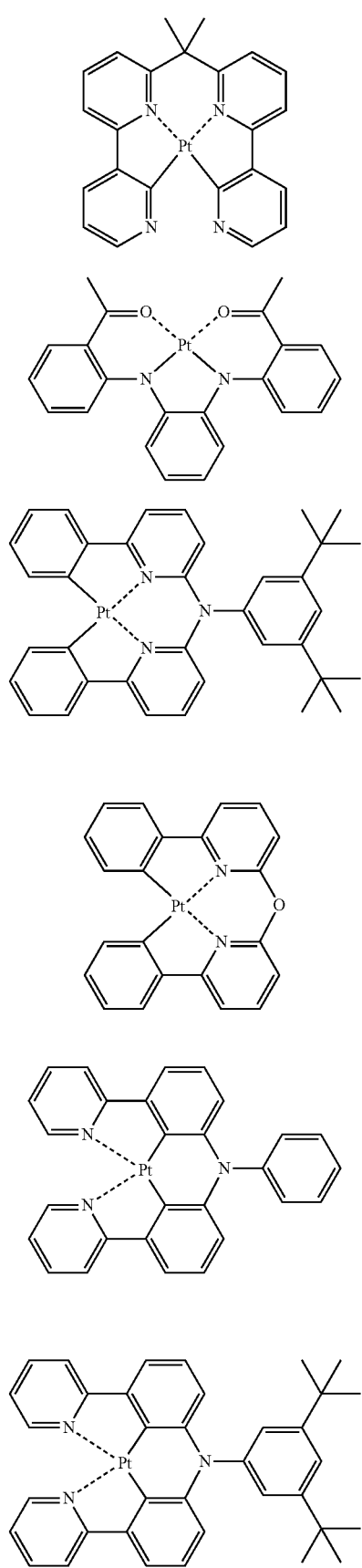
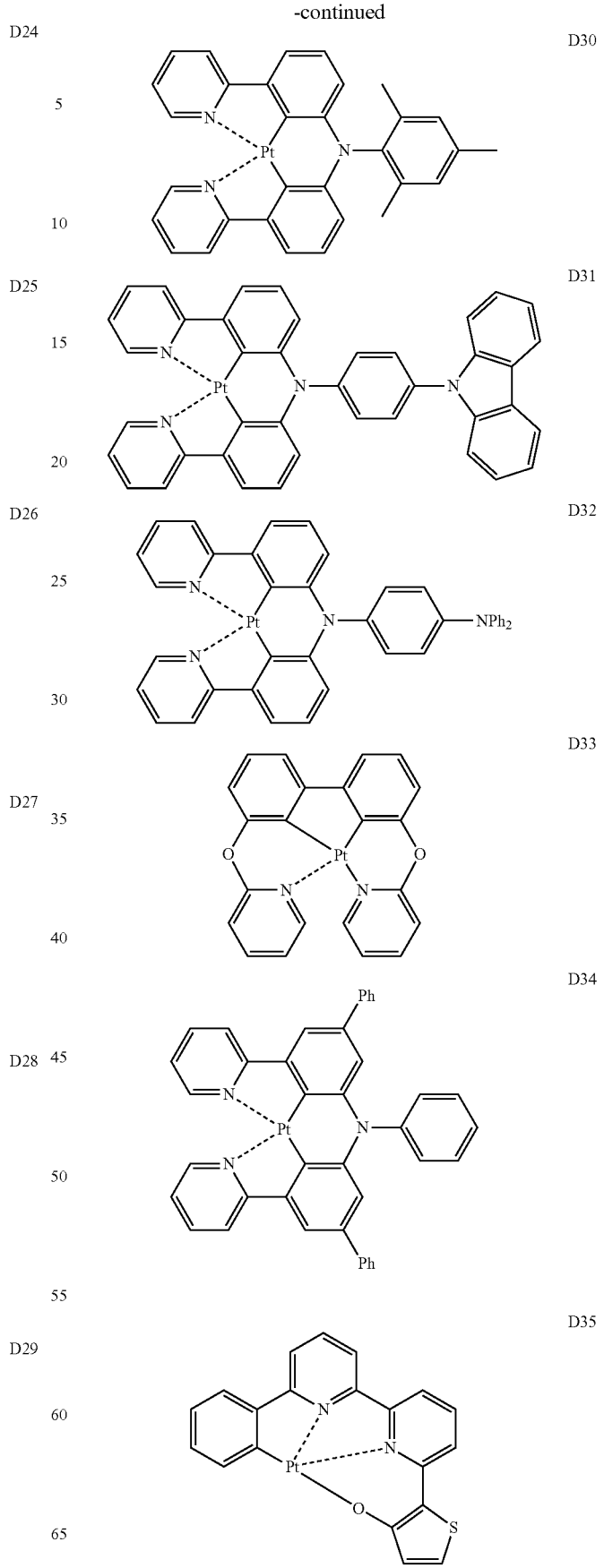

D36 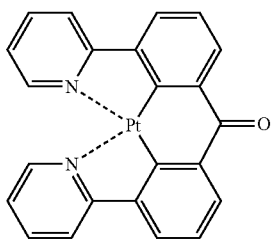
D37 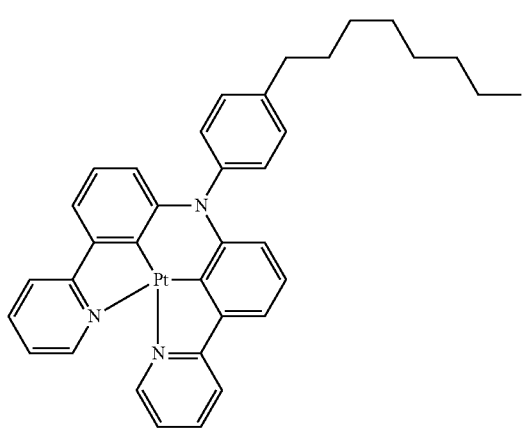
D38 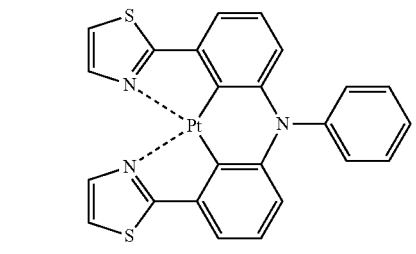
D39 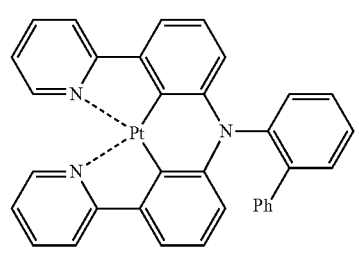
D40 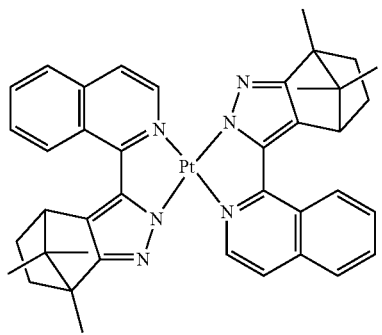
D41 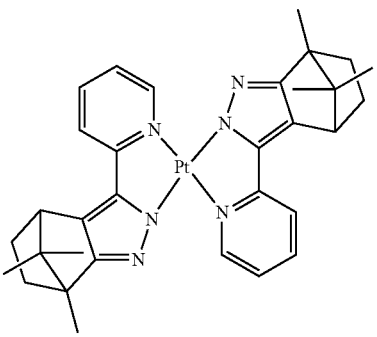
D42 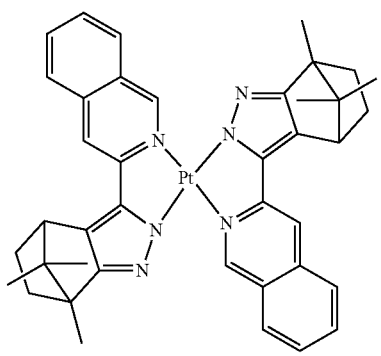
D43 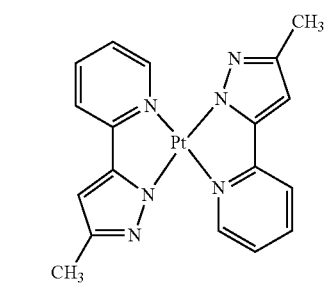
D44 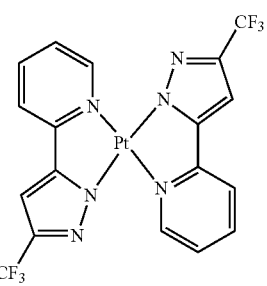
D45 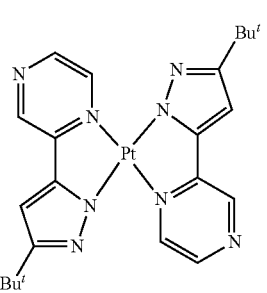

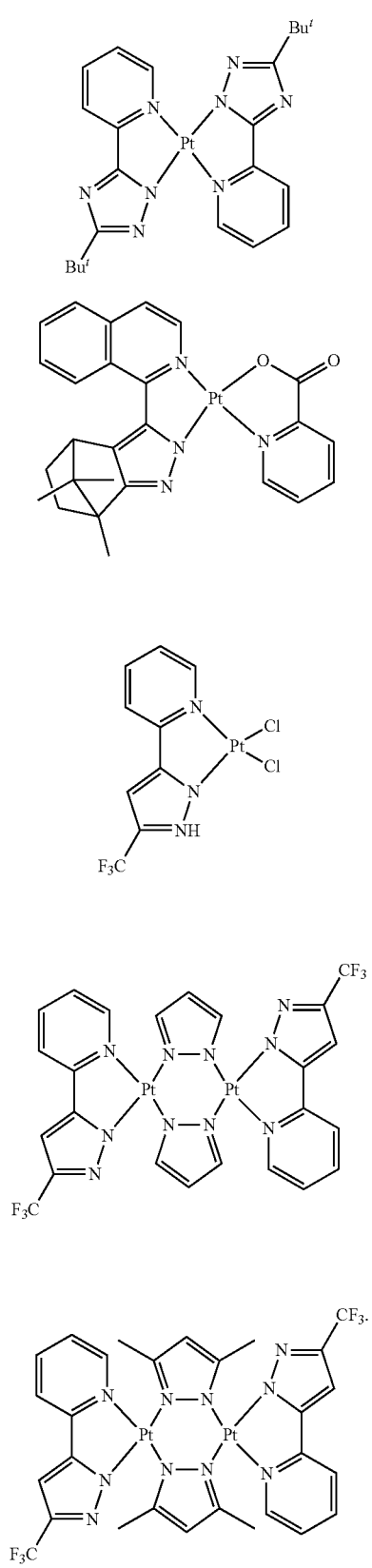

D46

D47

D48

D49

D50

An example of the dopant included in the EML is a Os-complex below:

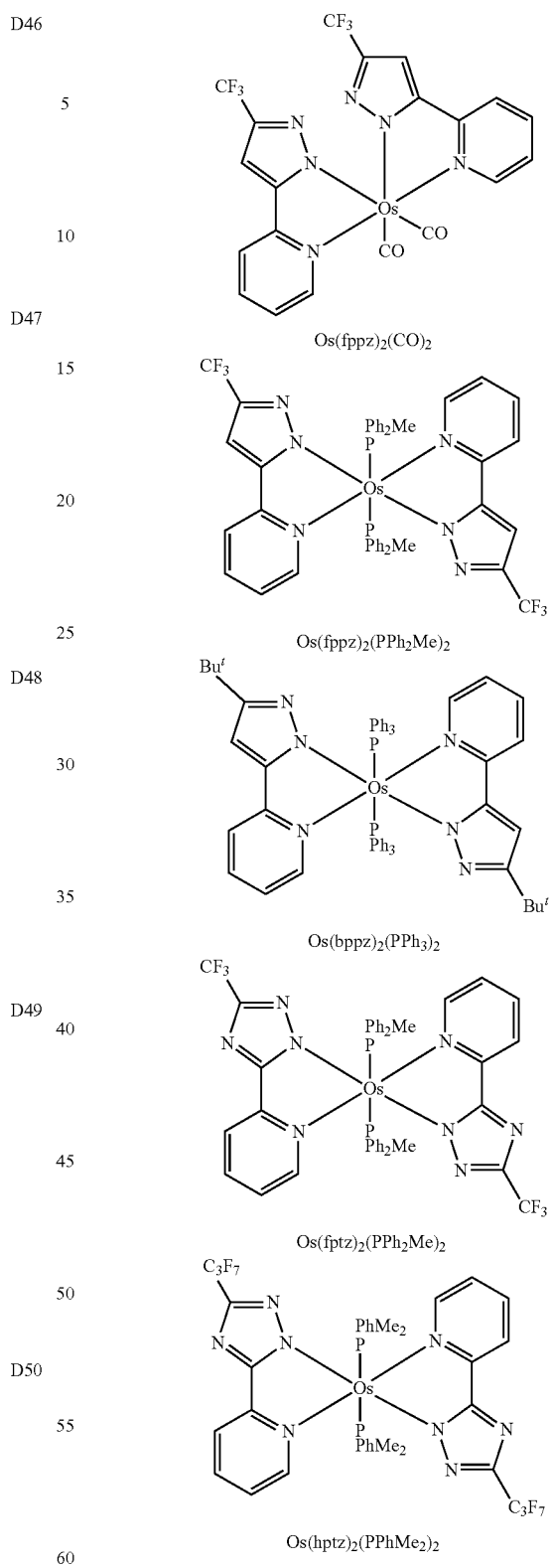

Os(fppz)₂(CO)₂

Os(fppz)₂(PPh₂Me)₂

Os(bppz)₂(PPh₃)₂

Os(fptz)₂(PPh₂Me)₂

Os(hptz)₂(PPhMe₂)₂

When the EML includes a host and a dopant, an amount of the dopant may be from about 0.01 to about 15 parts by weight based on about 100 parts by weight of the host.

A thickness of the EML may be in a range of about 100 Å to about 1000 Å, for example, about 200 Å to about 600 Å. Maintaining the thickness of the EML within these ranges may help provide excellent luminescent characteristics without a substantial increase in driving voltage.

Next, an electron transport layer (ETL) is formed on the EML by various methods, for example, by vacuum deposition, spin coating, or casting. When the ETL is formed by vacuum deposition or spin coating, the deposition and coating conditions may be similar to those for the formation of the HIL, though the conditions for deposition and coating may vary according to the material that is used to form the ETL. A material for forming the ETL may stably transport electrons injected from an electron injection electrode (cathode). Exemplary electron transportations material include a quinoline derivative, such as tris(8-quinolinorate)aluminum ($Alq_3$), TAZ, BAlq, beryllium bis(benzoquinolin-10-olate) ($Bebq_2$), ADN, Compound 201, Compound 202, and BCP:

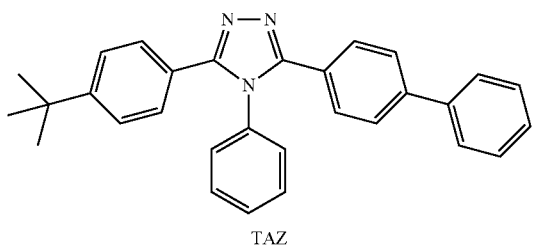

TAZ

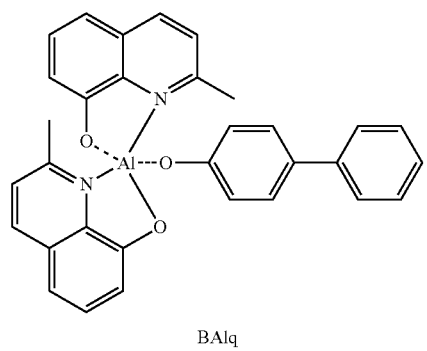

BAlq

<Compound 201>

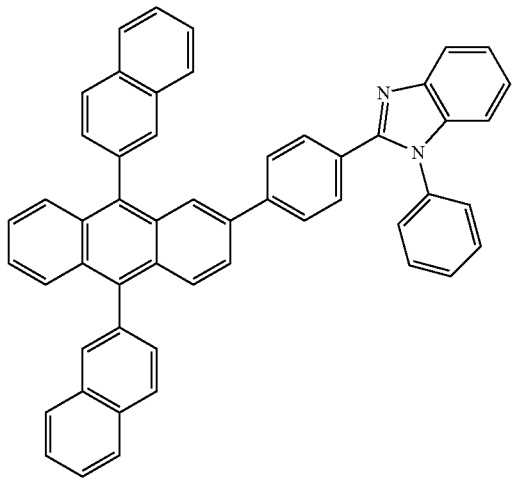

<Compound 202>

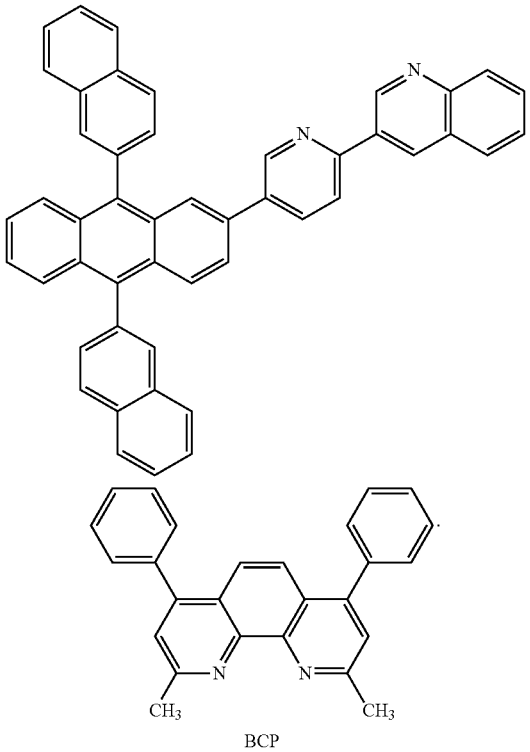

BCP

A thickness of the ETL may be in a range of about 100 Å to about 1000 Å, for example, about 150 Å to about 500 Å. Maintaining the thickness of the ETL within the range described above may help provide the ETL with satisfactory electron transportation characteristics without a substantial increase in driving voltage.

The ETL may include, in addition to an electron transportation organic compound, a metal-containing material.

The metal-containing material may include a Li complex. Examples of the Li complex include lithium quinolate (LiQ) and Compound 203 below:

<Compound 203>

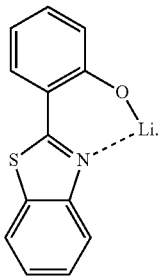

Then, an electron injection layer (EIL), which facilitates injection of electrons from the cathode, may be formed on the ETL. Any suitable electron-injecting material may be used to form the EIL.

Exemplary materials for forming the EIL include Lif, NaCl, CsF, $Li_2O$, and BaO. The deposition conditions of the EIL may be similar to those used to form the HIL, although the deposition conditions may vary according to the material that is used to form the EIL.

A thickness of the EIL may be in a range of about 1 Å to about 100 Å, for example, about 3 Å to about 90 Å. Maintaining the thickness of the EIL within the ranges described above may help provide the EIL with satisfactory electron transportation characteristics without a substantial increase in a driving voltage.

The second electrode may be disposed on the organic layer. The second electrode may be a cathode, which is an electron injection electrode. A material for forming the second electrode may be a metal, an alloy, an electrically conductive compound, each having a low-work function, or a mixture thereof. For example, lithium (Li), magnesium (Mg), aluminum (Al), aluminum-lithium (Al—Li), calcium (Ca), magnesium-indium (Mg—In), or magnesium-silver (Mg—Ag) may be formed as a thin film for use as a transmissive electrode. In some embodiments, to manufacture a top-emission light-emitting device, indium tin oxide (ITO) or indium zinc oxide (IZO) may be used to form a transmissive electrode.

Hereinbefore, the organic light-emitting device has been described with reference to FIG. 1. Additional embodiments include omission of one or more of the layers illustrated in FIG. 1 (i.e., EIL, ETL, EML, HTL, and HIL), rearrangement of one or more of the layers illustrated in FIG. 1, and/or additional layers.

When the EML includes a phosphorescent dopant, a hole blocking layer (HBL) may be formed between the ETL and the EML or between the E-functional layer and the EML by, for example, vacuum deposition, spin coating, casting, or LB deposition, so as to prevent diffusion of triplet excitons or holes into the ETL. When the HBL is formed by vacuum deposition or spin coating, the deposition or coating conditions may be similar to those applied to form the HIL, although the deposition or coating conditions may vary according to the material that is used to form the HBL. Exemplary hole blocking materials include an oxadiazole derivative, a triazole derivative, and a phenanthroline derivative. For example, BCP illustrated below may be used as the hole blocking material.

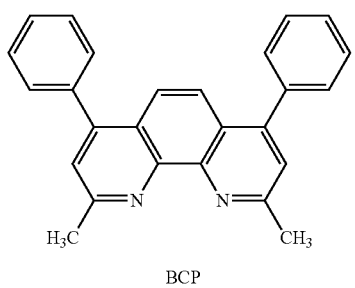 [SMILES: Cc1cc(-c2ccccc2)c2ccc3c(-c4ccccc4)cc(C)nc3c2n1 ; "BCP"]

BCP

A thickness of the HBL may be in a range of about 20 Å to about 1000 Å, for example, about 30 Å to about 300 Å. Maintaining a thickness of the HBL within the ranges described above may help provide excellent hole blocking properties without a substantial increase in driving voltage.

An organic light-emitting device according to an embodiment may be used in various flat panel display apparatuses, such as a passive matrix organic light-emitting display apparatus or an active matrix organic light-emitting display apparatus. For example, when the organic light-emitting device is included in an active matrix organic light-emitting display apparatus, the first electrode disposed on a substrate functions as a pixel and may be electrically connected to a source electrode or a drain electrode of a thin film transistor. In addition, the organic light-emitting device may be included in a flat panel display apparatus that emits light in opposite directions.

The organic layer of an organic light-emitting device according to an embodiment may be formed by depositing a compound according to an embodiment, or by coating a compound according to an embodiment prepared as a solution. The latter method is a wet method.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis of Compound 1

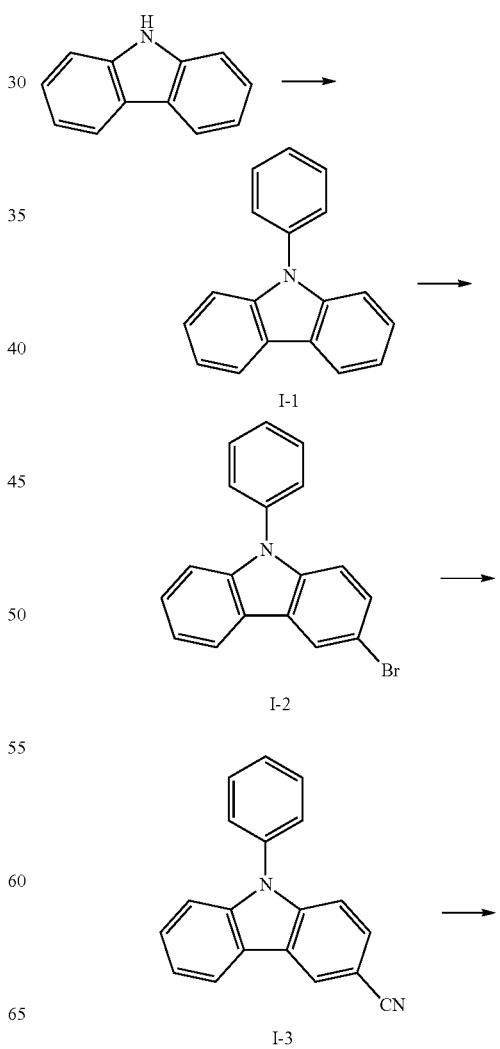

-continued

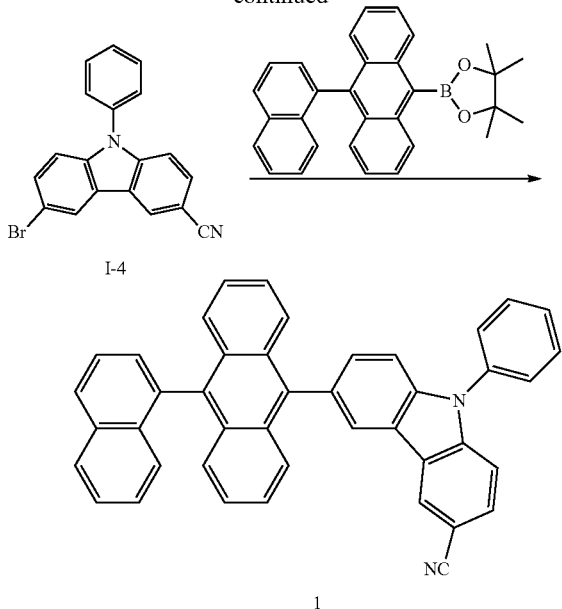

I-4

1

1) Synthesis of Intermediate I-1

5.02 g (30 mmol) of 9H-carbazole, 4.71 g (30 mmol) of bromobenzene, 1.14 g (18 mmol) of copper power, and 6.22 g (45 mmol) of $K_2CO_3$ were dissolved in 80 mL of o-dichlorobenzene, and then, stirred at a temperature of 180° C. for 24 hours. The reaction solution was cooled to room temperature, and then 60 mL of water was added thereto, and extracted three times with 50 mL of ethylacetate. A collected organic layer was dried by using magnesium sulfate and the residual obtained by evaporating a solvent therefrom was separation-purified by silica gel column chromatography to obtain 5.47 g of Intermediate I-1 (yield 75%). The obtained compound was identified by LC-MS. $C_{18}H_{13}N$: $M^+$ 243.10

2) Synthesis of Intermediate I-2

5.47 g (22.5 mmol) of Intermediate I-1 was completely dissolved in 80 mL of $CH_2Cl_2$ and then, 4.00 g (22.5 mmol) of N-bromosuccinimide was added thereto, and the resultant mixture was stirred at room temperature for 12 hours. 60 mL of water was added to the reaction solution and then the resultant solution was extracted three time with 50 mL of $CH_2Cl_2$. A collected organic layer was dried by using magnesium sulfate and then, a solvent was evaporated therefrom and then recrystallization was performed thereon by using methanol to obtain 6.16 g of Intermediate I-2 (yield 85%). The obtained compound was identified by LC-MS. $C_{18}H_{12}BrN$: $M^+$ 321.0

3) Synthesis of Intermediate I-3

6.16 g (19.1 mmol) of Intermediate I-2 and 2.57 g (28.7 mmol) of CuCN were dissolved in 70 mL of DMF, and then, at a temperature of 150° C., the mixture was stirred for 24 hours. The reaction solution was cooled to room temperature and then, 60 mL of ammonia water and 60 mL of water were added thereto and the resultant solution was extracted three times with 50 mL of $CH_2Cl_2$. A collected organic layer was dried by using magnesium sulfate and the residual obtained by evaporating a solvent therefrom was separation-purified by silica gel column chromatography to obtain 4.71 g of Intermediate I-3 (yield 92%. The obtained compound was identified by LC-MS. $C_{19}H_{12}N_2$: $M^+$ 268.1

4) Synthesis of Intermediate I-4

4.71 g (17.6 mmol) of Intermediate I-3 was completely dissolved in 80 mL of $CH_2Cl_2$ and then, 3.13 g (17.6 mmol) of N-bromosuccinimide was added thereto, and the resultant mixture was stirred at room temperature for 8 hours. 60 mL of water was added to the reaction solution and then the resultant solution was extracted three time with 50 mL of $CH_2Cl_2$. A collected organic layer was dried by using magnesium sulfate and then, a solvent was evaporated therefrom and then recrystallization was performed thereon by using methanol to obtain 5.81 g of Intermediate I-4 (yield 95%). The obtained compound was identified by LC-MS. $C_{19}H_{11}BrN_2$: $M^+$ 346.0

5) Synthesis of Compound 1

4.30 g (10.0 mmol) of 4,4,5,5-tetramethyl-2-(10-naphthalene-1-yl-anthracene-9-yl)-[1,3,2]dioxaborolane, 3.47 g (10.0 mmol) of Intermediate I-4, 0.58 g (0.5 mmol) of $Pd(PPh_3)_4$, and 4.15 g (30.0 mmol) of $K_2CO_3$ were dissolved in 60 mL of THF and 30 mL of $H_2O$, and then, the mixture was stirred at a temperature of 80° C. for 12 hours. The reaction solution was cooled to room temperature, and then, extracted three times with 30 mL of water and 30 mL of ethylacetate. A collected organic layer was dried by using magnesium sulfate, and then the residual obtained by evaporating the solvent was separation-purified by using silica gel column chromatography to obtain 4.11 g of Compound 1 (yield 72%). The produced compound was identified by MS/FAB and NMR. $C_{43}H_{26}N_2$ cal. 570.21, found 570.22

Synthesis of Compound 3

3.89 g of Compound 3 (yield 68%) was prepared in the same manner as used to synthesize Compound 1, except that in synthesizing Intermediate I-1, 2-bromopyridine was used instead of bromobenzene. The produced compound was identified by MS/FAB and $^1$H NMR. $C_{42}H_{25}N_3$ cal. 571.20, found 571.21

Synthesis of Compound 9

5.07 g of Compound 9 (yield 70%) was prepared in the same manner as used to synthesize Compound 1, except that in synthesizing Intermediate I-1, 1-bromo-3,5-dipyridi-3-yl-benzene was used instead of bromobenzene. The produced compound was identified by MS/FAB and $^1$HNMR. $C_{53}H_{32}N_4$ cal. 724.26, found 724.25

Synthesis of Compound 14

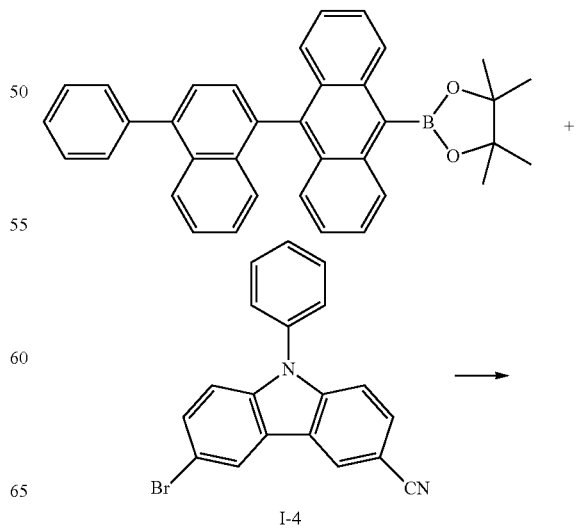

I-4

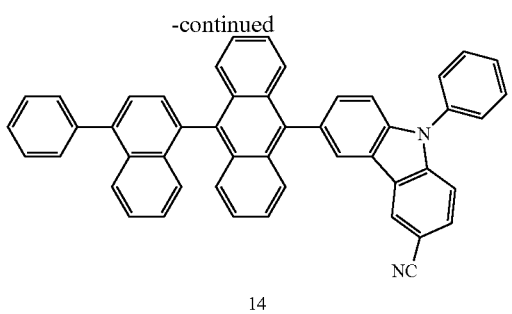

14

4.85 g of Compound 14 (yield 75%) was prepared in the same manner as used to synthesize Compound 1, except that 4,4,5,5-tetramethyl-2-[10-(4-phenyl-naphthalene-1-yl)-anthracene-9-yl]-[1,3,2]dioxaborolane was used instead of 4,4,5,5-tetramethyl-2-(10-naphthalene-1-yl-anthracene-9-yl)-[1,3,2]dioxaborolane. The produced compound was identified by MS/FAB and $^1$H NMR. $C_{49}H_{30}N_2$ cal. 646.24, found 646.23

Synthesis of Compound 19

1) Synthesis of Intermediate I-5

8.78 g of Intermediate I-5 (yield 73%) was prepared in the same manner as used to synthesize Intermediate I-1, except that in synthesizing Intermediate I-1, 2,7-dibromo-9H-carbazole was used instead of 9H-carbazole. The obtained compound was identified by LC-MS. $C_{18}H_{11}Br_2N$: $M^+$ 398.9

2) Synthesis of Intermediate I-6

3.57 g of Intermediate I-6 (yield 47%) was prepared in the same manner as used to synthesize Intermediate I-3, except that in synthesizing Intermediate I-3, Intermediate I-5 was used instead of Intermediate I-2. The obtained compound was identified by LC-MS. $C_{19}H_{11}BrN_2$: $M^+$ 346.0

3) Synthesis of Compound 19

3.88 g of Compound 19 (yield 68%) was prepared in the same manner as used to synthesize Compound 1, except that in synthesizing Compound 1, Intermediate I-6 was used instead of Intermediate I-4. The produced compound was identified by MS/FAB and $^1$H NMR. $C_{43}H_{26}N_2$ cal. 570.21, found 570.18

Synthesis of Compound 20

4.00 g of Compound 20 (yield 70%) was prepared in the same manner as used to synthesize Compound 19, except that in synthesizing Intermediate I-5, 3-bromopyridine was used instead of bromobenzene. The produced compound was identified by MS/FAB and $^1$H NMR. $C_{42}H_{25}N_3$ cal. 571.20, found 571.22

Synthesis of Compound 23

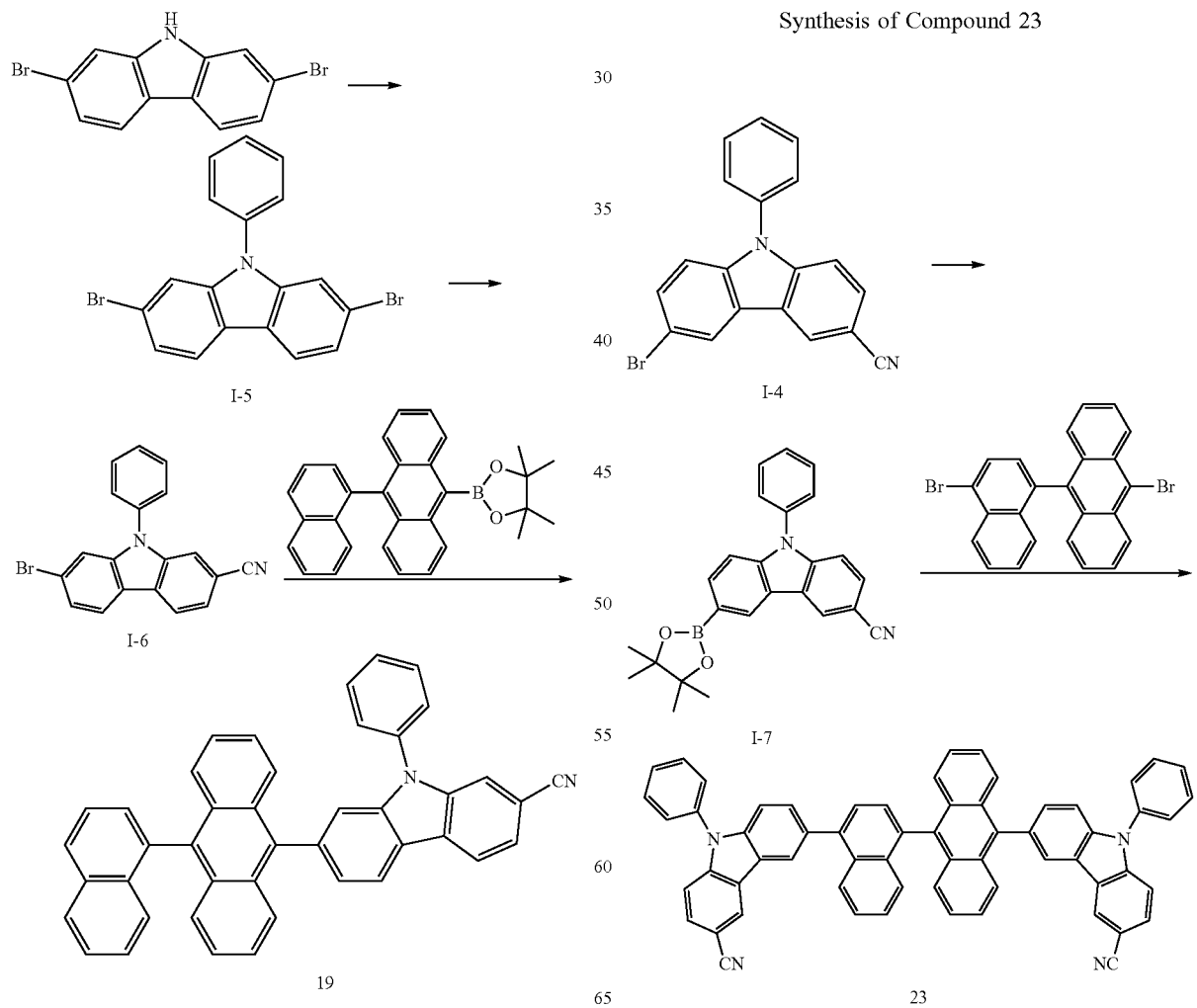

1) Synthesis of Intermediate I-7

5.0 g (14.4 mmol) of Intermediate I-4, 4.02 g (15.8 mmol) of bis-(pinacolato)diboron, 4.24 g (43.2 mmol) of KOAc, and 0.35 g (0.43 mmol) of palladium(diphenylphosphino-ferrocene)chloride were placed in 250 mL flask, and then dissolved in 80 mL of DMSO, and then, the mixture was refluxed at a temperature of 80° C. for 12 hours. The reaction solution was cooled to room temperature, and then 50 mL of distilled water was added thereto, and the resultant solution was extracted three times with methylenechloride (50 mL×3). A collected organic layer was dried by using magnesium sulfate and then, the residual obtained by evaporating a solvent therefrom was washed with ethanol and dried to obtain 4.88 g of Intermediate I-7 (yield 86%). The obtained compound was identified by LC-MS. $C_{25}H_{23}BN_2O_2$: $M^+$ 394.2

2) Synthesis of Compound 23

2.77 g (6.0 mmol) of 9-bromo-10-(4-bromo-naphthalene-1-yl)-anthracene, 4.73 g (12.0 mmol) of Intermediate I-7, 0.35 g (0.3 mmol) of Pd(PPh$_3$)$_4$, and 2.49 g (18.0 mmol) of K$_2$CO$_3$ were dissolved in 60 mL of THF and 30 mL of H$_2$O, and then, the mixture was stirred at a temperature of 80° C. for 12 hours. The reaction solution was cooled to room temperature, and then, extracted three times with 30 mL of water and 30 mL of ethylacetate. A collected organic layer was dried by using magnesium sulfate, and then the residual obtained by evaporating the solvent was separation-purified by using silica gel column chromatography to obtain 2.61 g of Compound 1 (yield 52%). The produced compound was identified by MS/FAB and $^1$H NMR. $C_{62}H_{36}N_4$ cal. 836.29, found 836.31

Synthesis of Compound 28

4.90 g of Compound 28 (yield 73%) was prepared in the same manner as used to synthesize Compound 1, except that in synthesizing Intermediate I-1, 8-bromo-quinoline was used instead of bromobenzene, and in synthesizing Compound 1, 2-[9,9']-bianthracenyl-10-yl-4,45,5-tetramethyl-[1,3,2]dioxaborolane was used instead of 4,4,5,5-tetramethyl-2-(10-naphthalene-1-yl-anthracene-9-yl)-[1,3,2] dioxaborolane. The produced compound was identified by MS/FAB and $^1$H NMR. $C_{50}H_{29}N_3$ cal. 671.24, found 671.22

Synthesis of Compound 33

4.27 g of Compound 33 (yield 57%) was prepared in the same manner as used to synthesize Compound 1, except that in synthesizing Intermediate I-1, 2-bromo-quinoline was used instead of bromobenzene, and in synthesizing Compound 1, 3-[10'-(4,4,5,5-tetramethyl-[1,3,2]dioxaborolane-2-yl)-[9,9']bianthracenyl-10-yl]pyridine was used instead of 4,4,5,5-tetramethyl-2-(10-naphthalene-1-yl-anthracene-9-yl)-[1,3,2]dioxaborolane. The produced compound was identified by MS/FAB and $^1$H NMR. $C_{55}H_{32}N_4$ cal. 748.26. found 748.25

Synthesis of Compound 41

3.71 g of Compound 41 (yield 68%) was prepared in the same manner as used to synthesize Compound 1, except that in synthesizing Intermediate I-1, 4-bromo-benzonitrile was used instead of bromobenzene, and in synthesizing Compound 1, 2-[1,1']-binaphthalenyl-4-yl-4,4,5,5-tetramethyl-[1,3,2]dioxaborolane was used instead of 4,4,5,5-tetramethyl-2-(10-naphthalene-1-yl-anthracene-9-yl)-[1,3,2] dioxaborolane. The produced compound was identified by MS/FAB and NMR. $C_{40}H_{23}N_3$ cal. 545.19, found 545.20

Synthesis of Compound 48

3.43 g of Compound 48 (yield 53%) was prepared in the same manner as used to synthesize Compound 1, except that in synthesizing Intermediate I-1, 2-bromo-quinoline was used instead of bromobenzene, and in synthesizing Compound 1, 3-[4'-(4,4,5,5-tetramethyl-[1,3,2]dioxaborolane-2-yl)-[1,1']binaphthalenyl-4-yl]pyridine was used instead of 4,4,5,5-tetramethyl-2-(4-naphthalene-1-yl-anthracene-9-yl)-[1,3,2]dioxaborolane. The produced compound was identified by MS/FAB and $^1$H NMR. $C_{47}H_{28}N_4$ cal. 648.23, found 648.22

Additional compounds were synthesized by using the same synthesis method as described above and appropriate intermediate materials, and $^1$H NMR and MS/FAB results of the synthetic compounds are shown in Table 1 below.

Methods of synthesizing compounds other than the compound shown in Table 1 are obvious to one of skill in the art by referring to the synthesis path and source materials described above.

TABLE 1

| Compound | $^1$H NMR (CDCl$_3$, 400 MHz) | MS/FAB found | MS/FAB calc. |
|---|---|---|---|
| 1 | 8.43 (d, 1H), 8.33 (d, 1H), 8.07 (d, 1H), 8.01 (d, 1H), 7.77 (d, 2H), 7.75-7.57 (m, 11H), 7.51-7.46 (m, 4H), 7.31-7.20 (m, 5H) | 570.22 | 570.21 |
| 3 | 8.45 (d, 1H), 8.34 (d, 1H), 8.09 (d, 1H), 7.89 (d, 1H), 7.84-7.81 (m, 4H), 7.72-7.48 (m, 9H), 7.40-7.27 (m, 8H) | 571.21 | 571.20 |
| 9 | 8.55 (d, 2H), 8.43 (d, 2H), 8.26 (d, 1H), 8.02 (d, 1H), 7.98 (d, 2H), 7.84-7.79 (m, 4H), 7.74-7.52 (m, 9H), 7.50-7.47 (m, 4H), 7.40-7.27 (m, 7H) | 724.25 | 724.26 |
| 14 | 8.45 (d, 1H), 8.25 (d, 1H), 8.03-8.01 (m, 2H), 7.92 (d, 1H), 7.87 (d, 1H), 7.82 (d, 2H), 7.71-7.58 (m, 7H), 7.50-7.45 (m, 6H), 7.40-7.25 (m, 9H) | 646.23 | 646.24 |
| 17 | 8.42 (d, 1H), 8.29 (d, 1H), 8.23 (d, 1H), 8.20 (d, 1H), 7.94 (d, 1H), 7.88-7.76 (m, 5H), 7.69 (d, 2H), 7.63 (d, 1H), 7.59 (d, 1H), 7.53-7.46 (m, 4H), 7.40-7.25 (m, 7H) | 595.23 | 595.20 |
| 19 | 8.03 (d, 1H), 8.00 (d, 2H), 7.93 (d, 2H), 7.84-7.81 (m, 3H), 7.70-7.67 (m, 3H), 7.59 (d, 1H), 7.55-7.43 (m, 6H), 7.40-7.27 (m, 9H) | 570.18 | 570.21 |

TABLE 1-continued

| Compound | $^1$H NMR (CDCl$_3$, 400 MHz) | MS/FAB found | MS/FAB calc. |
|---|---|---|---|
| 20 | 8.56 (d, 1H), 8.38 (d, 1H), 8.09 (d, 1H), 8.01 (d, 1H), 7.95 (d, 1H), 7.82 (d, 2H), 7.77-7.70 (m, 4H), 7.62-7.57 (m, 4H), 7.45-7.29 (m, 10H) | 571.22 | 571.20 |
| 23 | 8.45 (d, 1H), 8.29-8.26 (m, 3H), 8.03 (d, 1H), 7.88-7.79 (m, 5H), 7.70-7.59 (m, 8H), 7.52-7.46 (m, 8H), 7.40-7.25 (m, 10H) | 836.31 | 836.29 |
| 28 | 8.48 (d, 1H), 8.35 (d, 1H), 8.18 (d, 1H), 8.05 (d, 2H), 7.86-7.80 (m, 4H), 7.74-7.65 (m, 5H), 7.57 (d, 1H), 7.42-7.26 (m, 13H) | 671.22 | 671.24 |
| 33 | 8.68 (d, 2H), 8.41 (d, 2H), 8.12 (d, 1H), 8.05 (d, 1H), 7.91 (d, 1H), 7.85-7.73 (m, 6H), 7.69-7.50 (m, 9H), 7.47-7.23 (m, 10H) | 748.25 | 748.26 |
| 35 | 8.42 (d, 1H), 8.21 (d, 2H), 8.25 (dd, 1H), 8.19 (d, 2H), 7.93 (d, 2H), 7.87 (d, 1H), 7.81-7.76 (m, 4H), 7.63 (d, 1H), 7.59 (d, 1H), 7.53-7.46 (m, 4H), 7.42-7.30 (m, 8H) | 645.20 | 645.22 |
| 41 | 8.30 (d, 2H), 7.87-7.80 (m, 4H), 7.74-7.58 (m, 8H), 7.53-7.51 (m, 2H), 7.47-7.25 (m, 7H) | 545.20 | 545.19 |
| 42 | 8.53 (d, 1H), 8.17 (d, 2H), 7.98 (d, 1H), 7.85-7.80 (m, 4H), 7.72-7.55 (m, 8H), 7.45-7.26 (m, 7H) | 521.19 | 521.19 |
| 48 | 8.56 (d, 1H), 8.38 (d, 1H), 8.29 (d, 2H), 8.06 (d, 1H), 7.90 (d, 1H), 7.87 (d, 1H), 7.79-7.63 (m, 13H), 7.57-7.36 (m, 8H) | 648.22 | 648.23 |

Example 1

An anode was manufactured as follows: a Corning 15 Ω/cm$^2$ (1200 Å) ITO glass substrate was cut to a size of 50 mm×50 mm×0.7 mm, and then sonicated with isopropyl alcohol and pure water each for 5 minutes, and then washed by irradiation of ultraviolet ray for 30 minutes and ozone, and the resultant glass substrate was provided to a vacuum deposition apparatus.

2-TNATA was vacuum deposited on the substrate to form a HIL having a thickness of 600 Å, and then, 4,4'-bis[N-(1-naphthyl)-N-phenylamino]biphenyl (NPB) was vacuum deposited thereon to form a HTL having a thickness of 300 Å.

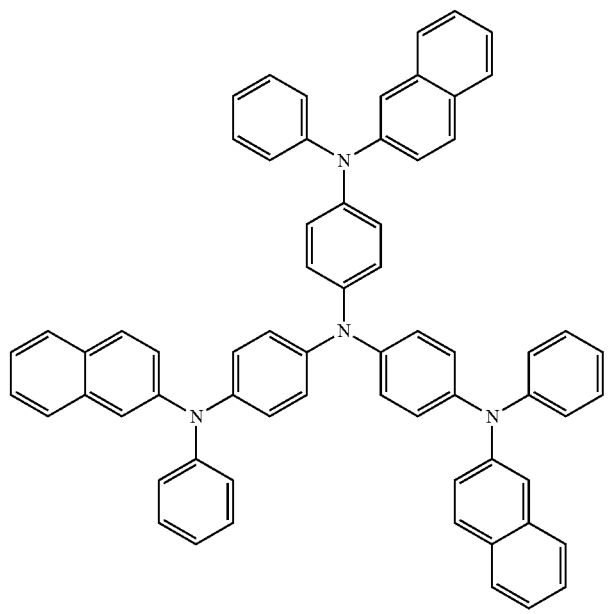

2-TNATA

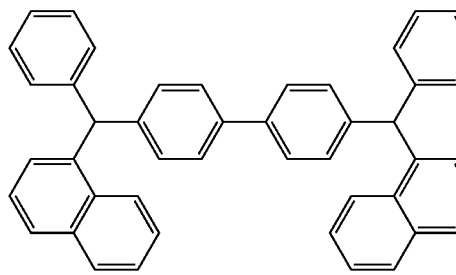

NPB

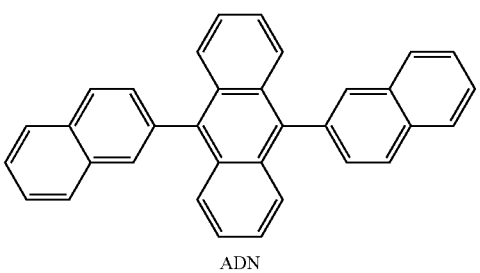

ADN

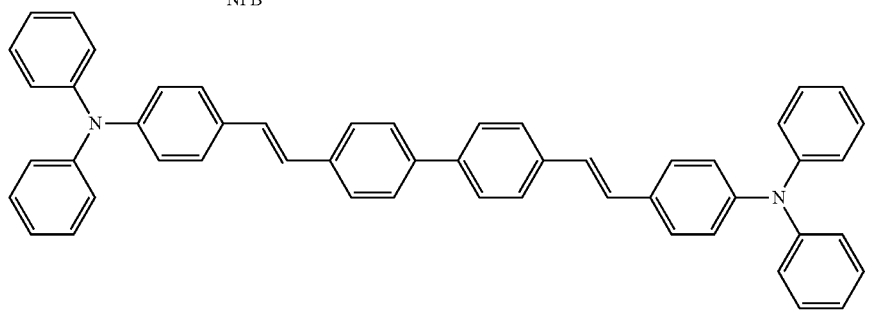

DPAVBI

On the HTL, 9,10-di-naphthalene-2-yl-anthracene (ADN), which is a blue fluorescent host, and 4,4'-bis[2-(4-(N,N-diphenylamino)phenyl)vinyl]biphenyl (DPAVBi), which is a blue fluorescent dopant, were co-deposited at a weight ratio of 98:2 to form an EML a thickness of 300 Å.

Subsequently, Compound 1 according to an embodiment was deposited on the

EML to form an ETL having a thickness of 300 Å, and then, Lif, which is a halogenated alkali metal, was deposited on the ETL to form an EIL having a thickness of 10 Å, and Al was vacuum deposited to form a cathode having a thickness of 3,000 Å to form a Lif/Al electrode, thereby completing manufacturing of an organic electroluminescent light-emitting device.

The manufactured organic light-emitting device had, at a current density of 50 mA/cm$^2$, a driving voltage of 4.65 V, and at a luminescent brightness of 3,670 cd/m$^2$, a luminescent efficiency of 7.85 cd/A.

Example 2

An organic light-emitting device was manufactured in the same manner as in Example 1, except that in forming the ETL, Compound 3 was used instead of Compound 1.

The manufactured organic light-emitting device had, at a current density of 50 mA/cm$^2$, a driving voltage of 5.10 V, and at a luminescent brightness of 3,725 cd/m$^2$, a luminescent efficiency of 7.89 cd/A.

Example 3

An organic light-emitting device was manufactured in the same manner as in Example 1, except that in forming the ETL, Compound 9 was used instead of Compound 1.

The manufactured organic light-emitting device had, at a current density of 50 mAcm$^2$, a driving voltage of 5.52 V, and at a luminescent brightness of 3,320 cd/m$^2$, a luminescent efficiency of 7.23 cd/A.

Example 4

An organic light-emitting device was manufactured in the same manner as in Example 1, except that in forming the ETL, Compound 14 was used instead of Compound 1.

The manufactured organic light-emitting device had, at a current density of 50 mA/cm$^2$, a driving voltage of 4.86 V, and at a luminescent brightness of 3,810 cd/m$^2$, a luminescent efficiency of 7.76 cd/A.

Example 5

An organic light-emitting device was manufactured in the same manner as in Example 1, except that in forming the ETL, Compound 20 was used instead of Compound 1.

The manufactured organic light-emitting device had, at a current density of 50 mA/cm$^2$, a driving voltage of 5.23 V, and at a luminescent brightness of 3,470 cd/m$^2$, a luminescent efficiency of 6.92 cd/A.

Example 6

An organic light-emitting device was manufactured in the same manner as in Example 1, except that in forming the ETL, Compound 23 was used instead of Compound 1.

The manufactured organic light-emitting device had, at a current density of 50 mA/cm$^2$, a driving voltage of 5.08 V, and at a luminescent brightness of 3,635 cd/m$^2$, a luminescent efficiency of 7.28 cd/A.

Example 7

An organic light-emitting device was manufactured in the same manner as in Example 1, except that in forming the ETL, Compound 28 was used instead of Compound 1.

The manufactured organic light-emitting device had, at a current density of 50 mA/cm², a driving voltage of 5.02 V, and at a luminescent brightness of 3,795 cd/m², a luminescent efficiency of 7.87 cd/A.

Example 8

An organic light-emitting device was manufactured in the same manner as in Example 1, except that in forming the ETL, Compound 33 was used instead of Compound 1.

The manufactured organic light-emitting device had, at a current density of 50 mA/cm², a driving voltage of 5.17 V, and at a luminescent brightness of 3,560 cd/m², a luminescent efficiency of 7.13 cd/A.

Example 9

An organic light-emitting device was manufactured in the same manner as in Example 1, except that in forming the ETL, Compound 41 was used instead of Compound 1.

The manufactured organic light-emitting device had, at a current density of 50 mA/cm², a driving voltage of 5.23 V, and at a luminescent brightness of 3,480 cd/m², a luminescent efficiency of 7.20 cd/A.

Example 10

An organic light-emitting device was manufactured in the same manner as in Example 1, except that in forming the ETL, Compound 48 was used instead of Compound 1.

The manufactured organic light-emitting device had, at a current density of 50 mA/cm², a driving voltage of 5.20 V, and at a luminescent brightness of 3,540 cd/m², a luminescent efficiency of 7.46 cd/A.

Comparative Example 1

An organic light-emitting device was manufactured in the same manner as in Example 1, except that in forming the ETL, Alq$_3$ was used instead of Compound 1.

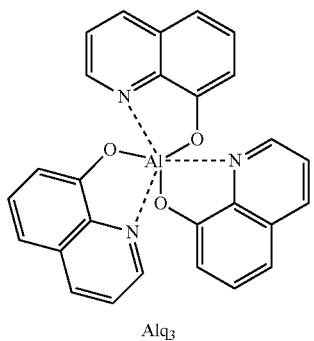

Alq$_3$

The manufactured organic light-emitting device had, at a current density of 50 mA/cm², a driving voltage of 7.35 V, and at a luminescent brightness of 2,065 cd/m², a luminescent efficiency of 4.13 cd/A.

Comparative Example 2

An organic light-emitting device was manufactured in the same manner as in Example 1, except that in forming the ETL, Compound 200 was used instead of Compound 1.

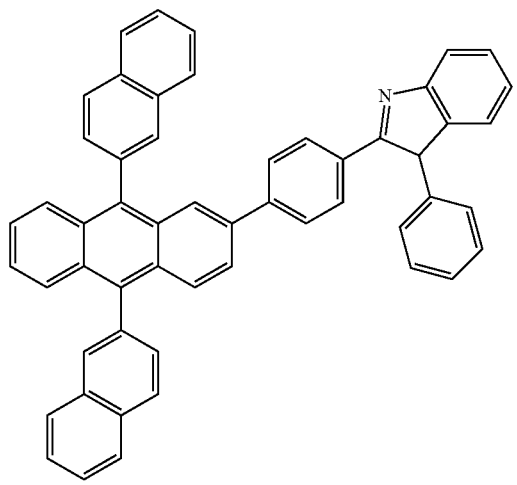

200

The manufactured organic light-emitting device had, at a current density of 50 mA/cm², a driving voltage of 5.25 V, and at a luminescent brightness of 2,865 cd/m², a luminescent efficiency of 5.13 cd/A.

Comparative Example 3

An organic light-emitting device was manufactured in the same manner as in Example 1, except that in forming the ETL, Compound 201 was used instead of Compound 1.

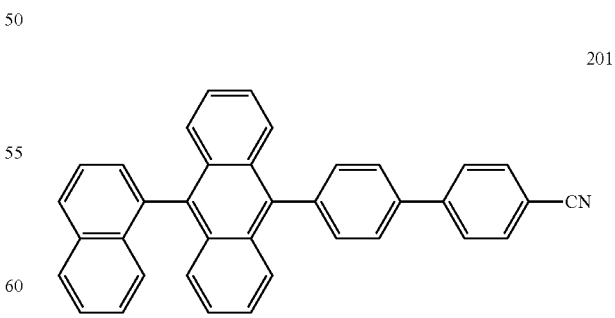

201

The manufactured organic light-emitting device had, at a current density of 50 mA/cm², a driving voltage of 4.73 V, and at a luminescent brightness of 3,325 cd/m², a luminescent efficiency of 6.25 cd/A.

Comparative Example 4

An organic light-emitting device was manufactured in the same manner as in Example 1, except that in forming the ETL, Compound 202 was used instead of Compound 1.

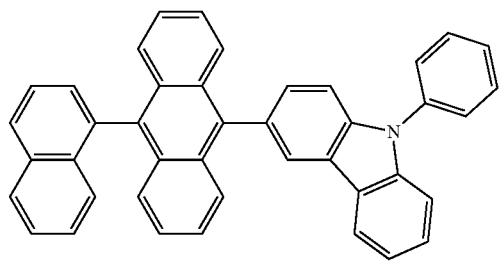

202

The manufactured organic light-emitting device had, at a current density of 50 mA/cm$^2$, a driving voltage of 5.41 V, and at a luminescent brightness of 3,010 cd/m$^2$, a luminescent efficiency of 6.57 cd/A.

The compounds of Formulae 1 through 3 according to an embodiment were used as an electron transportation material in an organic light-emitting device. The manufactured organic light-emitting device had excellent I-V-L characteristics, for example, a driving voltage was reduced by 1 V or more, and efficiency was substantially increased, as compared to Alq$_3$. High lifespan improvement effects were obtained. From this result, it was confirmed that the compounds according to an embodiment are suitable for use as an electron transportation material. Results of the respective examples and representative lifespan values are summarized and shown in Table 2.

electrons injected from the cathode pass via the electron transport layer and migrate toward the emission layer. The holes and the electrons are recombined with each other in the emission layer to generate excitons. Then, the excitons are transitioned from an excited state to a ground state, thereby generating light.

One or more embodiments include a compound that may have excellent electric characteristics, high charge transport capability, and high glass transition temperature, may prevent crystallization, and may be suitable for use as an electron transport material for fluorescent and phosphorescent devices of full color including, e.g., green, blue, and/or white. An organic light-emitting device including the compound of Formulae 1 to 3 as an emission material may have high efficiency and a long lifespan.

An exemplary material for an organic emission layer is a pyrene derivative. Exemplary electron transport materials include PBD, PF-6P, and PyPySPyPy, in addition to Alq$_3$ and TBPi.

For example, exemplary electron transport materials include organic metallic complexes, which are organic mono-molecular materials that may have high stability with respect to electrons and excellent electron mobility speed. Alq$_3$ may provide high stability and high electron affinity, but when used in a blue light-emitting device, emission may occur due to exciton diffusion and color purity may decrease. Other examples include a flavon derivative, and germanium and siliconchloropentadiene derivatives. Exemplary organic mono-molecular materials include a 2-biphenyl-4-yl-5-(4-t-butylphenyl)-1,3,4-oxadiazole (PBD) derivative binding to a Spiro compound, and 2,2',2"-(benzene-1,3,5-triyl)-tris(1-phenyl-1H-benzimidazole (TPBI) having a hole blocking capability and an excellent electron transport capability. For example, benzo imidazole derivatives may have excellent durability.

TABLE 2

|  | Electron transportation material | Driving voltage (V) | Current density (mA/cm$^2$) | Brightness (cd/m$^2$) | Efficiency (cd/A) | Emission color | Half lifespan (hr @100 mA/cm$^2$) |
|---|---|---|---|---|---|---|---|
| Example 1 | Compound 1 | 4.65 | 50 | 3,670 | 7.85 | Blue | 615 hr |
| Example 2 | Compound 3 | 5.10 | 50 | 3,725 | 7.89 | Blue | 572 hr |
| Example 3 | Compound 9 | 5.52 | 50 | 3,320 | 7.23 | Blue | 565 hr |
| Example 4 | Compound 14 | 4.86 | 50 | 3,810 | 7.76 | Blue | 622 hr |
| Example 5 | Compound 20 | 5.23 | 50 | 3,470 | 6.92 | Blue | 482 hr |
| Example 6 | Compound 23 | 5.08 | 50 | 3,635 | 7.28 | Blue | 539 hr |
| Example 7 | Compound 28 | 5.02 | 50 | 3,795 | 7.87 | Blue | 598 hr |
| Example 8 | Compound 33 | 5.17 | 50 | 3,560 | 7.13 | Blue | 558 hr |
| Example 9 | Compound 41 | 5.23 | 50 | 3,480 | 7.20 | Blue | 570 hr |
| Example 10 | Compound 48 | 5.20 | 50 | 3,540 | 7.46 | Blue | 532 hr |
| Comparative Example 1 | Alq$_3$ | 7.35 | 50 | 2,065 | 4.13 | Blue | 145 hr |
| Comparative Example 2 | Compound 200 | 5.25 | 50 | 2,865 | 5.13 | Blue | 337 hr |
| Comparative Example 3 | Compound 201 | 4.73 | 50 | 3,325 | 6.25 | Blue | 482 hr |
| Comparative Example 4 | Compound 202 | 5.41 | 50 | 3,010 | 6.57 | Blue | 325 hr |

By way of summation and review, an OLED may have a structure including a substrate, and an anode, a hole transport layer, an emission layer, an electron transport layer, and a cathode which are sequentially stacked on the substrate. The hole transport layer, the emission layer, and the electron transport layer are organic thin films formed using organic compounds.

When a voltage is applied between the anode and the cathode, holes injected from the anode pass via the hole transport layer and migrate toward the emission layer, and However, an organic light-emitting device including the organic mono-molecular material as a material for forming an electron transport layer may have a short emission lifespan, low preservation durability, and/or low reliability, as a possible result of physical or chemical change of an organic material, photochemical or electrochemical change of an organic material, oxidation of a cathode, exfoliation, and lack of durability.

The compound of Formulae 1 to 3 may have a function of an electron transport material or electron injection material for an organic light-emitting device. For example, in Formulae 1 to 3, carbazole has a heterocyclic structure, and when bonded to anthracene, the structure thereof is strong and high stability may be obtained. When a substituent is bonded to site 9 of carbazole, the planarity of carbazole and the substituent is not maintained, and an electron donating capability may be reduced.

However, the planarity with respect to opposite benzene rings of the carbazole may be maintained, and the benzene ring moieties may have an electron donating capability. Carbazole that is bonded to anthracene at site 9 is expected to have an electronic interaction when bonded to anthracene. When carbazole is bonded to anthracene at sites 1 to 4 (or sites 5 to 8), the molecular structure thereof may have lower symmetry characteristics than when carbazole is bonded to anthracene at site 9, amorphous properties may increase, and when a thin film is formed in manufacturing of an organic light-emitting device, stability may increase.

For example, at site 3, 4, 6 or 7 of carbazole, radicals may be easily formed electronically, and, substitution of a cyano group at such sites may help improve electronic stability and a dipole moment may be maintained in a direction from anthracene to carbazole, and a resultant device may have a stable electron flow.

When a molecule having such a structure is used in an electron transport layer, the balance between an electron and a hole in the molecule may be good, and durability with respect to electrons and holes may be high. During emission, heat resistance to Joule heat that may occur within an organic layer, between organic layers, and between an organic layer and a metal electrode and high-temperature resistance may increase. An organic light-emitting device manufactured using the compound of Formulae 1 to 3 as an electron transport material may have high durability during preservation and driving, and high efficiency. Accordingly, the inclusion of the compound in an organic light-emitting device may lead to an improvement in characteristics of the organic light-emitting device.

As described above, according to the one or more of the above embodiments, a compound represented by of Formulae 1 to 3 may be used as an electron transport material. Inclusion of the compound may provide an organic light-emitting device having high efficiency, low voltage, high brightness, and a long lifespan.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A compound represented by one of Formula 4, Formula 5, or Formula 6:

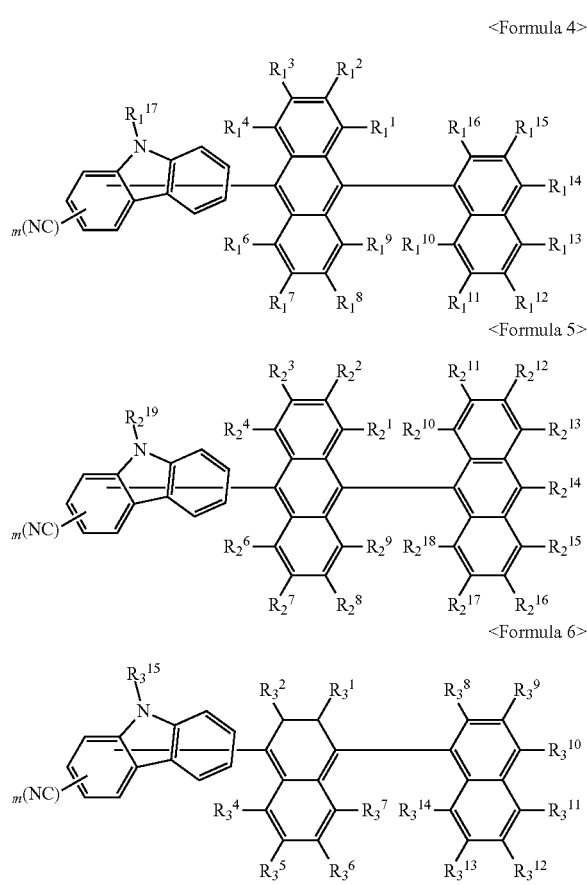

wherein, in Formula 4, Formula 5, and Formula 6:
$R_1^1$ to $R_1^4$, $R_1^6$ to $R_1^{16}$, $R_2^1$ to $R_2^4$, $R_2^6$ to $R_2^{18}$, $R_3^1$ to $R_3^2$, and $R_3^4$ to $R_3^{14}$ are each independently a hydrogen atom, a deuterium atom, a halogen group, a nitro group, a cyano group, a substituted or unsubstituted C1 to C60 alkyl group, a substituted or unsubstituted C2 to C60 alkenyl group, a substituted or unsubstituted C2 to C60 alkynyl group, a substituted or unsubstituted C3 to C60 cycloalkyl group, a substituted or unsubstituted C3 to C60 cycloalkenyl group, a substituted or unsubstituted C6 to C60 aryl group, a substituted or unsubstituted C2 to C60 heteroaryl group, a substituted or unsubstituted C6 to C60 aryloxy, a substituted or unsubstituted C6 to C60 arylthio group, or a substituted or unsubstituted C6 to C60 condensed polycyclic group, $R_1^{17}$, $R_2^{19}$, and $R_3^{15}$ are each independently a substituted or unsubstituted $C_1$ to $C_{60}$ alkyl group, a substituted or unsubstituted $C_2$ to $C_{60}$ alkenyl group, a substituted or unsubstituted $C_2$ to $C_{60}$ alkynyl group, a substituted or unsubstituted $C_3$ to $C_{60}$ cycloalkyl group, a substituted or unsubstituted $C_3$ to $C_{60}$ cycloalkenyl group, a substituted or unsubstituted $C_6$ to $C_{60}$ aryl group, a substituted or unsubstituted $C_2$ to $C_{60}$ heteroaryl group, a substituted or unsubstituted $C_6$ to $C_{60}$ aryloxy, a substituted or unsubstituted $C_6$ to $C_{60}$ arylthio group, or a substituted or unsubstituted $C_6$ to $C_{60}$ condensed polycyclic group, and m is an integer of 1 to 7.

2. The compound as claimed in claim 1, wherein the anthracenyl group in Formula 4 or Formula 5 or the naphthalenyl group in Formula 6 is bonded to site 6 or site 7 of the carbazole group.

3. The compound as claimed in claim 1, wherein:
m is 1 or 2, and
a cyano group is bonded to site 2 or site 3 of the carbazole.

4. The compound as claimed in claim 1, wherein:
$R_1{}^{17}$, $R_2{}^{19}$, and $R_3{}^{15}$ are each independently any one of Formulae 2a to 2d:

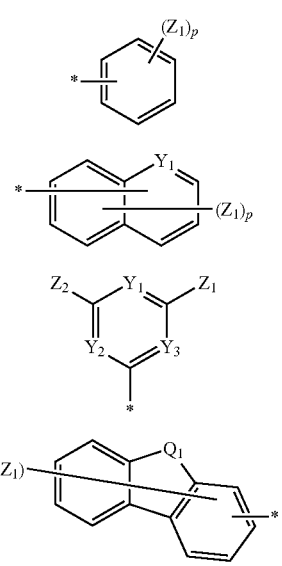

wherein in Formulae 2a to 2d,
$Y_1$, $Y_2$, and $Y_3$ are each independently CH or N;
$Q_1$ is —O—;
$Z_1$ and $Z_2$ are each independently a hydrogen atom, a deuterium atom, a substituted or unsubstituted $C_1$ to $C_{20}$ alkyl group, a substituted or unsubstituted $C_6$ to $C_{20}$ aryl group, a substituted or unsubstituted $C_2$ to $C_{20}$ heteroaryl group, a substituted or unsubstituted $C_6$ to $C_{20}$ condensed polycyclic group, an amine group substituted with a $C_6$ to $C_{20}$ aryl group or a $C_2$ to $C_{20}$ heteroaryl group, a halogen group, a cyano group, a nitro group, a hydroxyl group, or a carboxy group;
in Formula 2a, p is an integer of 1 to 5;
in Formula 2b, p is an integer of 1 to 6;
in Formula 2d, p is an integer of 1 to 7; and
* indicates a binding site.

5. The compound as claimed in claim 1, wherein:
$R_1{}^{14}$, $R_1{}^{15}$, $R_2{}^{14}$, and $R_3{}^{10}$ are each independently a hydrogen atom, a deuterium atom, a cyano group, or any one of Formulae 3a to 3c:

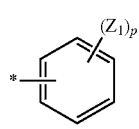

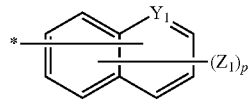

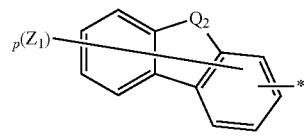

wherein in Formulae 3a to 3c,
$Y_1$ is CH or N;
$Q_2$ is —N($R_{30}$)—;
$Z_1$ and $R_{30}$ are each independently a hydrogen atom, a deuterium atom, a substituted or unsubstituted $C_1$ to $C_{20}$ alkyl group, a substituted or unsubstituted $C_6$ to $C_{20}$ aryl group, a substituted or unsubstituted $C_2$ to $C_{20}$ heteroaryl group, a substituted or unsubstituted $C_6$ to $C_{20}$ condensed polycyclic group, an amine group substituted with a $C_6$ to $C_{20}$ aryl group or a $C_2$ to $C_{20}$ heteroaryl group, a halogen group, a cyano group, a nitro group, a hydroxyl group, or a carboxy group; and
in Formula 3a, p is an integer of 1 to 5;
in Formula 3b, p is an integer of 1 to 6;
in Formula 3c, p is an integer of 1 to 7; and
* indicates a binding site.

6. The compound as claimed in claim 1, wherein the compound represented by Formula 4, Formula 5, or Formula 6 is any one of compounds 1, 3, 9, 14, 20, 23, 28, 33, 41, and 48:

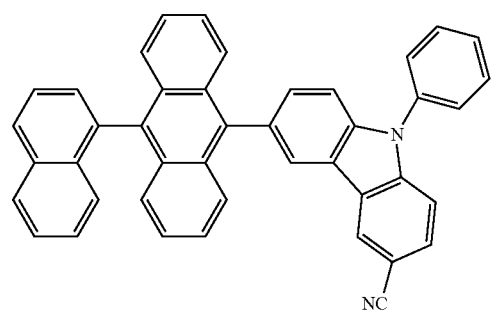

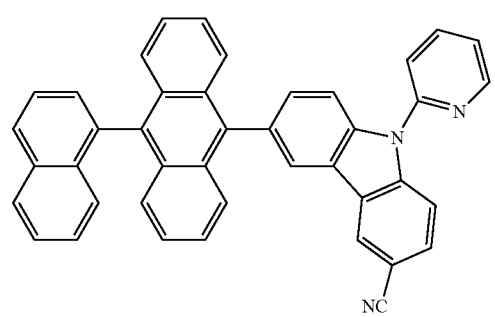

-continued

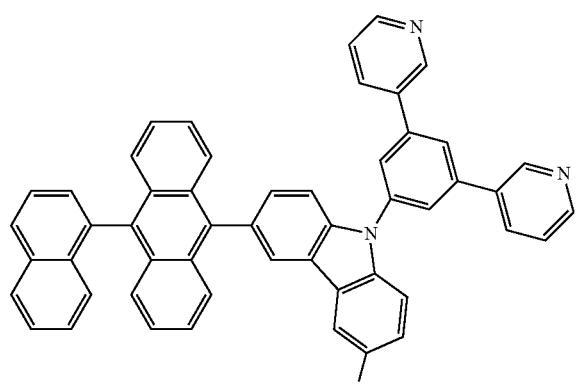
9

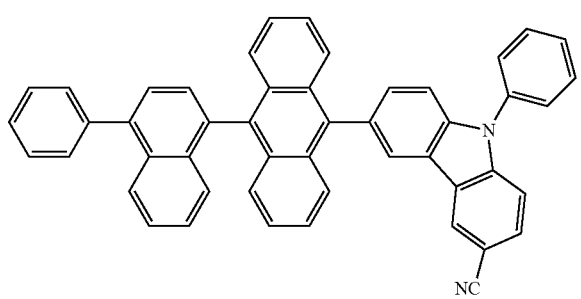
14

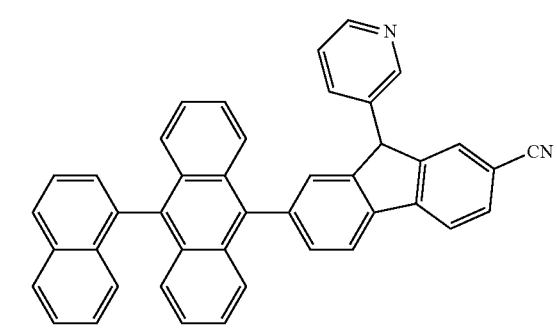
20

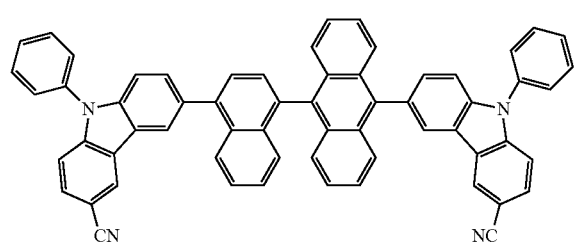
23

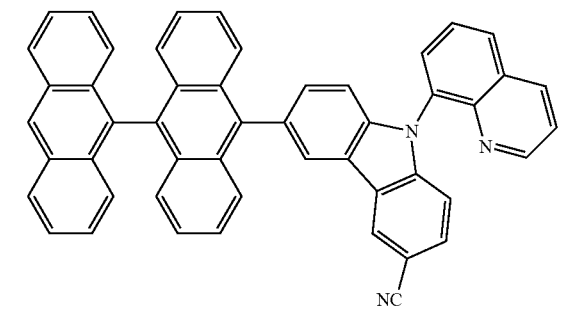
28

-continued

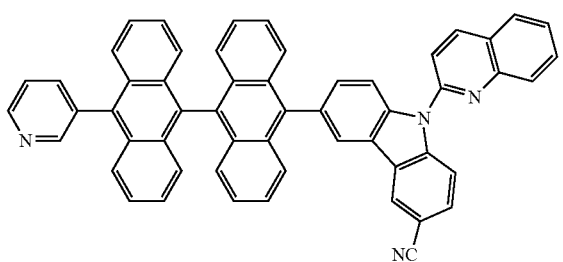
33

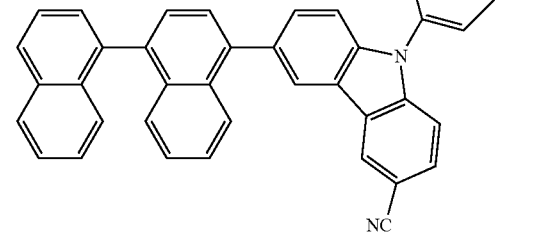
41

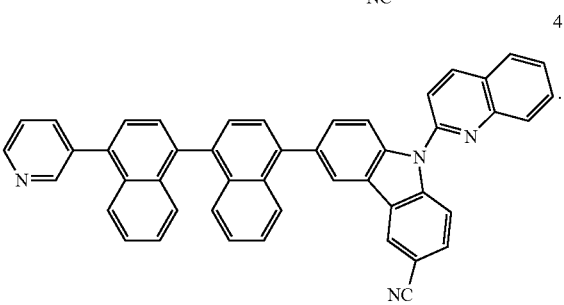
48

7. An organic light-emitting device, comprising:
   a first electrode;
   a second electrode; and
   an organic layer interposed between the first electrode and the second electrode,
   the organic layer including the compound of claim 1.

8. The organic light-emitting device as claimed in claim 7, wherein the organic layer includes a hole injection layer, a hole transport layer, a functional layer having a hole injection capability and a hole transportation capability, an emission layer, an electron injection layer, an electron transport layer, or a functional layer having an electron injection capability and an electron transportation capability.

9. The organic light-emitting device as claimed in claim 7, wherein:
   the organic layer includes an emission layer, and, optionally, one or more of a hole injection layer, a hole transport layer, or a functional layer having a hole injection capability and a hole transportation capability, and
   the emission layer includes a red layer, a green layer, a blue layer, or a white layer, which includes a phosphorescent compound.

10. The organic light-emitting device as claimed in claim 9, wherein the hole injection layer, the hole transport layer, or the functional layer having a hole injection capability and a hole transport capability includes a charge-generation material.

11. The organic light-emitting device as claimed in claim 10, wherein the charge-generation material is a p-dopant.

12. The organic light-emitting device as claimed in claim 11, wherein the p-dopant is a quinone derivative.

13. The organic light-emitting device as claimed in claim 11, wherein the p-dopant is a metal oxide.

14. The organic light-emitting device as claimed in claim 11, wherein the p-dopant is a cyano group-containing compound.

15. The organic light-emitting device as claimed in claim 7, wherein the organic layer includes an electron transport layer, which includes the compound of claim 1 and a metal complex.

16. The organic light-emitting device as claimed in claim 15, wherein the metal complex is a Li complex.

17. The organic light-emitting device as claimed in claim 15, wherein the metal complex is lithium quinolate (LiQ) or Compound 203:

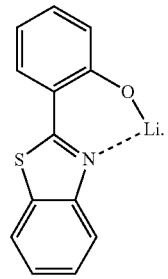

<203>

18. The organic light-emitting device as claimed in claim 7, wherein the organic layer is formed by a wet process.

19. A flat display apparatus comprising the organic light-emitting device as claimed in claim 7, wherein the first electrode of the organic light-emitting device is electrically connected to a source electrode or a drain electrode of a thin film transistor.

* * * * *